US012755703B2

(12) United States Patent
Ai et al.

(10) Patent No.: US 12,755,703 B2
(45) Date of Patent: Oct. 6, 2026

(54) DISPLAY SUBSTRATE AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Sifei Ai, Beijing (CN); Miao Wang, Beijing (CN); Xing Yao, Beijing (CN); Miao Liu, Beijing (CN); Wei Liu, Beijing (CN); Hongda Han, Beijing (CN); Zhiliang Jiang, Beijing (CN); Ming Hu, Beijing (CN); Haijun Qiu, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 141 days.

(21) Appl. No.: 18/861,605

(22) PCT Filed: Sep. 19, 2023

(86) PCT No.: PCT/CN2023/119618

§ 371 (c)(1),
(2) Date: Oct. 30, 2024

(87) PCT Pub. No.: WO2025/020285

PCT Pub. Date: Jan. 30, 2025

(65) Prior Publication Data

US 2026/0196177 A1 Jul. 9, 2026

(30) Foreign Application Priority Data

Jul. 21, 2023 (CN) ......................... 202310907887.1

(51) Int. Cl.
*G09G 3/3266* (2016.01)
*G11C 19/28* (2006.01)

(52) U.S. Cl.
CPC ........... *G09G 3/3266* (2013.01); *G11C 19/28* (2013.01); *G09G 2300/0408* (2013.01); *G09G 2310/0286* (2013.01); *G09G 2330/021* (2013.01)

(58) Field of Classification Search
CPC ......... G09G 3/3266; G09G 2300/0408; G09G 2310/0286; G09G 2330/021; G11C 19/28
See application file for complete search history.

(56) References Cited

U.S. PATENT DOCUMENTS

2019/0088190 A1* 3/2019 Zhang ...................... G09G 3/20
2019/0172843 A1* 6/2019 Yoshida ................ G02F 1/1368
(Continued)

FOREIGN PATENT DOCUMENTS

CN 105070263 A 11/2015
CN 118414654 A 7/2024
JP 2004006868 A 1/2004

*Primary Examiner* — Patrick N Edouard
*Assistant Examiner* — Joseph P Fox

(57) ABSTRACT

Disclosed is a display substrate including a base substrate (10) and a gate drive circuit disposed on the base substrate (10), wherein the gate drive circuit includes a plurality of shift register circuits (GOA) cascaded, a shift register circuit (GOA) includes a plurality of NOT gate circuits, a NOT gate circuit includes a first control transistor and a second control transistor, and transistor types of the first control transistor and the second control transistor are different. Arrangement modes of transistors of at least two NOT gate circuits among the plurality of NOT gate circuits of the shift register circuit (GOA) are different.

20 Claims, 22 Drawing Sheets

(56) References Cited

U.S. PATENT DOCUMENTS

| | | | | |
|---|---|---|---|---|
| 2020/0135833 | A1* | 4/2020 | Ma | H10K 59/131 |
| 2021/0090484 | A1* | 3/2021 | Shang | G09G 3/3266 |
| 2024/0420643 | A1* | 12/2024 | Chiu | G09G 3/3266 |

* cited by examiner

DISPLAY SUBSTRATE AND DISPLAY APPARATUS

CROSS-REFERENCE TO RELATED APPLICATIONS

The present application is a U.S. National Phase Entry of International Application No. PCT/CN2023/119618 having an international filing date of Sep. 19, 2023, which claims priority to Chinese Patent Application No. 202310907887.1, filed on Jul. 21, 2023, to the China National Intellectual Property Administration, contents of the above-identified applications should be regarded as being incorporated herein by reference.

TECHNICAL FIELD

The present disclosure relates to, but is not limited to, the field of display technologies, in particular to a display substrate and a display apparatus.

BACKGROUND

An Organic Light Emitting Diode (OLED) and a Quantum dot Light Emitting Diode (QLED) are active light emitting display devices and have advantages of self-luminescence, a wide viewing angle, a high contrast ratio, low power consumption, an extremely high response speed, lightness and thinness, bendability, and a low cost, etc.

SUMMARY

The following is a summary of subject matters described herein in detail. The summary is not intended to limit the protection scope of claims.

Embodiments of the present disclosure provide a display substrate and a display apparatus.

In one aspect, an embodiment provides a display substrate, including: a base substrate and a gate drive circuit disposed on the base substrate, wherein the gate drive circuit includes multiple stages of shift register circuits, a shift register circuit includes an oxide output transistor and a plurality of oxide switching transistors; the oxide output transistor includes a first bottom gate layer, a first top gate layer, and an active layer at least partially located between the first bottom gate layer and the first top gate layer; an oxide switching transistor includes a second bottom gate layer, a second top gate layer, and an active layer at least partially located between the second bottom gate layer and the second top gate layer; the first bottom gate layer and the second bottom gate layer are independent of each other; the first bottom gate layer is coupled with the first top gate layer; second bottom gate layers of at least some oxide switching transistors among the plurality of oxide switching transistors are coupled with each other.

In some exemplary implementation modes, all second bottom gate layers included in the plurality of oxide switching transistors are coupled with each other.

In some exemplary implementation modes, the plurality of oxide switching transistors are divided into at least two transistor groups, each transistor group includes at least one oxide switching transistor; second bottom gate layers of a plurality of oxide switching transistors belonging to a same transistor group are coupled with each other; second bottom gate layers of oxide switching transistors belonging to different transistor groups are independent of each other.

In some exemplary implementation modes, the shift register circuit includes a plurality of functional modules, and oxide switching transistors belonging to a same functional module are divided into a same transistor group.

In some exemplary implementation modes, a second bottom gate layer included in an oxide switching transistor in the at least some oxide switching transistors extends in a first direction or a second direction, the first direction intersecting with the second direction. The display substrate further includes at least one bottom gate connection part coupled with a second bottom gate layer included in a corresponding oxide switching transistor.

In some exemplary implementation modes, the at least some oxide switching transistors are divided into a first transistor group and a second transistor group. The display substrate includes a first bottom gate connection part coupled with a second bottom gate layer included in an oxide switching transistor in the first transistor group and a second bottom gate connection part coupled with a second bottom gate layer included in an oxide switching transistor in the second transistor group. The first bottom gate connection part and the second bottom gate connection part are coupled through a first conductive connection part; or, the first bottom gate connection part and the second bottom gate connection part are independent of each other.

In some exemplary implementation modes, the first bottom gate connection part and the second bottom gate layer coupled thereto are connected with each other into an integral structure, and the second bottom gate connection part and the second bottom gate layer coupled thereto are connected with each other into an integral structure. The first bottom gate connection part and the second bottom gate connection part are disposed in a same layer and made of a same material, and the first bottom gate connection part and the first conductive connection part are disposed in different layers.

In some exemplary implementation modes, the display substrate further includes a second gate metal layer and a first source-drain metal layer; the first bottom gate connection part is located in the second gate metal layer, and the first conductive connection part is located in the first source-drain metal layer.

In some exemplary implementation modes, the display substrate further includes a first signal line coupled with the first bottom gate connection part and a second signal line coupled with the second bottom gate connection part under a condition that the first bottom gate connection part and the second bottom gate connection part are independent of each other.

In some exemplary implementation modes, in adjacent two stages of shift register circuits, second bottom gate layers of at least some oxide switching transistors in a previous stage shift register circuit are coupled with second bottom gate layers of at least some oxide switching transistors in a subsequent stage shift register circuit; or, a second bottom gate layer of an oxide switching transistor in a previous stage shift register circuit is independent from a second bottom gate layer of an oxide switching transistor in a subsequent stage shift register circuit.

In some exemplary implementation modes, the second bottom gate layers of at least some oxide switching transistors in the previous stage shift register circuit and the second bottom gate layers of at least some oxide switching transistors in the subsequent stage shift register circuit are connected with each other into an integral structure.

In some exemplary implementation modes, the second bottom gate layers of at least some oxide switching transistors in the previous stage shift register circuit are coupled with the second bottom gate layers of at least some oxide switching transistors in the subsequent stage shift register circuit through a second conductive connection part, and the second conductive connection part is disposed in a different layer from the second bottom gate layers.

In some exemplary implementation modes, the shift register circuit further includes a light shielding layer and a plurality of low temperature poly silicon transistors, wherein an orthographic projection of the light shielding layer on the base substrate is at least partially overlapped with an orthographic projection of an active layer of a low temperature poly silicon transistor on the base substrate; light shielding layers of at least some of the shift register circuits are coupled with each other.

In some exemplary implementation modes, the light shielding layers included in at least some of the shift register circuits are coupled through a third conductive connection part, and the third conductive connection part is disposed in a different layer from the light shielding layers.

In some exemplary implementation modes, the display substrate further includes a nineteenth conductive connection part coupled with the first bottom gate layer and the first top gate layer, respectively.

In another aspect, an embodiment provides a display apparatus, including the display substrate described above.

In another aspect, an embodiment provides a drive method of a display substrate for driving the display substrate described above, wherein the drive method includes: providing a same signal to a first bottom gate layer and a first top gate layer, controlling an oxide output transistor to be turned on or off; and providing signals to a second bottom gate layer and a second top gate layer of an oxide switching transistor independently, wherein second bottom gate layers of at least some oxide switching transistors among a plurality of oxide switching transistors are coupled to access a same signal.

In another aspect, an embodiment provides a display substrate, including a base substrate and a gate drive circuit disposed on the base substrate, wherein the gate drive circuit includes a plurality of shift register circuits cascaded, a shift register circuit includes a plurality of NOT gate circuits, a NOT gate circuit includes a first control transistor and a second control transistor, and transistor types of the first control transistor and the second control transistor are different; a gate electrode of the first control transistor is connected with a gate electrode of the second control transistor as a first input terminal of the NOT gate circuit; a second electrode of the first control transistor is connected with a second electrode of the second control transistor as an output terminal of the NOT gate circuit; a first electrode of the first control transistor serves as a second input terminal of the NOT gate circuit; a first electrode of the second control transistor serves as a third input terminal of the NOT gate circuit, the second input terminal and the third input terminal of the NOT gate circuit are configured to access different voltage signals. Arrangement modes of transistors of at least two NOT gate circuits among the plurality of NOT gate circuits of the shift register circuit are different.

In some exemplary implementation modes, at least one of the plurality of NOT gate circuits satisfies one of following: an active layer of a first control transistor and an active layer of a second control transistor in the NOT gate circuit have a same extension direction, and an arrangement direction of the first control transistor and the second control transistor is the same as the extension direction of the active layer; an active layer of a first control transistor and an active layer of a second control transistor in the NOT gate circuit have a same extension direction, and an arrangement direction of the first control transistor and the second control transistor intersects with the extension direction of the active layer; and extension directions of an active layer of a first control transistor and an active layer of a second control transistor in the NOT gate circuit intersect, and an arrangement direction of the first control transistor and the second control transistor is the same as an extension direction of an active layer of the first control transistor or the second control transistor.

In some exemplary implementation modes, the plurality of NOT gate circuits include at least a first NOT gate circuit and a second NOT gate circuit; an output terminal of the first NOT gate circuit is connected with an output terminal of the second NOT gate circuit; the first NOT gate circuit and the second NOT gate circuit are adjacent in a second direction; a transistor arrangement mode of the first NOT gate circuit is the same as a transistor arrangement mode of the second NOT gate circuit; an active layer of a first control transistor of the first NOT gate in circuit and an active layer of a first control transistor of the second NOT gate circuit are connected with each other into an integral structure.

In some exemplary implementation modes, a second input terminal of the first NOT gate circuit is connected with a first voltage line through a first transmission transistor, and a second input terminal of the second NOT gate circuit is connected with the first voltage line through a second transmission transistor, the first transmission transistor, the second transmission transistor, and the first control transistor have a same transistor type. Active layers of the first control transistor of the first NOT gate circuit, the first control transistor of the second NOT gate circuit, the first transmission transistor, and the second transmission transistor are connected with each other into an integral structure, and a shape of an orthographic projection of the integral structure on the base substrate is a C shape or a ring.

In some exemplary implementation modes, a third input terminal of the first NOT gate circuit is connected with a second voltage line through a third transmission transistor, and a third input terminal of the second NOT gate circuit is connected with the second voltage line through a fourth transmission transistor, wherein the third transmission transistor, the fourth transmission transistor, and the second control transistor have a same transistor type. A gate electrode of the third transmission transistor is connected with a gate electrode of the second transmission transistor, and a gate electrode of the fourth transmission transistor is connected with a gate electrode of the first transmission transistor. An active layer of the second control transistor of the first NOT gate circuit and an active layer of the third transmission transistor are connected with each other into an integral structure; an active layer of the second control transistor of the second NOT gate circuit and an active layer of the fourth transmission transistor are connected with each other into an integral structure.

In some exemplary implementation modes, the plurality of NOT gate circuits further include a third NOT gate circuit, a first input terminal of the third NOT gate circuit is connected with output terminals of the first NOT gate circuit and the second NOT gate circuit, and an output terminal of the third NOT gate circuit is connected with the first input terminal of the second NOT gate circuit. The third NOT gate circuit is adjacent to the second NOT gate circuit in the second direction; a transistor arrangement mode of the third NOT gate circuit is the same as a transistor arrangement mode of the second NOT gate circuit.

In some exemplary implementation modes, the first input terminal of the third NOT gate circuit is connected with the integral structure of the active layer of the first control transistor of the first NOT gate circuit and the active layer of the first control transistor of the second NOT gate circuit.

In some exemplary implementation modes, a second electrode of a first control transistor and a second electrode of a second control transistor of the third NOT gate circuit are connected with a gate electrode of the first control transistor of the second NOT gate circuit through different conductive connection parts, and a gate electrode of the second control transistor of the second NOT gate circuit and a second electrode of a second control transistor of the third NOT gate circuit are connected with the gate electrode of the first control transistor of the second NOT gate circuit through a same conductive connection part.

In some exemplary implementation modes, the plurality of NOT gate circuits further include: a fourth NOT gate circuit; a first input terminal of the fourth NOT gate circuit is connected with a gate electrode of the second transmission transistor, and an output terminal of the fourth NOT gate circuit is connected with a gate electrode of the first transmission transistor; a transistor arrangement mode of the fourth NOT gate circuit is different from transistor arrangement modes of the first NOT gate circuit and the second NOT gate circuit. The fourth NOT gate circuit is located on a same side of the first NOT gate circuit and the second NOT gate circuit in a first direction; the first direction intersects with the second direction.

In some exemplary implementation modes, a first input terminal of a fourth NOT gate circuit of a (2i−1)-th stage shift register circuit of the gate drive circuit is connected with a first clock signal line, and a first input terminal of a fourth NOT gate circuit of a 2i-th stage shift register circuit of the gate drive circuit is connected with a second clock signal line, wherein i is an integer greater than 0.

In some exemplary implementation modes, the shift register circuit further includes a NAND gate circuit; the NAND gate circuit is connected with at least one NOT gate circuit. The NAND gate circuit includes a third control transistor, a fourth control transistor, a fifth control transistor, and a sixth control transistor; the third control transistor and the fourth control transistor have a same transistor type, and the fifth control transistor and the sixth control transistor have a same transistor type. The third control transistor is connected with a gate electrode of the fifth control transistor as a first input terminal of the NAND gate circuit; the fourth control transistor is connected with a gate electrode of the sixth control transistor as a second input terminal of the NAND gate circuit; a first electrode of the third control transistor is connected with a first electrode of the fourth control transistor as a third input terminal of the NAND gate circuit; a second electrode of the third control transistor, a second electrode of the fourth control transistor, and a second electrode of the fifth control transistor are connected as an output terminal of the NAND gate circuit; a first electrode of the fifth control transistor is connected with a second electrode of the sixth control transistor; a first electrode of the sixth control transistor serves as a fourth input terminal of the NAND gate circuit; the third input terminal and the fourth input terminal of the NAND gate circuit are configured to access different voltage signals. The third control transistor and the fourth control transistor are located between the fifth control transistor and the sixth control transistor.

In some exemplary implementation modes, the sixth control transistor, the fourth control transistor, the third control transistor, and the fifth control transistor are sequentially arranged in the second direction; the gate electrode of the sixth control transistor, a gate electrode of the fourth control transistor, a gate electrode of the third control transistor, and the gate electrode of the fifth control transistor are arranged in a misaligned manner in the second direction.

In some exemplary implementation modes, an active layer of the third control transistor and an active layer of the fourth control transistor are connected with each other into an integral structure, and a shape of an orthographic projection of the integral structure on the base substrate is a C shape or a ring.

In some exemplary implementation modes, the plurality of NOT gate circuits include a fifth NOT gate circuit and a sixth NOT gate circuit. An input terminal of the sixth NOT gate circuit is connected with an output terminal of the fifth NOT gate circuit, and an output terminal of the sixth NOT gate circuit is connected with the second input terminal of the NAND gate circuit. The fifth NOT gate circuit is adjacent to the sixth NOT gate circuit in the first direction; the fifth NAND gate circuit and the sixth NAND gate circuit are located on a same side of the NAND gate circuit in the second direction; the first direction intersects with the second direction. A transistor arrangement mode of the fifth NOT gate circuit is the same as a transistor arrangement mode of the sixth NOT gate circuit.

In some exemplary implementation modes, a first control transistor of the fifth NOT gate circuit and a first control transistor of the sixth NOT gate circuit are aligned in the first direction, and a second control transistor of the fifth NOT gate circuit and a second control transistor of the sixth NOT gate circuit are aligned in the first direction.

In some exemplary implementation modes, the plurality of NOT gate circuits further include a seventh NOT gate circuit. An input terminal of the seventh NOT gate circuit is connected with the output terminal of the NAND gate circuit, and an output terminal of the seventh NOT gate circuit serves as a drive output terminal of the shift register circuit. A first control transistor and a second control transistor of the seventh NOT gate circuit are arranged in a second direction, the first control transistor is adjacent to the NAND gate circuit in the first direction, and the first direction intersects with the second direction.

In some exemplary implementation modes, the shift register circuit includes at least a cascaded signal generation circuit, a gate circuit, a voltage sustainment circuit, an output control circuit, and an output circuit; the cascaded signal generation circuit includes at least one NOT gate circuit, the output circuit includes at least one NOT gate circuit, the voltage sustainment circuit includes at least one NOT gate circuit, and the output control circuit includes a NAND gate circuit. The cascaded signal generation circuit is connected with a cascaded input terminal and a cascaded output terminal, configured to perform a shift operation on a cascaded signal provided by a previous stage shift register circuit received by the cascaded input terminal, and to provide a cascaded signal of a present stage shift register circuit to the cascaded output terminal. The gate circuit is connected with a gate input terminal, the cascaded input terminal, the cascaded output terminal, and a third node, configured to write a gate input signal provided by the gate input terminal into the third node under control of the cascaded output terminal and the cascaded input terminal. The voltage sustainment circuit is connected with the third node, the cascaded input terminal, a clock signal terminal, and a fifth node, configured to control a potential of the fifth node under control of the third node, the cascaded input terminal, and the clock signal terminal. The output control circuit is connected with the cascaded output terminal, the fifth node, and a sixth node, configured to perform a NAND operation on potentials of the cascaded output terminal and the fifth node, and control a potential of the sixth node. The output circuit is connected with the sixth node and a drive output terminal, configured to perform an inverting operation on the potential of the sixth node, and outputs a drive signal. The output control circuit is located between the cascaded signal generation circuit and the output circuit in a first direction, the gate circuit is adjacent to the cascaded signal generation circuit in a second direction, and the voltage sustainment circuit is located between the gate circuit and the output circuit in the first direction, and is adjacent to the output control circuit in the second direction; the first direction intersects with the second direction.

In some exemplary implementation modes, the shift register circuit further includes an initialization circuit connected with an initial control terminal, the third node, and the cascaded output terminal, and is configured to initialize the third node and the cascaded output terminal under control of the initial control terminal. The initialization circuit is located on a side of the gate circuit away from the voltage sustainment circuit in the first direction, and is adjacent to the cascaded signal generation circuit in the second direction.

In some exemplary implementation modes, the gate circuit includes a seventeenth transistor and an eighteenth transistor; the seventeenth transistor and the eighteenth transistor have different transistor types. A gate electrode of the seventeenth transistor is connected with the cascaded output terminal, a first electrode of the seventeenth transistor is connected with the gate input terminal, and a second electrode of the seventeenth transistor is connected with a first electrode of the eighteenth transistor; a gate electrode of the eighteenth transistor is connected with the cascaded input terminal, and a second electrode of the eighteenth transistor is connected with the third node. The seventeenth transistor and the eighteenth transistor are arranged sequentially in the second direction, and the eighteenth transistor is adjacent to the cascaded signal generation circuit in the second direction.

In some exemplary implementation modes, the first control transistor is a low temperature poly silicon transistor and the second control transistor is an oxide transistor.

In some exemplary implementation modes, in a plane perpendicular to the display substrate, the display substrate includes a first semiconductor layer, a first conductive layer, a second conductive layer, a second semiconductor layer, a third conductive layer, a fourth conductive layer, and a fifth conductive layer disposed on the base substrate. The first semiconductor layer includes at least an active layer of the first control transistor. The first conductive layer includes at least a gate electrode of the first control transistor. The second conductive layer includes at least a bottom gate of the second control transistor. The second semiconductor layer includes at least an active layer of the second control transistor. The third conductive layer includes at least a top gate of the second control transistor. The fourth conductive layer includes at least a plurality of conductive connection parts connected with the first control transistor and the second control transistor. The fifth conductive layer includes at least a signal line connected with the shift register circuit.

In some exemplary implementation modes, the shift register circuit includes a plurality of oxide transistors, and the plurality of oxide transistors includes an oxide output transistor and a plurality of oxide switching transistors; the oxide output transistor is connected with the drive output terminal. A bottom gate of the oxide output transistor and bottom gates of the plurality of oxide switching transistors are independently disposed, and the bottom gate of the oxide output transistor is connected with a top gate. Bottom gates of at least some oxide switching transistors among the plurality of oxide switching transistors are connected with each other to be an integral structure.

In another aspect, an embodiment provides a display apparatus, which includes the aforementioned display substrate.

Other aspects may be comprehended after drawings and detailed description are read and understood.

BRIEF DESCRIPTION OF DRAWINGS

Accompanying drawings are used for providing further understanding of technical solutions of the present disclosure, constitute a portion of the specification, and are used for explaining the technical solutions of the present disclosure together with the embodiments of the present disclosure, but do not constitute limitations on the technical solutions of the present disclosure.

DETAILED DESCRIPTION

Figure 1:
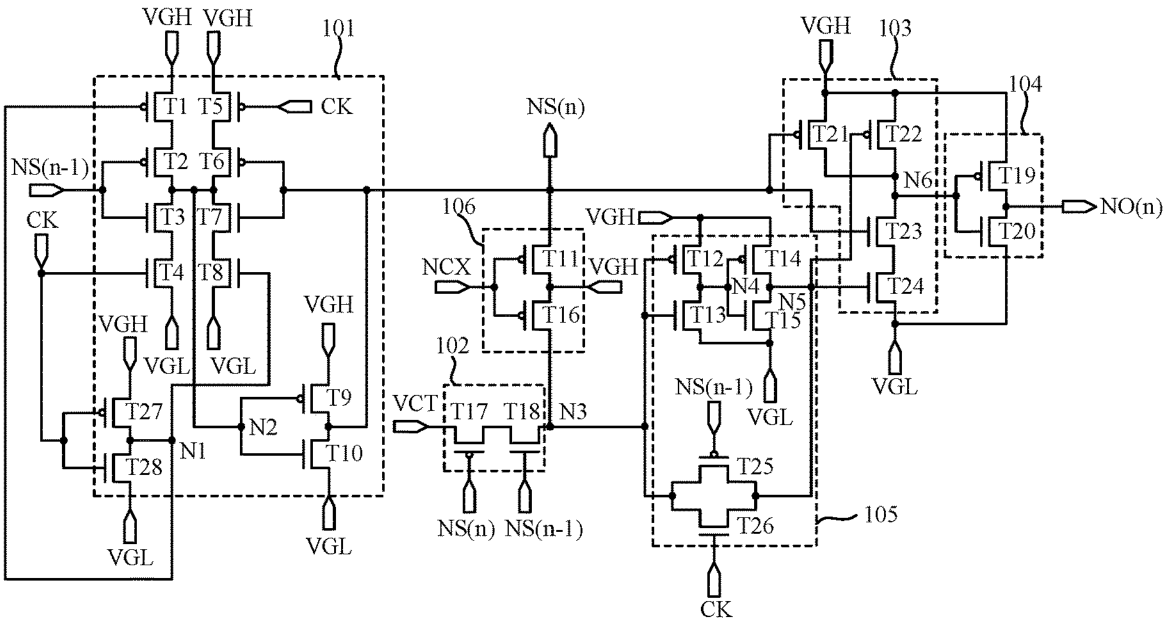
FIG. 1 is a schematic diagram of a shift register circuit according to at least one embodiment of the present disclosure.

The embodiments of the present disclosure will be described below with reference to the drawings in detail. Implementation modes may be implemented in a plurality of different forms. Those of ordinary skills in the art may easily understand such a fact that modes and contents may be transformed into other forms without departing from the purpose and scope of the present disclosure. Therefore, the present disclosure should not be explained as being limited to the contents recorded in the following implementation modes only. The embodiments and features in the embodiments of the present disclosure may be randomly combined with each other if there is no conflict.

In the drawings, a size of one or more constituent elements, a thickness of a layer, or a region is sometimes exaggerated for clarity. Therefore, one mode of the present disclosure is not necessarily limited to the size, and a shape and a size of one or more components in the drawings do not reflect an actual scale. In addition, the accompanying drawings schematically illustrate ideal examples, and one mode of the present disclosure is not limited to shapes, numerical values, or the like shown in the drawings.

Ordinal numerals "first", "second", "third", etc., in the specification are set not to form limits in numbers but only to avoid confusion between constituent elements. In the present disclosure, "plurality" represents two or more than two.

In the specification, for convenience, expressions "central", "above", "below", "front", "back", "vertical", "horizontal", "top", "bottom", "inside", "outside", etc., indicating directional or positional relationships are used to illustrate positional relationships between the constituent elements with reference to the drawings, not to indicate or imply that a referred apparatus or element must have a specific orientation and be structured and operated with the specific orientation but only to easily and simply describe the present specification, and thus should not be understood as limitations on the present disclosure. The positional relationships between the constituent elements are changed as appropriate according to a direction where the constituent elements are described. Therefore, appropriate replacements based on situations are allowed, which is not limited to the expressions in the specification.

In the specification, unless otherwise specified and defined explicitly, terms "mount", "mutually connect", "connect", and "couple" should be understood in a broad sense. For example, it may be a fixed connection, a detachable connection, or an integral connection; it may be a mechanical connection or a connection; it may be a direct connection, an indirect connection through a middleware, or internal communication inside two elements. Those of ordinary skills in the art may understand meanings of the aforementioned terms in the present disclosure according to situations.

In the specification, an "electrical connection" includes a case that constituent elements are connected together through an element with a certain electrical action. The "element with a certain electrical action" is not particularly limited as long as electrical signals between the connected constituent elements may be transmitted. Examples of the "element with a certain electrical action" not only include an electrode and a wiring, but also include a switching element such as a transistor, a resistor, an inductor, a capacitor, another element with a plurality of functions, etc.

In the specification, a transistor refers to an element which at least includes three terminals, i.e., a gate, a drain, and a source. The transistor has a channel region between the drain (drain electrode terminal, drain region, or drain electrode) and the source (source electrode terminal, source region, or source electrode), and a current can flow through the drain electrode, the channel region, and the source. In the specification, the channel region refers to a region through which a current mainly flows.

In the specification, a first electrode may be a drain electrode and a second electrode may be a source electrode, or, a first electrode may be a source electrode and a second electrode may be a drain electrode. In a case that transistors with opposite polarities are used, or in a case that a direction of a current is changed during operation of a circuit, or the like, functions of the "source electrode" and the "drain electrode" are sometimes interchangeable. Therefore, the "source electrode" and the "drain electrode" are interchangeable in the specification. In addition, the gate electrode may also be referred to as a control electrode.

In the specification, "parallel" refers to a state in which an angle formed by two straight lines is −10° or more and 10° or less, and thus also includes a state in which the angle is −5° or more and 5° or less. In addition, "perpendicular" refers to a state in which an angle formed by two straight lines is 80° or more and 100° or less, and thus also includes a state in which the angle is 85° or more and 95° or less.

In the specification, a circle, oval, triangle, rectangle, trapezoid, pentagon, or hexagon, etc. is not strictly speaking, but may be an approximate circle, oval, triangle, rectangle, trapezoid, pentagon, or hexagon, etc. Some small deformations due to tolerances may exist, for example, guide angles, curved edges, and deformations thereof may exist.

In the present disclosure, "about" and "substantially" refer to that a boundary is not defined strictly and a case within a range of process and measurement errors is allowed. In the present disclosure, "same" include completely same and substantially same cases, and "substantially the same" refers to a case where an exponential value differs by less than 10%.

In the present disclosure, "A extends along a B direction" means that A may include a main body portion and a secondary portion connected with the main body portion, the main body portion is a line, a line segment, or a strip-shaped body, the main body portion extends along the B direction, and a length of the main body portion extending along the B direction is greater than a length of the secondary portion extending along another direction. "A extends along the B direction" in the present disclosure means "the main portion of A extends along the B direction".

With rapid development of OLED display technologies, various requirements such as a high resolution, a narrow bezel, and low power consumption have been put forward for display products. A local refresh technology (for example, some regions of a screen display high-frequency refresh, and other regions display low-frequency refresh) has considerable benefits in reducing power consumption, so it has attracted much attention. In display products using the local refresh technology, a structure of a gate drive circuit is relatively complex. How to achieve better drive stability and how to reasonably plan disposing space of the gate drive circuit to take into account narrowing of a bezel are all questions need to be solved.

The present embodiments provide a display substrate and a display apparatus, which may effectively improve drive stability of a gate drive circuit under a premise of reducing power consumption, and may reasonably plan the disposing space of the gate drive circuit to save space and take into account narrowing of the bezel.

A present embodiment provides a display substrate, including a base substrate and a gate drive circuit disposed on the base substrate. The gate drive circuit includes a plurality of shift register circuits (also referred to as shift register units) cascaded. A shift register circuit includes a plurality of NOT gate circuits. A NOT gate circuit includes a first control transistor and a second control transistor, and the first control transistor and the second control transistor are of different transistor types. A gate electrode of the first control transistor is connected with a gate electrode of the second control transistor, as a first input terminal of the NOT gate circuit; a second electrode of the first control transistor is connected with a second electrode of the second control transistor, as an output terminal of the NOT gate circuit; a first electrode of the first control transistor serves as a second input terminal of the NOT gate circuit; a first electrode of the second control transistor serves as a third input terminal of the NOT gate circuit. The second input terminal and the third input terminal of the NOT gate circuit are configured to access different voltage signals. Transistor arrangement modes of at least two of the plurality of NOT gate circuits of the shift register circuit are different.

In the present example, a transistor arrangement mode of the NOT gate circuit may include at least one of following: a position relationship between the first control transistor and the second control transistor of the NOT gate circuit, and a relationship between extension directions of active layers of the first control transistor and the second control transistor of the NOT gate circuit. Transistor arrangement modes of at least two NOT gate circuits are different, which may include: position relationships of transistors of the at least two NOT gate circuits are different, for example, two transistors of one NOT gate circuit are arranged in a first direction, and two transistors of the other NOT gate circuit are arranged in a second direction; or, relationships between extension directions of active layers of transistors of at least two NOT gate circuits are different, for example, extension directions of two transistors of one NOT gate circuit are the same, and extension directions of two transistors of the other NOT gate circuit are crossed; or, both the position relationships of the transistors of at least two NOT gate circuits and the extension directions of the active layers are different, for example, two transistors of one NOT gate circuit are arranged in the first direction and extension directions of active layers of the two transistors are the same, and two transistors of the other NOT gate circuit are arranged in the second direction and extension directions of active layer of the two transistors are crossed. The present embodiment is not limited thereto.

In some examples, the first control transistor may be a low temperature poly silicon transistor and the second control transistor may be an oxide transistor. For example, the first control transistor may be a P-type transistor, and the second control transistor may be an N-type transistor. However, the present embodiment is not limited thereto. In other examples, the second control transistor may be a low temperature poly silicon transistor, and the first control transistor may be an oxide transistor.

In some examples, the NOT gate circuit may include a first input terminal, a second input terminal, a third input terminal, and an output terminal. For example, the second input terminal may access a first voltage signal, the third input terminal may access a second voltage signal, and the first voltage signal may be larger than the second voltage signal. The present embodiment is not limited thereto.

In the display substrate provided by the present embodiment, a local refresh function may be achieved by disposing a shift register circuit including a plurality of NOT gate circuits, to effectively reduce power consumption of the display substrate; by using different arrangement modes for transistors of at least two NOT gate circuits of the shift register circuit, occupied space may be saved, thereby facilitating reasonable planning of disposing space of the shift register circuit to take into account narrowing of the bezel.

In some exemplary implementation modes, at least one NOT gate circuit among the plurality of NOT gate circuits of the shift register circuit may satisfy one of following: an active layer of a first control transistor and an active layer of a second control transistor in the NOT gate circuit have a same extension direction, and arrangement directions of the first control transistor and the second control transistor are the same as the extension direction of the active layer; the active layer of the first control transistor and the active layer of the second control transistor in the NOT gate circuit have a same extension direction, and the arrangement directions of the first control transistor and the second control transistor intersect with the extension direction of the active layer; extension directions of the active layer of the first control transistor and the active layer of the second control transistor in the NOT gate circuit intersect, and the arrangement directions of the first control transistor and the second control transistor are the same as the extension direction of the active layer of the first control transistor or the second control transistor. The present example may save occupied space through a variety of design methods of NOT gate structures, which is beneficial to reasonable planning of the disposing space of the shift register circuit to take into account the narrowing of the bezel.

Solutions of the embodiment will be described below through some examples.

In some examples, the display substrate may include a display region and a non-display region. For example, the non-display region may be a peripheral region located at a periphery of the display region. However, the present embodiment is not limited thereto. For example, the non-display region may be located between adjacent display regions.

In some examples, the display region may include a plurality of sub-pixels. One pixel unit within the display region may include three sub-pixels, which may be a red sub-pixel, a green sub-pixel, and a blue sub-pixel, respectively. However, the present embodiment is not limited thereto. In some examples, one pixel unit may include four sub-pixels, wherein the four sub-pixels may be a red sub-pixel, a green sub-pixel, a blue sub-pixel, and a white sub-pixel respectively.

In some examples, a sub-pixel may include a pixel circuit (which may also be referred to as a sub-pixel drive circuit) and a light emitting element connected with the pixel circuit. The light emitting element may be rectangular, rhombic, pentagonal, or hexagonal. When one pixel unit includes three sub-pixels, light emitting elements of the three sub-pixels may be arranged side by side horizontally, side by side vertically, or in a delta arrangement. When one pixel unit includes four sub-pixels, light emitting elements of the four sub-pixels may be arranged side by side horizontally, side by side vertically, or in a manner to form a square. However, the present embodiment is not limited thereto.

In some examples, the display region may include at least a plurality of pixel circuits arranged in an array (i.e., including a plurality of rows of pixel circuits and a plurality of columns of pixel circuits), a plurality of gate lines extending in a first direction (e.g., including a scan line, a reset signal line, and a light emitting control line), a plurality of data lines and a power line extending in a second direction. The plurality of rows of pixel circuits may be arranged in a second direction, and each row of pixel circuits may include a plurality of pixel circuits arranged in the first direction. The first direction and the second direction may be located in a same plane, and the first direction interacts with the second direction, for example, the first direction may be perpendicular to the second direction. For example, the first direction may include lateral orientation, and the second direction may include longitudinal orientation.

In some examples, the pixel circuit may be configured to drive the connected light emitting element. For example, the pixel circuit may be configured to provide a drive current for driving the light emitting element to emit light. The pixel circuit may include a plurality of transistors and at least one capacitor. For example, the pixel circuit may be a circuit of a 3T1C, 4T1C, 5T1C, 5T2C, 6T1C, 7T1C, or 8T1C structure. Herein, in the above circuit structure, T refers to a thin film transistor, C refers to a capacitor, a number before T represents a quantity of thin film transistors in the circuit, and a number before C represents a quantity of capacitors in the circuit.

In some examples, the pixel circuit may include a first type transistor and a second type transistor. Transistor types of the first type transistor and the second type transistor are different, for example, the first type transistor may be a P-type transistor, and the second type transistor may be an N-type transistor. The second type transistor may be, for example, an oxide thin film transistor, and the first type transistor may be, for example, a Low Temperature Poly Silicon thin film transistor. Low Temperature Poly Silicon (LTPS) is used for an active layer of a low temperature poly silicon thin film transistor and an oxide semiconductor (Oxide) is used for an active layer of an oxide thin film transistor. A low temperature poly silicon thin film transistor has advantages such as a high mobility rate and fast charging, and an oxide thin film transistor has advantages such as a low leakage current. The low temperature poly silicon thin film transistor and the oxide thin film transistor are integrated on one display substrate to form a Low Temperature Polycrystalline Oxide (LTPO+Oxide) display substrate, and advantages of both the low temperature poly silicon thin film transistor and the oxide thin film transistor may be utilized, which may achieve low-frequency drive, reduce power consumption, and improve display quality.

In some examples, a timing controller, a data drive circuit, and a gate drive circuit may be disposed in the non-display region. Wherein the gate drive circuit may be respectively disposed on opposite sides of the display region, for example, a left side and a right side of the display region (such as a left bezel region and a right bezel region included by the peripheral region); the timing controller and the data drive circuit may be disposed on one side of the display region, for example, on a lower side of the display region (for example, a lower bezel region included in the peripheral region). However, the present embodiment is not limited thereto. In some examples, the gate drive circuit may be located in the display region.

In some examples, the data drive circuit may provide a data signal to a sub-pixel in the display region through a data line. The timing controller may provide a drive signal to the data drive circuit and the gate drive circuit. Actions of the gate drive circuit and the data drive circuit may be controlled by the timing controller. The timing controller may provide the data drive circuit with gray scale data specifying a gray scale that should be displayed at a sub-pixel. The data drive circuit may provide, via a data line, a data signal of a potential corresponding to the gray scale data of the sub-pixel to sub-pixels of a row selected by the gate drive circuit.

In some examples, the display substrate may include a plurality of gate drive circuits including, for example, a gate drive circuit for outputting a scan signal, a gate drive circuit for outputting a light emitting control signal and the like. For example, the gate drive circuit for outputting a scan signal may provide a scan signal to a sub-pixel through a scan line, and provide a reset signal to a sub-pixel through a reset signal line; the gate drive circuit for outputting a light emitting control signal may provide a light emitting control signal to a sub-pixel through a light emitting control line. Each gate drive circuit includes a plurality of shift register circuits cascaded. An output terminal of each stage shift register circuit may be connected with a plurality of pixel circuits in a corresponding row of pixel circuits, and configured to provide a drive signal (e.g., a scan signal) to the row of pixel circuits.

FIG. 1 is a schematic diagram of a shift register circuit according to at least one embodiment of the present disclosure. FIG. 1 may be an equivalent circuit diagram of an n-th stage shift register circuit. Among them, n is a positive integer greater than 1. In some examples, as shown in FIG. 1, the shift register circuit provided by the present embodiment may include: a cascaded signal generation circuit 101, a gate circuit 102, an output control circuit 103, an output circuit 104, a voltage sustainment circuit 105, and an initialization circuit 106.

In some examples, the cascaded signal generation circuit 101 may be electrically connected with a cascaded input terminal (which may also be referred to as a first scan signal input terminal) NS(n−1), a clock signal terminal (which may also be referred to as a first clock signal input terminal) CK, a first voltage input terminal (which may also be referred to as a first level signal input terminal) VGH, a second voltage input terminal (which may also be referred to as a second voltage signal input terminal) VGL, and a cascaded output terminal (which may also be referred to as a second scan signal input terminal) NS(n), and be configured to perform a shift operation on a cascaded signal provided by an (n−1)-th stage shift register circuit received by the cascaded input terminal NS(n−1), and output a cascaded signal of the n-th stage shift register circuit to the cascaded output terminal NS(n). A cascaded input terminal of a present stage shift register circuit (e.g., the n-th stage shift register circuit) is connected with a cascaded output terminal of a previous stage shift register circuit (e.g., the (n−1)-th stage shift register circuit). A cascaded signal generation circuit 101 of the present stage shift register circuit (e.g., the n-th stage shift register circuit) may generate a cascaded signal of the present stage shift register circuit by using a cascaded signal output from the previous stage shift register circuit (e.g., the (n−1)-th stage shift register circuit), and provide the cascaded signal of the present stage shift register circuit to a cascaded input terminal of a next stage shift register circuit (e.g., an (n+1)-th stage shift register circuit).

In some examples, the gate circuit 102 may be connected with a gate input terminal (which may also be referred to as a shield signal input terminal) VCT, a cascaded input terminal NS(n−1), a cascaded output terminal NS(n), and a third node N3, and be configured to write a gate input signal provided by the gate input terminal VCT to the third node N3 under control of the cascaded input terminal NS(n−1) and the cascaded output terminal NS(n).

In some examples, the voltage sustainment circuit 105 may be connected with the first voltage input terminal VGH, the second voltage input terminal VGL, the clock signal terminal CK, the cascaded input terminal NS(n−1), the third node N3, and a fifth node N5, and be configured to control a potential of the fifth node N5 under control of the third node N3, the cascaded input terminal NS(n−1), and the clock signal terminal CK. The voltage sustainment circuit 105 may be configured to stabilize a gate input signal provided by the gate input terminal VCT and compensate for transmission loss of the gate input signal.

In some examples, the output control circuit 103 may be connected with the cascaded output terminal NS(n), the fifth node N5, a sixth node N6, the first voltage input terminal VGH, and the second voltage input terminal VGL, and be configured to perform a NOT-AND operation on potentials of the cascaded output terminal NS(n) and the fifth node N5 to control a potential of the sixth node N6.

In some examples, the output circuit 104 may be connected with the sixth node N6, a drive output terminal (which may also be referred to as a gate drive signal output terminal) NO(n), the first voltage input terminal VGH, and the second voltage input terminal VGL, and be configured to perform an inverse operation on the potential of the sixth node N6 to output a drive signal.

In some examples, the initialization circuit 106 may be connected with an initial control terminal (which may also be referred to as a second clock signal input terminal) NCX, the cascaded output terminal NS(n), the first voltage input terminal VGH, and the third node N3, and be configured to initialize the cascaded output terminal NS(n) and the third node N3 under control of the initial control terminal NCX.

In some examples, the first voltage input terminal VGH may continuously provide a first voltage signal with a high level, and the second voltage input terminal VGL may continuously provide a second voltage signal with a low level. The first voltage signal may be greater than the second voltage signal. The first voltage input terminal VGH may be connected with a first voltage line transmitting the first voltage signal, and the second voltage input terminal VGL may be connected with a second voltage line transmitting the second voltage signal. However, the present embodiment is not limited thereto.

The "high level" and the "low level" mentioned herein are relative, and voltage values of the "high level" and the "low level" are not limited.

In some examples, the cascaded signal generation circuit 101 may include: a first control circuit, a second control circuit, a third control circuit, and a fourth control circuit. The first control circuit and the second control circuit may be inverting circuits including a transmission gate, and the third control circuit and the fourth control circuit may be inverting circuits. The first control circuit, the second control circuit, and the third control circuit are all connected with a second node N2, and the first control circuit, the second control circuit, and the fourth control circuit are all connected with a first node N1.

In some examples, the first control circuit may include: a first transistor T1, a second transistor T2, a third transistor T3, and a fourth transistor T4. The first transistor T1 and the second transistor T2 are of a same transistor type, the third transistor T3 and the fourth transistor T4 are of a same transistor type, and a transistor type of the second transistor T2 are different from that of the third transistor T3. The first transistor T1 and the second transistor T2 may be P-type transistors, and the third transistor T3 and the fourth transistor T4 may be N-type transistors.

In some examples, a gate electrode of the first transistor T1 is connected with the first node N1, a first electrode of the first transistor T1 is connected with the first voltage input terminal VGH, and a second electrode of the first transistor T1 is connected with a first electrode of the second transistor T2. A gate electrode of the second transistor T2 is connected with the cascaded input terminal NS(n−1), and a second electrode of the second transistor T2 is connected with the second node N2. A gate electrode of the third transistor T3 is connected with the cascaded input terminal NS(n−1), a second electrode of the third transistor T3 is connected with the second node N2, and a first electrode of the third transistor T3 is connected with a second electrode of the fourth transistor T4. A gate electrode of the fourth transistor T4 is connected with the clock signal terminal CK, and a first electrode of the fourth transistor T4 is connected with the second voltage input terminal VGL.

In some examples, the second control circuit may include: a fifth transistor T5, a sixth transistor T6, a seventh transistor T7, and an eighth transistor T8. The fifth transistor T5 and the sixth transistor T6 are of a same transistor type, the seventh transistor T7 and the eighth transistor T8 are of a same transistor type, and the sixth transistor T6 and the seventh transistor T7 are of different transistor types. The fifth transistor T5 and the sixth transistor T6 may be P-type transistors, and the seventh transistor T7 and the eighth transistor T8 may be N-type transistors.

In some examples, a gate electrode of the fifth transistor T5 is connected with the clock signal terminal CK, a first electrode of the fifth transistor T5 is connected with the first voltage input terminal VGH, and a second electrode of the fifth transistor T5 is connected with a first electrode of the sixth transistor T6. A gate electrode of the sixth transistor T6 is connected with the cascaded output terminal NS(n), and a second electrode of the sixth transistor T6 is connected with the second node N2. A gate electrode of the seventh transistor T7 is connected with the cascaded output terminal NS(n), a second electrode of the seventh transistor T7 is connected with the second node N2, and a first electrode of the seventh transistor T7 is connected with a second electrode of the eighth transistor T8. A gate electrode of the eighth transistor T8 is connected with the first node N1, and a first electrode of the eighth transistor T8 is connected with the second voltage input terminal VGL.

In some examples, the third control circuit may include a ninth transistor T9 and a tenth transistor T10. The ninth transistor T9 and the tenth transistor T10 are of different transistor types. The ninth transistor T9 may be a P-type transistor, and the tenth transistor T10 may be an N-type transistor. A gate electrode of the ninth transistor T9 is connected with the second node N2, a first electrode of the ninth transistor T9 is connected with the first voltage input terminal VGH, and both a second electrode of the ninth transistor T9 and a second electrode of the tenth transistor T10 are connected with the cascaded output terminal NS(n). A gate electrode of the tenth transistor T10 is connected with the second node N2, and a first electrode of the tenth transistor T10 is connected with the second voltage input terminal VGL.

In some examples, the fourth control circuit may include a twenty-seventh transistor T27 and a twenty-eighth transistor T28. The twenty-seventh transistor T27 and the twenty-eighth transistor T28 are of different transistor types. The twenty-seventh transistor T27 may be a P-type transistor, and the twenty-eighth transistor T28 may be an N-type transistor. A gate electrode of the twenty-seventh transistor T27 is connected with the clock signal terminal CK, a first electrode of the twenty-seventh transistor T27 is connected with the first voltage input terminal VGH, and both a second electrode of the twenty-seventh transistor T27 and a second electrode of the twenty-eighth transistor T28 are connected with the first node N1. A gate electrode of the twenty-eighth transistor T28 is connected with the clock signal terminal CK, and a first electrode of the twenty-eighth transistor T28 is connected with the second voltage input terminal VGL.

In some examples, the gate circuit 102 may include a seventeenth transistor T17 and an eighteenth transistor T18. The seventeenth transistor T17 and the eighteenth transistor T18 may be of different transistor types. The seventeenth transistor T17 may be a P-type transistor, and the eighteenth transistor T18 may be an N-type transistor. A gate electrode of the seventeenth transistor T17 is connected with the cascaded output terminal NS(n), a first electrode of the seventeenth transistor T17 is connected with the gate input terminal VCT, and a second electrode of the seventeenth transistor T17 is connected with a first electrode of the eighteenth transistor T18. A gate electrode of the eighteenth transistor T18 is connected with the cascaded input terminal NS(n−1), and a second electrode of the eighteenth transistor T18 is connected with the third node N3.

In some examples, a low level signal is provided at the cascaded output terminal NS(n) and the seventeenth transistor T17 is turned on, and a high level signal is provided at the cascaded input terminal NS(n−1) and the eighteenth transistor T18 is turned on, and a gate input signal provided by the gate input terminal VCT may be written to the third node N3. A high level signal is provided at the cascaded output terminal NS(n) and the seventeenth transistor T17 is turned off, or a low level signal is provided at the cascaded input terminal NS(n−1) and the eighteenth transistor T18 is turned off, and the gate input signal provided by the gate input terminal VCT cannot be written to the third node N3. The gate circuit of this example achieves transmission of the gate input signal through simultaneous conduction of two signals (cascade signals of the previous stage shift register circuit and the present stage shift register circuit), and may obtain a state of the gate input signal during a high-low frequency switching cycle.

In some examples, the output control circuit 103 may include: a twenty-first transistor T21, a twenty-second transistor T22, a twenty-third transistor T23, and a twenty-fourth transistor T24. The twenty-first transistor T21 and the twenty-second transistor T22 are of a same transistor type, and the twenty-third transistor T23 and the twenty-fourth transistor T24 are of a same transistor type. The twenty-first transistor T21 and the twenty-second transistor T22 may be P-type transistors, and the twenty-third transistor T23 and the twenty-fourth transistor T24 may be N-type transistors. A gate electrode of the twenty-first transistor T21 is connected with the cascaded output terminal NS(n), a first electrode of the twenty-first transistor T21 is connected with the first voltage input terminal VGH, and a second electrode of the twenty-first transistor T21 is connected with the sixth node N6. A gate electrode of the twenty-second transistor T22 is connected with the fifth node N5, a first electrode of the twenty-second transistor T22 is connected with the first voltage input terminal VGH, and a second electrode of the twenty-second transistor T22 is connected with the sixth node N6. A gate electrode of the twenty-third transistor T23 is connected with the cascaded output terminal NS(n), a second electrode of the twenty-third transistor T23 is connected with the sixth node N6, and a first electrode of the twenty-third transistor T23 is connected with a second electrode of the twenty-fourth transistor T24. A gate electrode of the twenty-fourth transistor T24 is connected with the fifth node N5, and a first electrode of the twenty-fourth transistor T24 is connected with the second voltage input terminal VGL.

In some examples, the output circuit 104 may include: a nineteenth transistor T19 and a twentieth transistor T20. The nineteenth transistor T19 and the twentieth transistor T20 are of different transistor types. The nineteenth transistor T19 may be a P-type transistor, and the twentieth transistor T20 may be an N-type transistor. A gate electrode of the nineteenth transistor T19 is connected with the sixth node N6, a first electrode of the nineteenth transistor T19 is connected with the first voltage input terminal VGH, and both a second electrode of the nineteenth transistor T19 and a second electrode of the twentieth transistor T20 are connected with the drive output terminal NO(n). A gate electrode of the twentieth transistor T20 is connected with the sixth node N6, and a first electrode of the twentieth transistor T20 is connected with the second voltage input terminal VGL.

In some examples, the voltage sustainment circuit 105 may include: a twelfth transistor T12, a thirteenth transistor T13, a fourteenth transistor T14, a fifteenth transistor T15, a twenty-fifth transistor T25, and a twenty-sixth transistor T26. The twelfth transistor T12, the fourteenth transistor T14, and the twenty-fifth transistor T25 are of a same transistor type, and may, for example, be P-type transistors; the thirteenth transistor T13, the fifteenth transistor T15, and the twenty-sixth transistor T26 are of a same transistor type, and may, for example, be N-type transistors.

In some examples, a gate electrode of the twelfth transistor T12 is connected with the third node N3, a first electrode of the twelfth transistor T12 is connected with the first voltage input terminal VGH, and a second electrode of the twelfth transistor T12 is connected with a fourth node N4. A gate electrode of the thirteenth transistor T13 is connected with the third node N3, a second electrode of the thirteenth transistor T13 is connected with the fourth node N4, and a first electrode of the thirteenth transistor T13 is connected with the second voltage input terminal VGL. A gate electrode of the fourteenth transistor T14 is connected with the fourth node N4, a first electrode of the fourteenth transistor T14 is connected with the first voltage input terminal VGH, and a second electrode of the fourteenth transistor T14 is connected with the fifth node N5. A gate electrode of the fifteenth transistor T15 is connected with the fourth node N4, a second electrode of the fifteenth transistor T15 is connected with the fifth node N5, and a first electrode of the fifteenth transistor T15 is connected with the second voltage input terminal VGL. A gate electrode of the twenty-fifth transistor T25 is connected with the cascaded input terminal NS(n−1), a first electrode of the twenty-fifth transistor T25 is connected with the third node N3, and a second electrode of the twenty-fifth transistor T25 is connected with the fifth node N5. A gate electrode of the twenty-sixth transistor T26 is connected with the clock signal terminal CK, a first electrode of the twenty-sixth transistor T26 is connected with the third node N3, and a second electrode of the twenty-sixth transistor T26 is connected with the fifth node N5.

In some examples, since a P-type transistor has threshold voltage loss when transferring a low voltage and an N-type transistor has threshold voltage loss when transferring a high voltage, an absolute value of a potential of the third node N3 will decrease, and the absolute value of the potential of the third node N3 may be controlled to increase through the twelfth transistor T12 to the fifteenth transistor T15, so that a corresponding transistor in the output circuit 104 may be better controlled to be turned on or off. The twenty-fifth transistor T25 and the twenty-sixth transistor T26 may control a disconnection between the third node N3 and the fifth node N5 when both the seventeenth transistor T17 and the eighteenth transistor T18 of the gate circuit 102 are turned on, so as to avoid affecting writing of the potential the third node N3.

In some examples, the initialization circuit 106 may include: an eleventh transistor T11 and a sixteenth transistor T16. The eleventh transistor T11 and the sixteenth transistor T16 are of a same transistor type, and, for example, both are P-type transistors. A gate electrode of the eleventh transistor T11 is connected with the initial control terminal NCX, a first electrode of the eleventh transistor T11 is connected with the first voltage input terminal VGH, and a second electrode of the eleventh transistor T11 is connected with the cascaded output terminal NS(n). A gate electrode of the sixteenth transistor T16 is connected with the initial control terminal NCX, a first electrode of the sixteenth transistor T16 is connected with the first voltage input terminal VGH, and a second electrode of the sixteenth transistor T16 is connected with the third node N3.

In some examples, when the cascaded input terminal NS(n−1) provides a high voltage signal, the cascaded output terminal NS(n) outputs a low voltage signal, and if the gate input terminal VCT outputs a low voltage signal, the drive output NO(n) outputs a low voltage signal when the cascaded output terminal NS(n) outputs a high voltage signal; when the cascaded input terminal NS(n−1) provides a high voltage signal and the cascaded output terminal NS(n) outputs a low voltage signal, if the gate input terminal VCT outputs a high voltage signal, the drive output terminal NO(n) outputs a high voltage signal when the cascaded output terminal NS(n) outputs a high voltage signal.

In some examples, the first node N1 may be a connection point of the first transistor T1, the eighth transistor T8, the twenty-seventh transistor T27, and the twenty-eighth transistor T28. The second node N2 may be a connection point of the second transistor T2, the third transistor T3, the sixth transistor T6, the seventh transistor T7, the ninth transistor T9, and the tenth transistor T10. The third node N3 may be a connection point of the eighteenth transistor T18, the sixteenth transistor T16, the twelfth transistor T12, the thirteenth transistor T13, the twenty-fifth transistor T25, and the twenty-sixth transistor T26. The fourth node N4 may be a connection point of the twelfth transistor T12, the thirteenth transistor T13, the fourteenth transistor T14, and the fifteenth transistor T15. The fifth node N5 may be a connection point of the fourteenth transistor T14, the fifteenth transistor T15, the twenty-fifth transistor T25, the twenty-sixth transistor T26, the twenty-second transistor T22, and the twenty-fourth transistor T24. The sixth node N6 may be a connection point of the twenty-first transistor T21, the twenty-second transistor T22, the twenty-third transistor T23, the nineteenth transistor T19, and the twentieth transistor T20.

In this example, the first node N1, the second node N2, the third node N3, the fourth node N4, the fifth node N5, and the sixth node N6 do not represent components which are actually present, but rather represent convergence points of relevant electrical connections in a circuit diagram. In other words, these nodes are nodes equivalent to convergence points of related electrical connections in the circuit diagram.

In some examples, a drive signal provided by the drive output terminal NO(n) of the shift register circuit of the present example may be configured to be transmitted to a gate electrode of an N-type transistor in a pixel circuit in the display region, as a control signal for controlling whether the N-type transistor in the pixel circuit is turned on or not. For example, by controlling an N-type transistor in the pixel circuit to be turned on or off, refresh of pixel brightness may be achieved. Therefore, when it is desired to achieve that some of pixels are not refreshed, it may be achieved by ensuring that the N-type transistor in the pixel circuit is turned off.

In some examples, the shift register circuit of the present example may include twenty-eight transistors, including fifteen P-type transistors and thirteen N-type transistors. The P-type transistors may be low temperature poly silicon transistors, including a first transistor T1, a second transistor T2, a fifth transistor T5, a sixth transistor T6, a ninth transistor T9, an eleventh transistor T11, a twelfth transistor T12, a fourteenth transistor T14, a sixteenth transistor T16, a seventeenth transistor T17, a nineteenth transistor T19, a twenty-first transistor T21, a twenty-second transistor T22, a twenty-fifth transistor T25, and a twenty-seventh transistor T27. The N-type transistors may be oxide transistors, including a third transistor T3, a fourth transistor T4, a seventh transistor T7, an eighth transistor T8, a tenth transistor T10, a thirteenth transistor T13, a fifteenth transistor T15, an eighteenth transistor T18, a twentieth transistor T20, a twenty-third transistor T23, a twenty-fourth transistor T24, a twenty-sixth transistor T26, and a twenty-eighth transistor T28. Among them, a plurality of oxide transistors in the shift register circuit of the present example may include an oxide output transistor and a plurality of oxide switching transistors. The oxide output transistor may include a twentieth transistor T20, and the plurality of oxide switching transistors may include a third transistor T3, a fourth transistor T4, a seventh transistor T7, an eighth transistor T8, a tenth transistor T10, a thirteenth transistor T13, a fifteenth transistor T15, an eighteenth transistor T18, a twenty-third transistor T23, a twenty-fourth transistor T24, a twenty-sixth transistor T26, and a twenty-eighth transistor T28.

In some examples, the shift register circuit may include a plurality of NOT gate circuits (which may also be referred to as an inverting circuit or inverter). The plurality of NOT gate circuits in the shift register circuit may include, for example, a first NOT gate circuit to a seventh NOT gate circuit. Each NOT gate circuit may include: a first control transistor and a second control transistor. The first control transistor and the second control transistor are of different transistor types. For example, the first control transistor may be a P-type transistor, the second control transistor may be an N-type transistor, and work of the P-type transistor and the N-type transistor is complementary. For example, a NOT gate circuit may be a Complementary Metal Oxide Semiconductor (CMOS) tube formed by a P-type transistor and an N-type transistor which appear in pairs and work complementarily.

In some examples, a gate electrode of a first control transistor in a NOT gate circuit is connected with a gate electrode of a second control transistor, as a first input terminal of the NOT gate circuit; a second electrode of the first control transistor is connected with a second electrode of the second control transistor, as an output terminal of the NOT gate circuit; a first electrode of the first control transistor serves as a second input terminal of the NOT gate circuit; a first electrode of the second control transistor serves as a third input terminal of the NOT gate circuit. The second input terminal and the third input terminal of the NOT gate circuit may be configured to access different voltage signals.

In some examples, as shown in FIG. 1, a first control transistor of a first NOT gate circuit may be a second transistor T2, and a second control transistor may be a third transistor T3. A first control transistor of a second NOT gate circuit may be a sixth transistor T6, and a second control transistor may be a seventh transistor T7. A first control transistor of a third NOT gate circuit may be a ninth transistor T9, and a second control transistor may be a tenth transistor T10. A first control transistor of a fourth NOT gate circuit may be a twenty-seventh transistor T27, and a second control transistor may be a twenty-eighth transistor T28. A first control transistor of a fifth NOT gate circuit may be a twelfth transistor T12, and a second control transistor may be a thirteenth transistor T13. A first control transistor of a sixth NOT gate circuit may be a fourteenth transistor T14, and a second control transistor may be a fifth transistor T15. A first control transistor of a seventh NOT gate circuit may be a nineteenth transistor T19, and a second control transistor may be a twentieth transistor T20. The cascaded signal generation circuit 101 may include four NOT gate circuits (i.e., a first NOT gate circuit to a fourth NOT gate circuit). The voltage sustainment circuit 105 may include two NOT gate circuits (i.e., a fifth NOT gate circuit and a sixth NOT gate circuit). The output circuit 104 may include one NOT gate circuit (i.e., a seventh NOT gate circuit).

In some examples, the shift register circuit may include a NAND gate circuit. The NAND gate circuit may include: a third control transistor, a fourth control transistor, a fifth control transistor, and a sixth control transistor. The third control transistor and the fourth control transistor may be of a same transistor type, for example, may be P-type transistors; the fifth control transistor and the sixth control transistor may be of a same transistor type, for example, may be N-type transistors. Among them, gate electrodes of the third control transistor and the fifth control transistor are connected as a first input terminal of the NAND gate circuit; gate electrodes of the fourth control transistor and the sixth control transistor are connected as a second input terminal of the NAND gate circuit; a first electrode of the third control transistor and a first electrode of the fourth control transistor are connected as a third input terminal of the NAND gate circuit; a second electrode of the third control transistor, a second electrode of the fourth control transistor, and a second electrode of the fifth control transistor are connected as an output terminal of the NAND gate circuit; a first electrode of the fifth control transistor is connected with a second electrode of the sixth control transistor; a first electrode of the sixth control transistor serves as a fourth input terminal of the NAND gate circuit. The third input terminal and the fourth input terminal of the NAND gate circuit may be configured to access different voltage signals.

In some examples, as shown in FIG. 1, the third control transistor of the NAND gate circuit may be a twenty-first transistor T21, the fourth control transistor may be a twenty-second transistor T22, the fifth control transistor may be a twenty-third transistor T23, and the sixth control transistor may be a twenty-fourth transistor T24.

In some examples, the third input terminal may access a first voltage signal with a high level, and the fourth input terminal may access a second voltage signal with a low level. When a signal with a high level is received at the first input terminal of the NAND gate circuit and a signal with a high level is received at the second input terminal, the output terminal of the NAND gate circuit may output a signal with a low level; when a signal with a high level is received at the first input terminal of the NAND gate circuit and a signal with a low level is received at the second input terminal, the output terminal of the NAND gate circuit may output a signal with a high level; when a signal with a low level is received at the first input terminal of the NAND gate circuit and a signal with a high level is received at the second input terminal, the output terminal of the NAND gate circuit may output a signal with a high level; when a signal with a low level is received at the first input terminal of the NAND gate circuit and a signal with a low level is received at the second input terminal, the output terminal of the NAND gate circuit may output a signal with a high level. The output control circuit 103 of the present example may include one NAND gate circuit.

The shift register circuit of the present embodiment includes twenty-eight transistors, and no capacitor is provided, such that local refresh of the display region may be achieved. The present example may achieve update of a local picture of a display screen by controlling a gate input signal provided by the gate input terminal VCT, thereby reducing power consumption, or achieve OLED display products such as wearable products, mobile terminals, and notebook computers (NB) with ultra-low power consumption through local update of a displayed picture.

Figure 2:
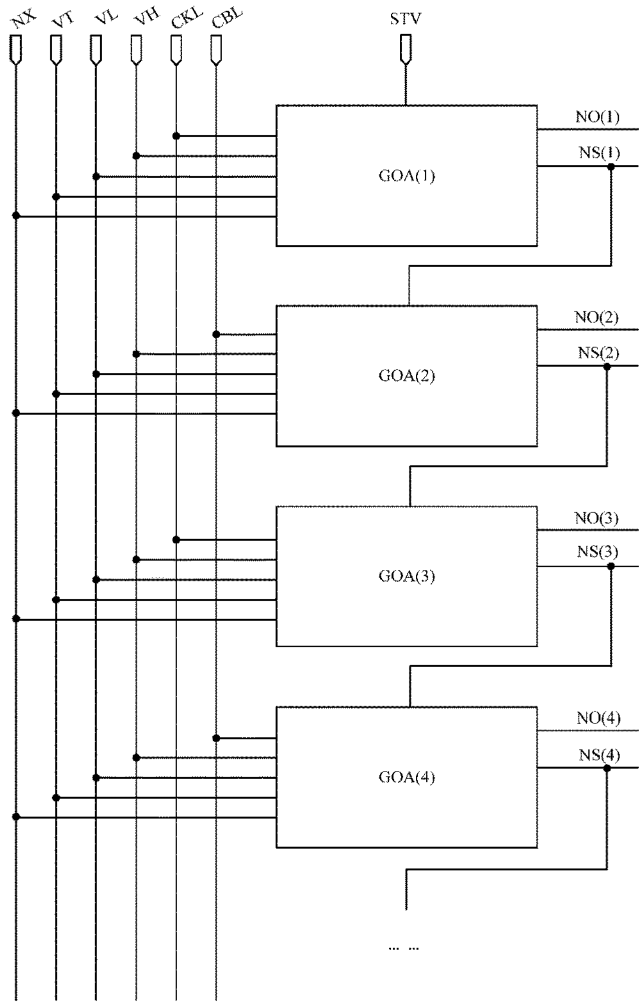
FIG. 2 is a schematic diagram of a gate drive circuit according to at least one embodiment of the present disclosure.

FIG. 2 is a schematic diagram of a gate drive circuit according to at least one embodiment of the present disclosure. In some examples, as shown in FIG. 2, the gate drive circuit may include a plurality of shift register circuits cascaded (e.g., GOA(1) to GOA(4)). Among them, a cascaded output terminal of an (n−1)-th stage shift register circuit GOA(n−1) is connected with a cascaded input terminal of an n-th stage shift register circuit GOA(n). In addition to a last stage shift register circuit, a cascaded signal provided by a cascaded output terminal of each stage shift register circuit may be used as an input signal of a cascaded input terminal of a next stage shift register circuit. Herein, n may be an integer greater than 1. A cascaded input terminal of a first stage shift register circuit may be connected with a start signal line STV.

In some examples, a clock signal terminal of a (2i−1)-th stage shift register circuit may be connected with a first clock signal line CKL, and a clock signal terminal of a 2i-th stage shift register circuit may be connected with a second clock signal line CBL. Herein, i may be an integer greater than 0. A first voltage input terminal VGH of each stage shift register circuit may be connected with a first voltage line VH, a second voltage input terminal VGL of each stage shift register circuit may be connected with a second voltage line VL, a gate input terminal VCT of each stage shift register circuit may be connected with a gate input signal line VT, and an initial control terminal NCX of each stage shift register circuit may be connected with an initial control signal line NX. The gate input signal line VT may provide a gate input signal, which may be a pulse signal.

Figure 3:
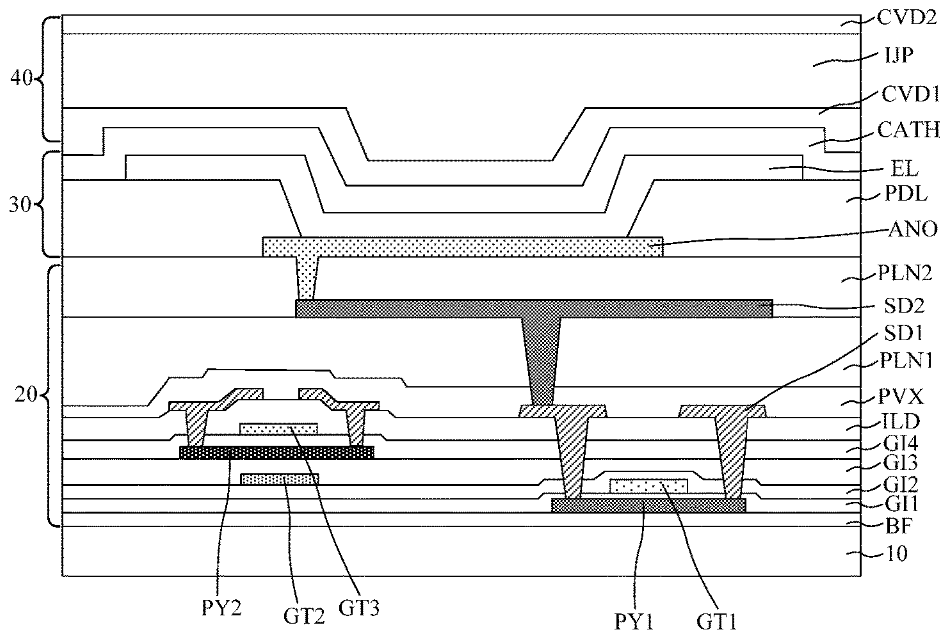
FIG. 3 is a partial cross-sectional schematic view of a display region of a display substrate according to at least one embodiment of the present disclosure.

FIG. 3 is a partial cross-sectional schematic view of a display region of a display substrate according to at least one embodiment of the present disclosure. A stacking order of film layers of the display substrate is schematically shown in FIG. 3. In some examples, as shown in FIG. 3, in a direction perpendicular to the display substrate, the display substrate may include: a base substrate (which may also be called a supporting base substrate) 10, and a circuit structure layer 20, a light emitting structure layer 30, and an encapsulation structure layer 40 which are disposed on the base substrate 10, sequentially.

In some examples, the circuit structure layer 20 may include a buffer layer BF, a first semiconductor layer (which may also be called a poly silicon active layer) PY1, a first insulation layer (which may also be called a first gate insulation layer) GI1, a first conductive layer (which may also be called a first gate metal layer) GT1, a second insulation layer (which may also be called a second gate insulation layer) GI2, a second conductive layer (which may also be called a second gate metal layer) GT2, a third insulation layer (which may also be called a third gate insulation layer) GI3, a second semiconductor layer (which may also be called an oxide active layer) PY2, a fourth insulation layer (which may also be called a fourth gate insulation layer) GI4, a third conductive layer (which may also be called a third gate metal layer) GT3, a fifth insulation layer (which may also be called an interlayer dielectric layer) ILD, a fourth conductive layer (which may also be called a first source-drain metal layer) SD1, a sixth insulation layer (which may also be called a passivation layer) PVX, a seventh insulation layer (which may also be called a first planarization layer) PLN1, a fifth conductive layer (which may also be called a second source-drain metal layer) SD2, and an eighth insulation layer (which may also be called a second planarization layer) PLN2 which are disposed on the base substrate 10, sequentially. However, the present embodiment is not limited thereto. In other examples, the sixth insulation layer PVX may be omitted, or the sixth insulation layer PVX may be located between the seventh insulation layer and the fifth conductive layer.

In some examples, the light emitting structure layer 30 may include: an anode layer ANO, a pixel definition layer (also referred to as a pixel delimiting layer) PDL, a light emitting functional layer EL, and a cathode layer CATH. The anode layer ANO may include an anode of a light emitting element, the pixel definition layer PDL may be formed with a plurality of pixel openings exposing the anode layer ANO, and the light emitting functional layer EL may be disposed within the pixel openings and connected with the anode within the anode layer ANO. The cathode layer CATH may be connected with the light emitting functional layer EL.

In some examples, the encapsulation structure layer 40 may include: a first encapsulation layer CVD1, a second encapsulation layer IJP, and a third encapsulation layer CVD2. The first encapsulation layer CVD1 and the third encapsulation layer CVD2 may be made of an inorganic material, and the second encapsulation layer IJP may be made of an organic material. The second encapsulation layer IJP may be disposed between the first encapsulation layer CVD1 and the third encapsulation layer CVD2 to form a laminated structure of an inorganic material/an organic material/an inorganic material to ensure that external water vapor cannot enter the light emitting structure layer 30. In some possible implementation modes, the display substrate may further include another film layer, such as a touch structure layer and a color filter layer, which is not limited here in this embodiment.

Figure 4:
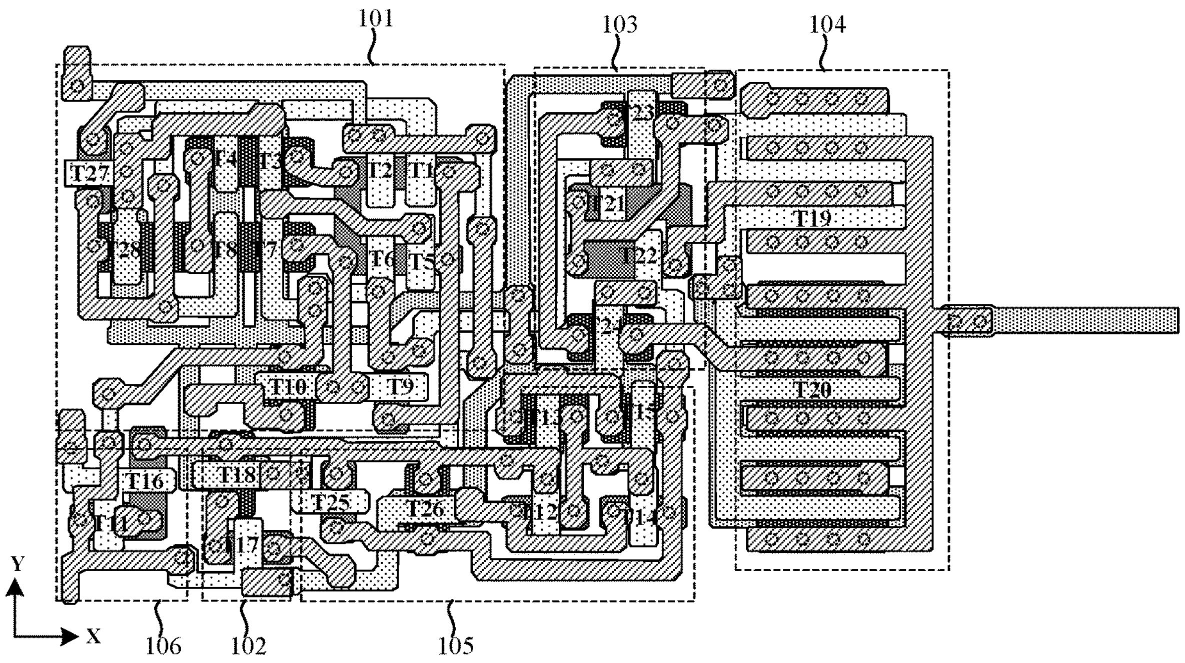
FIG. 4 is a partial top schematic view of a display substrate according to at least one embodiment of the present disclosure.

FIG. 4 is a partial top schematic view of a display substrate according to at least one embodiment of the present disclosure. A top view of a shift register circuit of the display substrate is schematically shown in FIG. 4, and an equivalent circuit of the shift register circuit of this example may be shown in FIG. 1.

In some examples, as shown in FIG. 4, an outer profile of a single shift register circuit may be approximately rectangular in a plane parallel to the display substrate. The cascaded signal generation circuit 101, the output control circuit 103, and the output circuit 104 may be arranged sequentially in a first direction X, and the initialization circuit 106, the gate circuit 102, and the voltage sustainment circuit 105 may be arranged sequentially in the first direction X. The initialization circuit 106 is adjacent to the cascaded signal generation circuit 101 in a second direction Y, and the gate circuit 102 is adjacent to the cascaded signal generation circuit 101 in the second direction Y. One part of the voltage sustainment circuit 105 is adjacent to the cascaded signal generation circuit 101 in the second direction Y, and the other part is adjacent to the output control circuit 103 in the second direction Y. The initialization circuit 106, the gate circuit 102, and the voltage sustainment circuit 105 are located on a same side of the cascaded signal generation circuit 101 in the second direction Y. One part of the output circuit 104 is adjacent to the output control circuit 103 in the first direction X, and the other part is adjacent to the voltage sustainment circuit 105 in the first direction X. The first direction X intersects with the second direction Y. For example, the first direction X may be perpendicular to the second direction Y. An arrangement mode of the shift register circuit in this example may save occupied space and is beneficial for achieving a narrow bezel.

In some examples, as shown in FIG. 4, in a plane parallel to the display substrate, an output terminal of the first NOT gate circuit (including the second transistor T2 and the third transistor T3) and an output terminal of the second NOT gate circuit (including the sixth transistor T6 and the seventh transistor T7) are connected, and the first NOT gate circuit is adjacent to the second NOT gate circuit in the second direction Y. The first NOT gate circuit may be located on a side of the second NOT gate circuit in the second direction Y. An arrangement mode of transistors of the first NOT gate circuit and an arrangement mode of transistors of the second NOT gate circuit may be the same. Among them, the third transistor T3 and the second transistor T2 in the first NOT gate circuit may be arranged sequentially in the first direction X, and the seventh transistor T7 and the sixth transistor T6 in the second NOT gate circuit may be arranged sequentially in the first direction X. The third transistor T3 and the seventh transistor T7 may be substantially aligned in the second direction Y, and the second transistors T2 and the sixth transistors T6 may be substantially aligned in the second direction Y.

In some examples, a second input terminal of the first NOT gate circuit is connected with the first transistor T1 (as a first transmission transistor), and a third input terminal of the first NOT gate circuit is connected with the fourth transistor T4 (as a third transmission transistor); a second input terminal of the second NOT gate circuit is connected with the fifth transistor T5 (as a second transmission transistor), and a third input terminal of the second NOT gate circuit is connected with the eighth transistor T8 (as a fourth transmission transistor). The first transistor T1 may be located on a side of the second transistor T2 in the first direction X, and the fourth transistor T4 may be located on a side of the third transistor T3 in an opposite direction of the first direction X. The fifth transistor T5 may be located on a side of the sixth transistor T6 in the first direction X, and the eighth transistor T8 may be located on a side of the seventh transistor T7 in the opposite direction of the first direction X. The first transistors T1 and the fifth transistors T5 may be substantially aligned in the second direction Y, and the fourth transistors T4 and the eighth transistors T8 may be substantially aligned in the second direction Y.

In some examples, the third NOT gate circuit (including the ninth transistor T9 and the tenth transistor T10) is adjacent to the second NOT gate circuit in the second direction Y. The third NOT gate circuit may be located on a side of the second NOT gate circuit in an opposite direction of the second direction Y. An arrangement mode of transistors of the third NOT gate circuit may be the same as an arrangement mode of transistors of the second NOT gate circuit. The tenth transistor T10 and the ninth transistor T9 may be arranged sequentially in the first direction X. The ninth transistors T9 and the sixth transistors T6 may be substantially aligned in the second direction Y, and the tenth transistors T10 and the seventh transistors T7 may be substantially aligned in the second direction Y.

In some examples, the fourth NOT gate circuit (including the twenty-seventh transistor T27 and the twenty-eighth transistor T28) may be located on a side of the first NOT gate circuit and the second NOT gate circuit in the opposite direction of the first direction X. An arrangement mode of transistors of the fourth NOT gate circuit may be different from arrangement modes of transistors of the first NOT gate circuit, the second NOT gate circuit, and the third NOT gate circuit. Among them, the twenty-seventh transistor T27 and the twenty-eighth transistor T28 may be arranged sequentially in the second direction Y.

In some examples, a NAND gate circuit (including the twenty-first transistor T21 to the twenty-fourth transistor T24) may be located on a side of the first NOT gate circuit and the second NOT gate circuit in the first direction X, and located on a side of the seventh NOT gate circuit (including the nineteenth transistor T19 and the twentieth transistor T20) in the opposite direction of the first direction X. The NAND gate circuit is adjacent to the fifth NOT gate circuit (including the twelfth transistor T12 and the thirteenth transistor T13) and the sixth NOT gate circuit (including the fourteenth transistor T14 and the fifteenth transistor T15) in the second direction Y. Four transistors in the NAND gate circuit may be arranged sequentially in the second direction Y.

In some examples, the fifth NOT gate circuit may be adjacent to the sixth NOT gate circuit in the first direction X. The sixth NOT gate circuit may be located on a side of the fifth NOT gate circuit in the first direction X. An arrangement mode of transistors of the fifth NOT gate circuit may be the same as an arrangement mode of transistors of the sixth NOT gate circuit. Among them, the twelfth transistor T12 and the thirteenth transistor T13 may be arranged sequentially in the second direction Y, and the fourteenth transistor T14 and the fifteenth transistor T15 may be arranged sequentially in the second direction Y. In addition, the twelfth transistor T12 and the fourteenth transistor T14 may be adjacent and aligned in the first direction X; the thirteenth transistor T13 and the fifteenth transistor T15 may be adjacent and aligned in the first direction X.

In some examples, the nineteenth transistor T19 and the twentieth transistor T20 of the seventh NOT gate circuit may be arranged sequentially in the second direction Y. The nineteenth transistor T19 may be located on a side of the twentieth transistor T20 in the second direction Y. The nineteenth transistor T19 may be adjacent to the NOT gate circuit in the first direction X, and the twentieth transistor T20 may be adjacent to the sixth NOT gate circuit in the first direction.

In some examples, the seventeenth transistor T17 and eighteenth transistor T18 included in the gate circuit 102 may be arranged sequentially in the second direction Y. The eighteenth transistor T18 may be located on a side of the seventeenth transistor T17 in the second direction Y. The sixteenth transistor T16 included in the initialization circuit 106 may be located on a side of the eighteenth transistor T18 in the opposite direction of the first direction X. The eleventh transistor T11 included in the initialization circuit 106 may be substantially located on a side of the sixteenth transistor T16 in the opposite direction of the second direction Y. The twenty-fifth transistor T25 and the twenty-sixth transistor T26 included in the voltage sustainment circuit 105 may be arranged sequentially in the first direction X. The twenty-fifth transistor T25 may be located on a side of the gate circuit 102 in the first direction X, the twenty-sixth transistor T26 may be located on a side of the twenty-fifth transistor T25 in the first direction X, and the fifth NOT gate circuit may be located on a side of the twenty-sixth transistor T26 in the first direction X. The twenty-sixth transistor T26, and the thirteenth transistor T13 of the fifth NOT gate circuit may be substantially aligned in the first direction.

Exemplary description is made below for a preparation process of a display substrate. A "patterning process" mentioned in the present disclosure includes photoresist coating, mask exposure, development, etching, photoresist stripping, etc., for a metal material, an inorganic material, or a transparent conductive material, and includes organic material coating, mask exposure, development, etc., for an organic material. Deposition may be any one or more of sputtering, evaporation, and chemical vapor deposition, coating may be any one or more of spray coating, spin coating, and inkjet printing, and etching may be any one or more of dry etching and wet etching, the present disclosure is not limited thereto. A "thin film" refers to a layer of thin film made of a certain material on a base substrate using deposition, coating, or other processes. If the "thin film" does not need to be processed through a patterning process in an entire manufacturing process, the "thin film" may also be called a "layer". If the "thin film" needs to be processed through the patterning process in the entire manufacturing process, the "thin film" is called a "thin film" before the patterning process is performed and is called a "layer" after the patterning process is performed. At least one "pattern" is contained in the "layer" after the patterning process.

"A and B are disposed in a same layer" mentioned in the present disclosure refers to that A and B are simultaneously formed through a same patterning process. A "thickness" of a film layer is a size of the film layer in a direction perpendicular to the display substrate. In an exemplary embodiment of the present disclosure, "a projection of A includes a projection of B" refers to that a boundary of the projection of B falls within a range of a boundary of the projection of A or the boundary of the projection of A is overlapped with the boundary of the projection of B. In this example, a shape of A refers to a shape of an orthographic projection of A on the base substrate.

The preparation process of the display substrate according to this exemplary embodiment may include following acts. A preparation process of a circuit structure layer is explained as an example.

(1) A base substrate is provided. In some examples, the base substrate may be a rigid base substrate or a flexible base substrate. For example, the rigid base substrate may be made of, but is not limited to, one or more of glass and quartz. The flexible base substrate may be made of, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fiber. In some examples, the flexible base substrate may include a first flexible material layer, a first inorganic material layer, a second flexible material layer and a second inorganic material layer which are stacked. The first flexible material layer and the second flexible material layer may be made of Polyimide (PI), Polyethylene Terephthalate (PET) or a surface-treated polymer soft film, or the like; and the first inorganic material layer and the second inorganic material layer may be made of Silicon Nitride (SiNx, x>0) or Silicon Oxide (SiOy, y>0), etc., thereby improving water-resistance and oxygen-resistance of the base substrate.

(2) A first semiconductor layer is formed. In some examples, a buffer thin film and a first semiconductor thin film are sequentially deposited on the base substrate, and the first semiconductor thin film is patterned through a patterning process to form a buffer layer and a first semiconductor layer disposed on the base substrate. In some examples, a material of the first semiconductor layer may be amorphous Silicon (a-Si), poly Silicon (p-Si), hexathiophene or polythiophene, or other materials.

Figure 5:
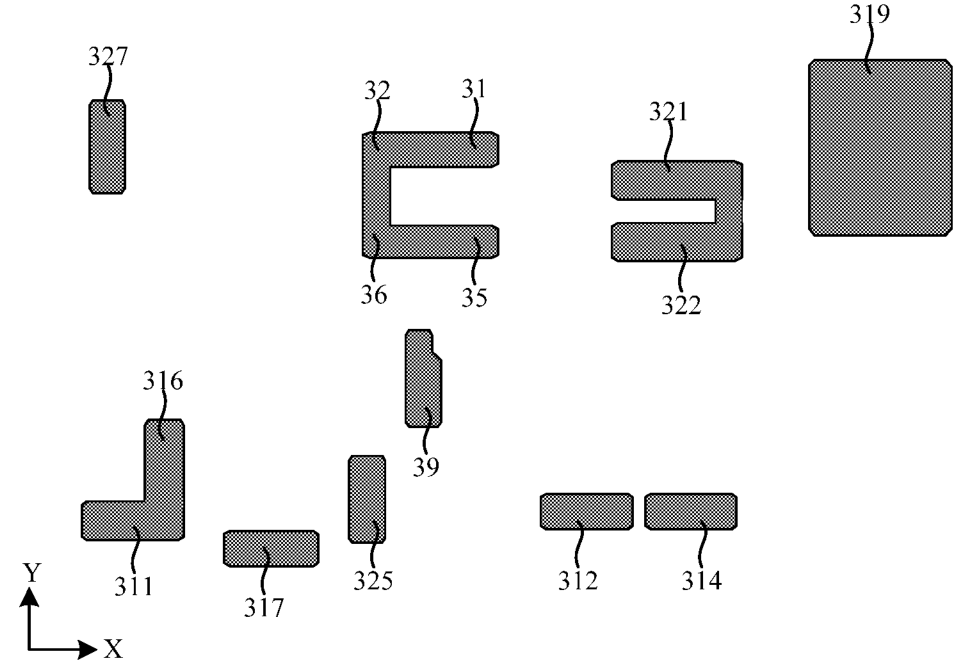
FIG. 5 is a schematic diagram of the display substrate after a first semiconductor layer is formed in FIG. 4.

FIG. 5 is a schematic diagram of a display substrate after a first semiconductor layer is formed in FIG. 4. In some examples, as shown in FIG. 5, the first semiconductor layer of the display substrate may include at least active layers of a plurality of P-type transistors of a shift register circuit, for example, include an active layer 31 of the first transistor T1, an active layer 32 of the second transistor T2, an active layer 35 of the fifth transistor T5, an active layer 36 of the sixth transistor T6, an active layer 39 of the ninth transistor T9, an active layer 311 of the eleventh transistor T11, an active layer 312 of the twelfth transistor T12, an active layer 314 of the fourteenth transistor T14, an active layer 316 of the sixteenth transistor T16, an active layer 317 of the seventeenth transistor T17, an active layer 319 of the nineteenth transistor T19, an active layer 321 of the twenty-first transistor T21, an active layer 322 of the twenty-second transistor T22, an active layer 325 of the twenty-fifth transistor T25, and an active layer 327 of the twenty-seventh transistor T27.

In some examples, an active layer of each transistor may include: a first region, a second region, and a channel region located between the first region and the second region. Among them, a material of the first semiconductor layer may include, for example, poly silicon. The channel region of a first type transistor may be free from impurities and have semiconductor characteristics. The first region and the second region may be doped regions on both sides of the channel region, and are doped with impurities, and thus have conductivity. The impurities may be changed according to a type of a transistor. In some examples, a doped region of an active layer may be interpreted as a source electrode or a drain electrode of a transistor. For example, a first region of an active layer may be interpreted as a first electrode of a transistor, and a second region of the active layer may be interpreted as a second electrode of the transistor. A part of an active layer between transistors may be interpreted as wiring doped with an impurity, and may be used for electrically connecting the transistors. The present embodiment is not limited thereto.

In some examples, the active layer 31 of the first transistor T1, the active layer 32 of the second transistor T2, the active layer 36 of the sixth transistor T6, and the active layer 35 of the fifth transistor T5 may be sequentially connected to form an integral structure. The integral structure may be substantially C-shaped. Among them, a second region of the active layer 31 of the first transistor T1 may simultaneously serve as a first region of the active layer 32 of the second transistor T2, a second region of the active layer 32 of the second transistor T2 may simultaneously serve as a second region of the active layer 36 of the sixth transistor T6, and a first region of the active layer 36 of the sixth transistor T6 may simultaneously serve as a second region of the active layer 35 of the fifth transistor T5.

In some examples, a shape of the active layer 311 of the eleventh transistor T11 may be substantially a shape of a strip extending in the first direction X, and a shape of the active layer 316 of the sixteenth transistor T16 may be substantially a shape of a strip extending in the second direction Y. The active layer 311 of the eleventh transistor T11 and the active layer 316 of the sixteenth transistor T16 may be connected with each other to be an integral structure, and the integral structure may be substantially L-shaped. Among them, a first region of the active layer 311 of the eleventh transistor T11 may simultaneously serve as a first region of the active layer 316 of the sixteenth transistor T16.

In some examples, the active layer 321 of the twenty-first transistor T21 and the active layer 322 of the twenty-second transistor T22 may extend at least in the first direction X. The active layer 321 of the twenty-first transistor T21 and the active layer 322 of the twenty-second transistor T22 may be connected with each other to be an integral structure, and the integral structure may be substantially C-shaped. Among them, a second region of the active layer 321 of the twenty-first transistor T21 may simultaneously serve as a second region of the active layer 322 of the twenty-second transistor T22. An opening of the integral structure of the active layer 31 of the first transistor T1, the active layer 32 of the second transistor T2, the active layer 36 of the sixth transistor T6, and the active layer 35 of the fifth transistor T5 may face an opening of the integral structure of the active layer 321 of the twenty-first transistor T21 and the active layer 322 of the twenty-second transistor T22.

In some examples, a shape of the active layer 39 of the ninth transistor T9 may be substantially a shape of a strip extending in the second direction Y, and the active layer 39 of the ninth transistor T9 may be located on a side of the integral structure of the active layer 31 of the first transistor T1, the active layer 32 of the second transistor T2, the active layer 36 of the sixth transistor T6, and the active layer 35 of the fifth transistor T5 in the opposite direction of the second direction Y.

In some examples, a shape of the active layer 312 of the twelfth transistor T12 may be substantially a shape of a strip extending in the first direction X. A shape of the active layer 314 of the fourteenth transistor 14 may be substantially a shape of a strip extending in the first direction X. The active layer 312 of the twelfth transistor T12 and the active layer 314 of the fourteenth transistor T14 may be adjacent in the first direction X, and may be aligned in the first direction X. The active layer 312 of the twelfth transistor T12 may be located on a side of the twenty-fifth transistor T25 in the first direction X, and the active layer 314 of the fourteenth transistor T14 may be located on a side of the active layer 312 of the twelfth transistor T12 in the first direction X.

In some examples, a shape of the active layer 317 of the seventeenth transistor T17 may be substantially a shape of a strip extending in the first direction X. The active layer 317 of the seventeenth transistor T17 may be located between the active layer 311 of the eleventh transistor T11 and the active layer 325 of the twenty-fifth transistor T25 in the first direction X.

In some examples, a shape of the active layer 319 of the nineteenth transistor T19 may be substantially a rectangular shape. The active layer 319 of the nineteenth transistor T19 may be located on a side of the integral structure of the active layer 321 of the twenty-first transistor T21 and the active layer 322 of the twenty-second transistor T22 in the first direction X.

In some examples, a shape of the active layer 325 of the twenty-fifth transistor T25 may be substantially a shape of a strip extending in the second direction Y. The active layer 325 of the twenty-fifth transistor T25 may be located on a side of the active layer 317 of the seventeenth transistor T17 in the first direction X.

In some examples, a shape of the active layer 327 of the twenty-seventh transistor T27 may be substantially a shape of a strip extending in the second direction Y. The active layer 327 of the twenty-seventh transistor T27 may be located on a side of the integral structure of the active layer 311 of the eleventh transistor T11 and the active layer 316 of the sixteenth transistor T16 in the second direction Y, and may be located on a side of the integral structure of the active layer 31, the active layer 32, the active layer 36, and the active layer 35 in the opposite direction of the first direction X.

(3) A first conductive layer is formed. In some examples, a first insulation thin film and a first conductive thin film are deposited sequentially on the base substrate on which the aforementioned structures are formed, and the first conductive thin film is patterned through a patterning process to form a first insulation layer and a first conductive layer disposed on the first insulation layer.

Figure 6A:
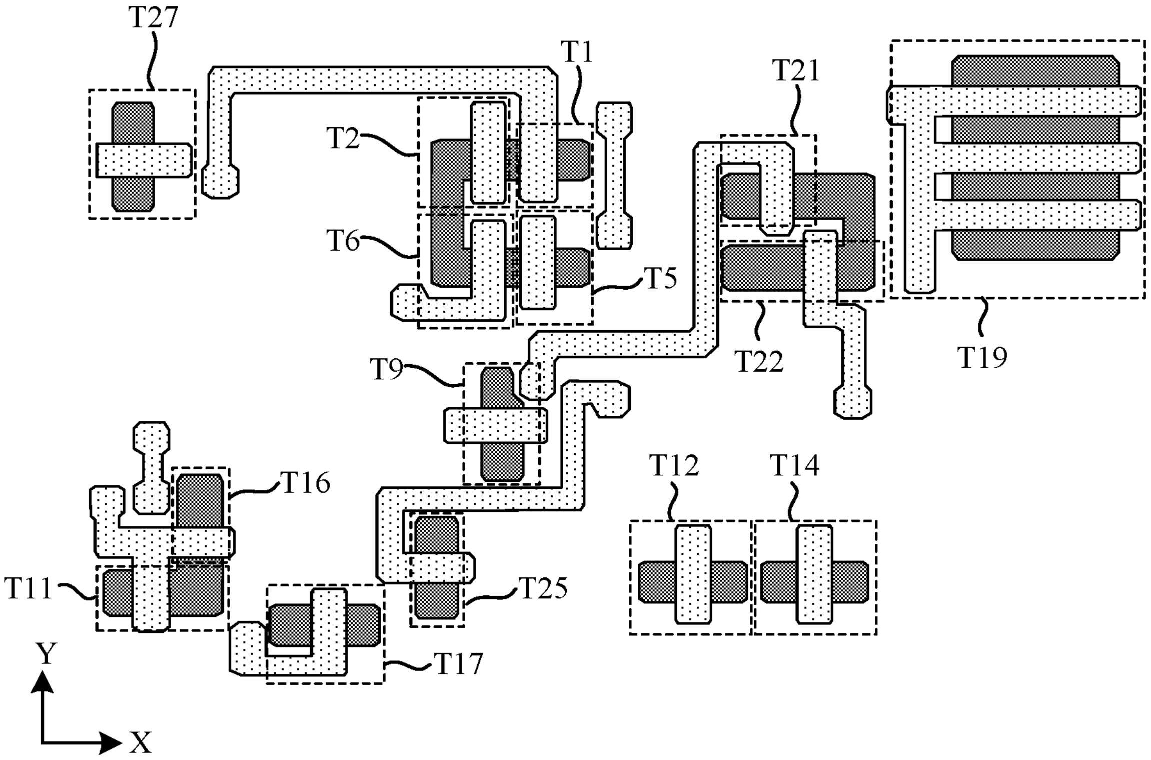
FIG. 6A is a schematic diagram of the display substrate after a first conductive layer is formed in FIG. 4.
Figure 6B:
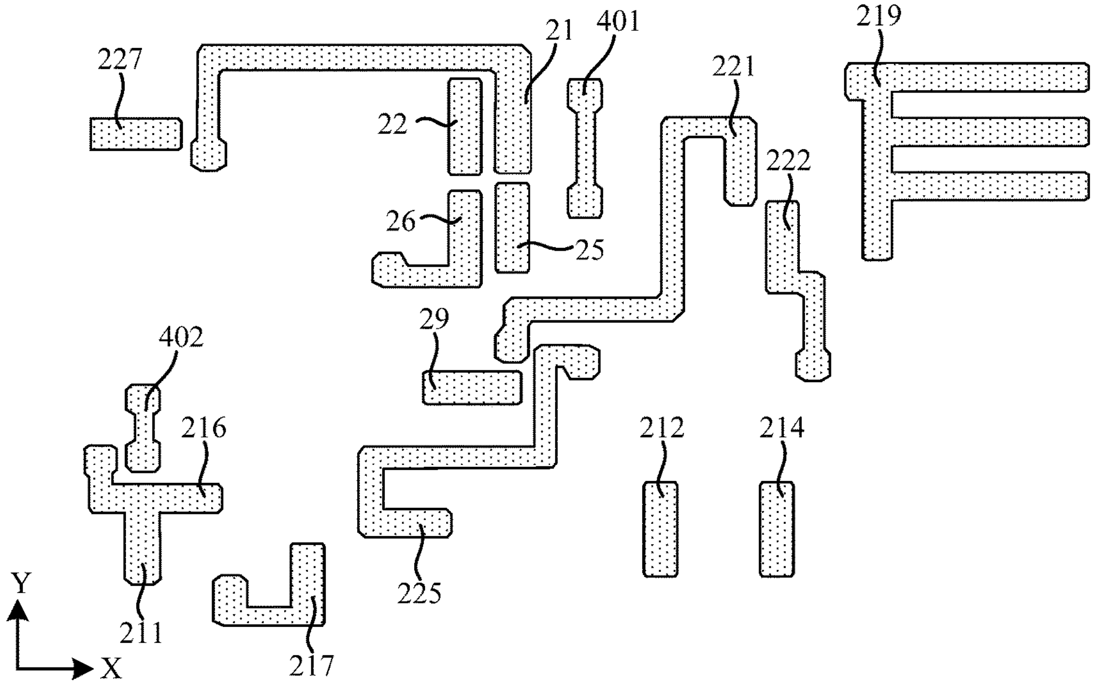
FIG. 6B is a schematic diagram of the first conductive layer in FIG. 6A.

FIG. 6A is a schematic diagram of the display substrate after the first conductive layer is formed in FIG. 4. FIG. 6B is a schematic diagram of the first conductive layer in FIG. 6A. In some examples, as shown in FIGS. 6A and 6B, the first conductive layer of the display substrate may include at least gate electrodes of a plurality of P-type transistors of the shift register circuit (including, for example, a gate electrode 21 of the first transistor T1, a gate electrode 22 of the second transistor T2, a gate electrode 25 of the fifth transistor T5, a gate electrode 26 of the sixth transistor T6, a gate electrode 29 of the ninth transistor T9, a gate electrode 211 of the eleventh transistor T11, a gate electrode 212 of the twelfth transistor T12, a gate electrode 214 of the fourteenth transistor T14, a gate electrode 216 of the sixteenth transistor T14, a gate electrode 217 of the seventeenth transistor T17, a gate electrode 219 of the nineteenth transistor T19, a gate electrode 221 of the twenty-first transistor T21, a gate electrode 222 of the twenty-second transistor T22, a gate electrode 225 of the twenty-fifth transistor T25, and a gate electrode 227 of the twenty-seventh transistor T27), and a plurality of connection electrodes (including, for example, a first connection electrode 401 and a second connection electrode 402).

In some examples, the gate electrode 21 of the first transistor T1 may be substantially n-shaped. A shape of the gate electrode 22 of the second transistor T2 may be substantially a shape of a strip extending in the second direction Y. A shape of the gate electrode 25 of the fifth transistor T5 may be substantially a shape of a strip extending in the second direction Y. The gate electrode 26 of the sixth transistor T6 may be substantially J-shaped. A shape of the gate electrode 29 of the ninth transistor T9 may be substantially a shape of a strip extending in the first direction X. A shape of the gate electrode 211 of the eleventh transistor T11 may be substantially a shape of a strip extending in the second direction Y. Shapes of the gate electrode 212 of the twelfth transistor T12 and the gate electrode 214 of the fourteenth transistor T14 may be substantially shapes of strips extending substantially in the second direction Y. A shape of the gate electrode 216 of the sixteenth transistor T16 may be substantially a shape of a strip extending in the first direction X. The gate electrode 217 of the seventeenth transistor T17 may be substantially J-shaped. The gate electrode 219 of the nineteenth transistor T19 may be substantially comb-toothed. A shape of the gate electrode 221 of the twenty-first transistor T21 may be a combination of L-shaped and n-shaped shapes. A shape of the gate electrode 222 of the twenty-second transistor T22 may be a shape of a polyline extending in the second direction Y. A shape of the gate electrode 225 of the twenty-fifth transistor T25 may be substantially a combination of n-shaped and L-shaped shapes. A shape of the gate electrode 227 of the twenty-seventh transistor T27 may be substantially a shape of a strip extending in the first direction X.

In some examples, the gate electrode 211 of the eleventh transistor T11 and the gate electrode 216 of the sixteenth transistor T16 may be connected with each other to be an integral structure. The nineteenth transistor T19 may be a tri-gate transistor to prevent and reduce occurrence of a leakage current. However, the present embodiment is not limited thereto.

In some examples, a shape of the first connection electrode 401 may be substantially a shape of a dumbbell extending in the first direction X. The first connection electrode 401 may be located on a side of the gate electrode 21 of the second transistor T2 and the gate electrode 25 of the fifth transistor T5 in the first direction X, and may be located on a side of the gate electrode 211 of the twenty-first transistor T21 in the opposite direction of the first direction X.

In some examples, a shape of the second connection electrode 402 may be substantially a shape of a dumbbell extending in the first direction X. The second connection electrode 402 may be located on a side of the gate electrode 216 of the sixteenth transistor T16 in the second direction Y.

(4) A second conductive layer is formed. In some examples, a second insulation thin film and a second conductive thin film are sequentially deposited on the base substrate on which the aforementioned structures are formed, and the second conductive thin film is patterned through a patterning process to form a second insulation layer and a second conductive layer disposed on the second insulation layer.

Figure 7A:
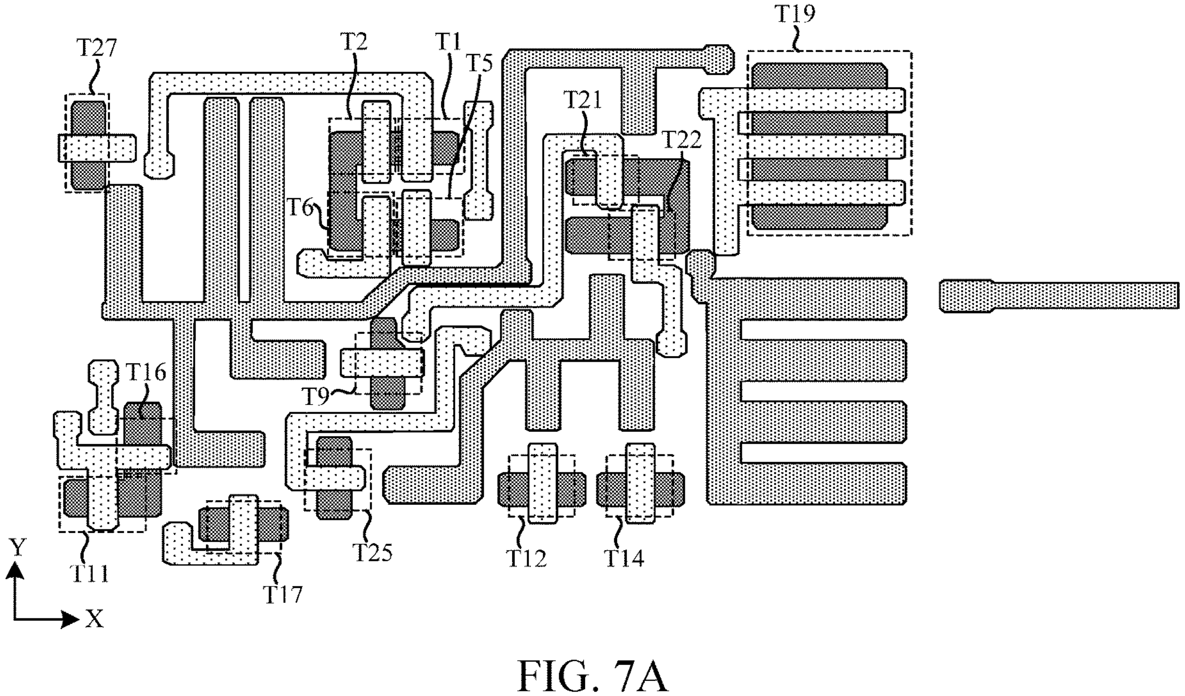
FIG. 7A is a schematic diagram of the display substrate after a second conductive layer is formed in FIG. 4.
Figure 7B:
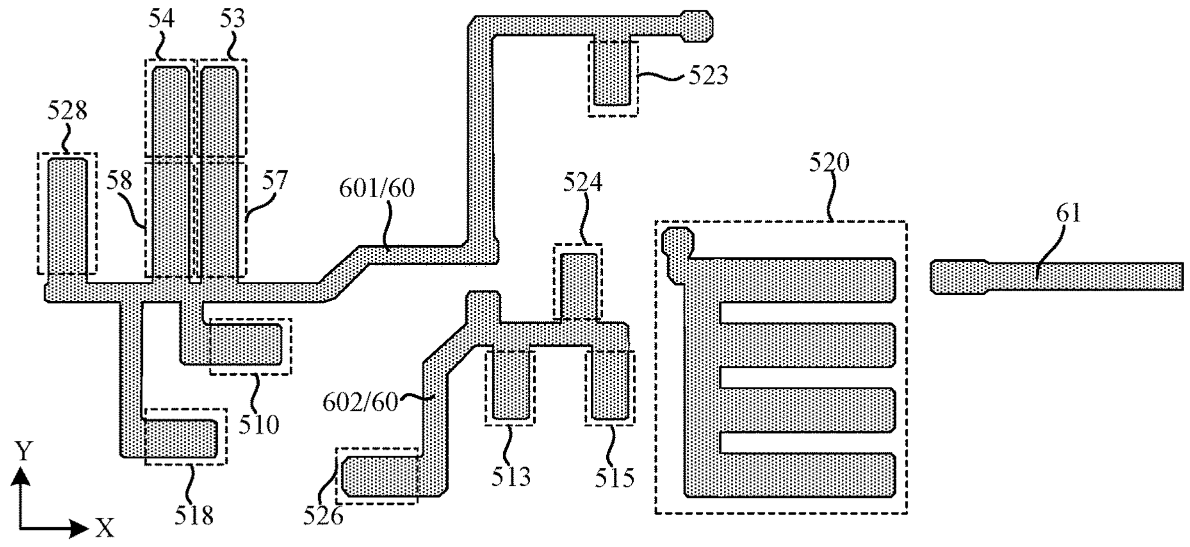
FIG. 7B is a schematic diagram of the second conductive layer in FIG. 7A.

FIG. 7A is a schematic diagram of the display substrate after a second conductive layer is formed in FIG. 4. FIG. 7B is a schematic diagram of the second conductive layer in FIG. 7A. In some examples, as shown in FIGS. 7A and 7B, the second conductive layer of the display substrate may include at least bottom gates of a plurality of N-type transistors of the shift register circuit (including, for example, a bottom gate 53 of the third transistor T3, a bottom gate 54 of the fourth transistor T4, a bottom gate 57 of the seventh transistor T7, a bottom gate 58 of the eighth transistor T8, a bottom gate 510 of the tenth transistor T10, a bottom gate 513 of the thirteenth transistor T13, a bottom gate 515 of the fifteenth transistor T15, a bottom gate 518 of the eighteenth transistor T18, a bottom gate 520 of the twentieth transistor T20, a bottom gate 523 of the twenty-third transistor T23, a bottom gate 524 of the twenty-fourth transistor T24, a bottom gate 526 of the twenty-sixth transistor T26, and a bottom gate 528 of the twenty-eighth transistor T28), a bottom gate connection part 60 (including, for example, a first bottom gate connection part 601 and a second bottom gate connection part 602), and an output electrode 61. In this example, a bottom gate of a transistor may also be called a bottom gate layer, and a top gate of the transistor may also be called a top gate layer.

In some examples, shapes of the bottom gate 53 of the third transistor T3, the bottom gate 54 of the fourth transistor T4, the bottom gate 57 of the seventh transistor T7, the bottom gate 58 of the eighth transistor T8, the bottom gate 523 of the twenty-third transistor T23, the bottom gate 524 of the twenty-fourth transistor T24, the bottom gate 513 of the thirteenth transistor T13, and the bottom gate 515 of the fifteenth transistor T15 may be substantially shapes of strips extending in the second direction Y; shapes of the bottom gate 510 of the tenth transistor T10, the bottom gate 518 of the eighteenth transistor T18, and the bottom gate 526 of the twenty-sixth transistor T26 may be substantially shapes of strips extending in the first direction X. A shape of the bottom gate 520 of the twentieth transistor T20 may be substantially comb-toothed.

In some examples, the bottom gate 53 of the third transistor T3 and the bottom gate 57 of the seventh transistor T7 may be connected with each other to be an integral structure. The bottom gate 54 of the fourth transistor T4 and the bottom gate 58 of the eighth transistor T8 may be connected with each other to be an integral structure. The bottom gate 528 of the twenty-eighth transistor T28, the bottom gate 58 of the eighth transistor T8, the bottom gate 57 of the seventh transistor T7, the bottom gate 518 of the eighteenth transistor T18, the bottom gate 510 of the tenth transistor T10, and the bottom gate 523 of the twenty-third transistor T23 may be connected through the first bottom gate connection part 601.

In some examples, the first bottom gate connection part 601 may include a first line segment extending in the first direction X, a second line segment extending in a third direction, a third line segment extending in the first direction X, a fourth line segment extending in the second direction Y, and a fifth line segment extending in the first direction X, a first extension segment, and a second extension segment. The first line segment, the second line segment, the third line segment, the fourth line segment, and the fifth line segment may be connected in sequence, and the fourth line segment and the fifth line segment may be located on a side of the third line segment in the second direction Y. The first line segment may be connected with the first extension segment and the second extension segment extending in the second direction Y, and the second extension segment may be located on a side of the first extension segment. Among them, the third direction may be parallel to a plane where the first direction X and the second direction Y are located, and intersect with both the first direction X and the second direction Y.

In some examples, the bottom gate 528 of the twenty-eighth transistor T28, the bottom gate 58 of the eighth transistor T8, and the bottom gate 57 of the seventh transistor T7 may be located on a side of the first line segment in the second direction Y and directly connected with the first line segment; the bottom gate 518 of the eighteenth transistor T18 and the bottom gate 510 of the tenth transistor T10 may be located on a side of the first line segment in the opposite direction of the second direction Y, and the bottom gate 518 of the eighteenth transistor T18 may be connected with the first line segment through the first extension segment, and the bottom gate 510 of the tenth transistor T10 may be connected with the first line segment through the second extension segment; the bottom gate 523 of the twenty-third transistor T23 may be located on a side of the fifth line segment in the opposite direction of the second direction Y and directly connected with the fifth line segment.

In some examples, the bottom gate 53 of the third transistor T3, the bottom gate 54 of the fourth transistor T4, the bottom gate 528 of the twenty-eighth transistor T28, the bottom gate 58 of the eighth transistor T8, the bottom gate 57 of the seventh transistor T7, the bottom gate 518 of the eighteenth transistor T18, the bottom gate 510 of the tenth transistor T10, the bottom gate 523 of the twenty-third transistor T23, and the first bottom gate connection part 601 may be connected with each other to be an integral structure. In the present example, a shape of the first bottom gate connection part is not limited. For example, another irregular structure may be adopted for the first bottom gate connection part.

In some examples, the second bottom gate connection part 602 may include: a sixth line segment extending in the second direction Y, a seventh line segment extending in the third direction, and an eighth line segment extending in the first direction X, wherein the sixth line segment, the seventh line segment, and the eighth line segment are connected sequentially.

In some examples, the bottom gate 526 of the twenty-sixth transistor T26 may be located on a side of the sixth line segment in the opposite direction of the first direction X and connected with the sixth line segment. The bottom gate 524 of the twenty-fourth transistor T24 may be located on a side of the eighth line segment in the second direction Y and connected with the eighth line segment. The bottom gate 513 of the thirteenth transistor T13 and the bottom gate 515 of the fifteenth transistor T15 may be located on a side of the eighth line segment in the opposite direction of the second direction Y and connected with the eighth line segment.

In some examples, the bottom gate 526 of the twenty-sixth transistor T26, the bottom gate 513 of the thirteenth transistor T13, the bottom gate 515 of the fifteenth transistor T15, the bottom gate 524 of the twenty-fourth transistor T24, and the second bottom gate connection part 602 may be connected with each other to be an integral structure. In the present example, a shape of the second bottom gate connection part is not limited. For example, another irregular structure may be adopted for the second bottom gate connection part.

In this example, connections of bottom gates of a plurality of N-type transistors may be achieved by disposing bottom gate connection parts, thus it is beneficial to reduce a layout difficulty of the shift register circuit.

In some examples, a shape of the output connection electrode 61 may be substantially a shape of a strip extending in the first direction X. The output electrode 61 may be located on a side of the bottom gate 520 of the twentieth transistor T20 in the first direction X. The output electrode 61 may serve as a drive output terminal of the shift register circuit to achieve transmission of a drive signal to a pixel circuit of the display region.

In some examples, an orthographic projection of the second conductive layer on the base substrate and orthographic projections of the first semiconductor layer and the first conductive layer on the base substrate may not be overlapped to reduce an impact on the P-type transistors.

(5) A second semiconductor layer is formed. In some examples, a third insulation thin film and a second semiconductor thin film are sequentially deposited on the base substrate on which the aforementioned patterns are formed, and the second semiconductor thin film is patterned through a patterning process to form a third insulation layer and a second semiconductor layer disposed on the third insulation layer. In some examples, a material of the second semiconductor layer may include Indium Gallium Zinc Oxide (IGZO).

Figure 8A:
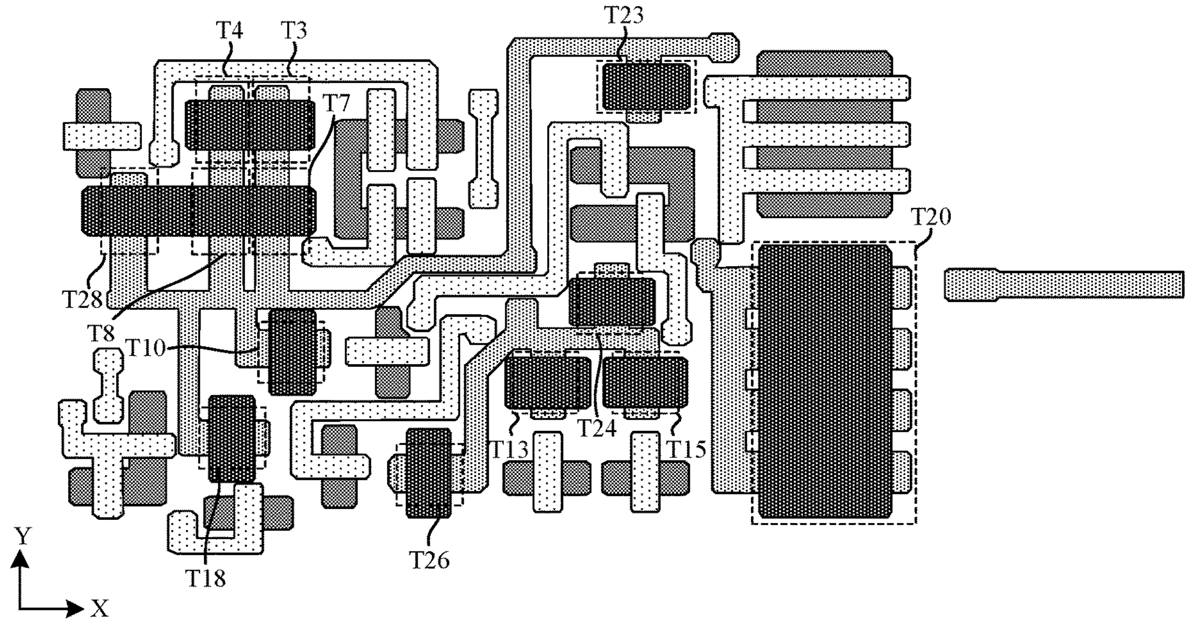
FIG. 8A is a schematic diagram of the display substrate after a second semiconductor layer is formed in FIG. 4.
Figure 8B:
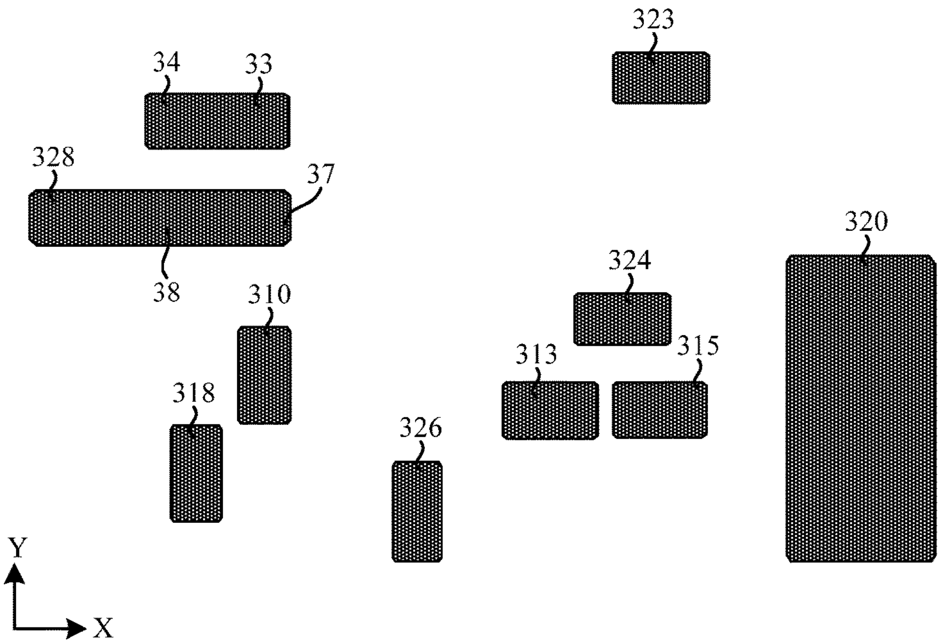
FIG. 8B is a schematic diagram of the second semiconductor layer in FIG. 8A.

FIG. 8A is a schematic diagram of a display substrate after a second semiconductor layer is formed in FIG. 4. FIG. 8B is a schematic diagram of the second semiconductor layer in FIG. 8A. In some examples, as shown in FIGS. 8A and 8B, the second semiconductor layer of the display substrate may include at least active layers of a plurality of N-type transistors of the shift register circuit (including, for example, an active layer 33 of the third transistor T3, an active layer 34 of the fourth transistor T4, an active layer 37 of the seventh transistor T7, an active layer 38 of the eighth transistor T8, an active layer 310 of the tenth transistor T10, an active layer 313 of the thirteenth transistor T13, an active layer 315 of the fifteenth transistor T15, an active layer 318 of the eighteenth transistor T18, an active layer 320 of the twentieth transistor T20, an active layer 323 of the twenty-third transistor T23, an active layer 324 of the twenty-fourth transistor T24, an active layer 326 of the twenty-sixth transistor T26, and an active layer 328 of the twenty-eighth transistor T28).

In some examples, the active layer 33 of the third transistor T3 and the active layer 34 of the fourth transistor T4 may be connected with each other to be an integral structure, and the integral structure may be in a shape of a strip extending in the first direction X, and the integral structure may be located between the active layer 327 of the twenty-seventh transistor T27 and the active layer 32 of the second transistor T2 in the first direction X. Among them, a first region of the active layer 33 of the third transistor T3 may simultaneously serve as a second region of the active layer 34 of the fourth transistor T4.

In some examples, the active layer 37 of the seventh transistor T7, the active layer 38 of the eighth transistor T8, and the active layer 328 of the twenty-eighth transistor T28 may be sequentially connected with be an integral structure, and the integral structure may be in a shape of a strip extending in the first direction X, and the integral structure may be located on a side of the active layer 36 of the sixth transistor T6 in the opposite direction of the first direction X and aligned with the active layer 36 of the sixth transistor T6 in the first direction X. Among them, a first region of the active layer 37 of the seventh transistor T7 may simultaneously serve as a second region of the active layer 38 of the eighth transistor T8, and a first region of the active layer 38 of the eighth transistor T8 may simultaneously serve as a first region of the active layer 328 of the twenty-eighth transistor T28. The active layer 328 of the twenty-eighth transistor T28 may be located on a side of the active layer 327 of the twenty-seventh transistor T27 in the opposite direction of the second direction Y.

In some examples, shapes of the active layer 310 of the tenth transistor T10, the active layer 318 of the eighteenth transistor T18, and the active layer 326 of the twenty-sixth transistor T26 may be substantially shapes of strips extending in the second direction Y. The active layer 310 of the seventh transistor T10 may be located on a side of the active layer 39 of the ninth transistor T9 in the opposite direction of the first direction X and aligned with the active layer 39 in the first direction X. The active layer 318 of the eighteenth transistor T18 may be located on a side of the active layer 317 of the seventeenth transistor T17 in the second direction Y. The active layer 318 of the eighteenth transistor T18 and the active layer 310 of the tenth transistor T10 may be arranged in a misaligned manner in the second direction Y. The active layer 326 of the twenty-sixth transistor T26 may be located on a side of the active layer 325 of the twenty-fifth transistor T25 in the first direction X.

In some examples, the active layer 313 of the thirteenth transistor T13, the active layer 315 of the fifteenth transistor T15, the active layer 324 of the twenty-fourth transistor T24, and the active layer 323 of the twenty-third transistor T23 may be substantially in shapes of strips extending in the first direction X. The active layer 313 of the thirteenth transistor T13 may be located on a side of the active layer 312 of the twelfth transistor T12 in the second direction Y. The active layer 315 of the fifteenth transistor T15 may be located on a side of the active layer 314 of the fourteenth transistor T14 in the second direction Y. The active layer 313 of the thirteenth transistor T13 and the active layer 315 of the fifteenth transistor T15 are adjacent and aligned in the first direction X. The active layer 324 of the twenty-fourth transistor T24 may be located between the active layer 322 of the twenty-second transistor T22 and the active layer 315 of the fifteenth transistor T15 in the second direction Y. The active layer 323 of the twenty-third transistor T23 may be located on a side of the active layer 321 of the twenty-first transistor T21 in the second direction Y.

In some examples, a shape of the active layer 320 of the twentieth transistor T20 may be substantially a rectangular shape. The active layer 320 of the twentieth transistor T20 may be located on a side of the active layer 319 of the nineteenth transistor T19 in the opposite direction of the second direction Y and aligned with the active layer 319 in the second direction Y.

(6) A third conductive layer is formed. In some examples, a fourth insulation thin film and a third conductive thin film are sequentially deposited on the base substrate on which the aforementioned patterns are formed, and the third conductive thin film is patterned through a patterning process to form a fourth insulation layer and a third conductive layer disposed on the fourth insulation layer.

Figure 9A:
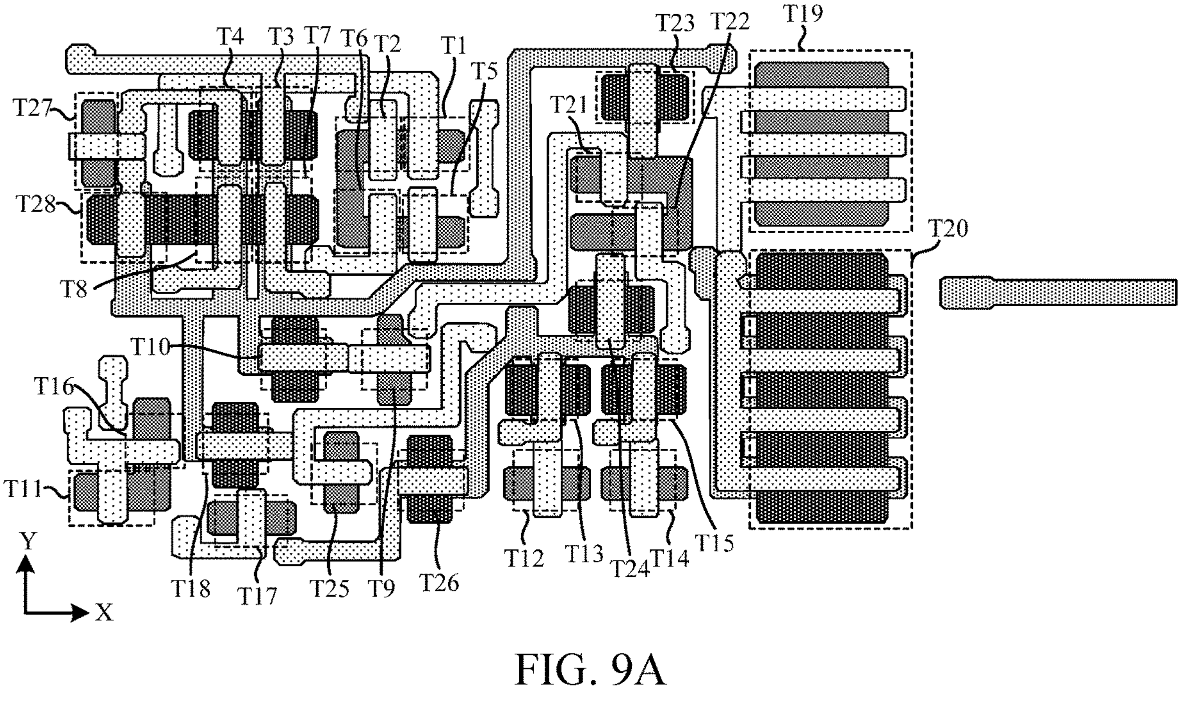
FIG. 9A is a schematic diagram of the display substrate after a third conductive layer is formed in FIG. 4.
Figure 9B:
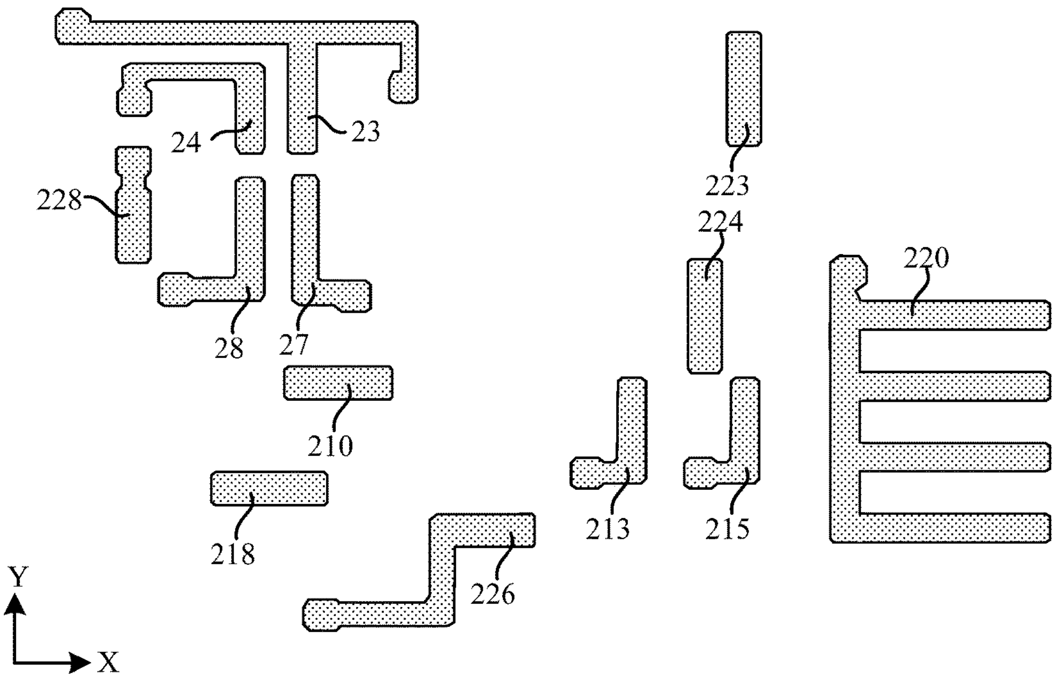
FIG. 9B is a schematic diagram of the third conductive layer in FIG. 9A.

FIG. 9A is a schematic diagram of the display substrate after a third conductive layer is formed in FIG. 4. FIG. 9B is a schematic diagram of the third conductive layer in FIG. 9A. In some examples, as shown in FIGS. 9A and 9B, the third conductive layer of the display substrate may include at least top gates of a plurality of N-type transistors of the shift register circuit (including, for example, a top gate 23 of the third transistor T3, a top gate 24 of the fourth transistor T4, a top gate 27 of the seventh transistor T7, a top gate 28 of the eighth transistor T8, a top gate 210 of the tenth transistor T10, a top gate 213 of the thirteenth transistor T13, a top gate 215 of the fifteenth transistor T15, a top gate 218 of the eighteenth transistor T18, a top gate 220 of the twentieth transistor T20, a top gate 223 of the twenty-third transistor T23, a top gate 224 of the twenty-fourth transistor T24, a top gate 226 of the twenty-sixth transistor T26, and a top gate 228 of the twenty-eighth transistor T28).

In some examples, the top gate 23 of the third transistor T3 may be substantially F-shaped. The top gate 24 of the fourth transistor T4 may be substantially L-shaped. The top gate 27 of the seventh transistor T7 and the top gate 28 of the eighth transistor T8 may be substantially L-shaped. A shape of the top gate 210 of the tenth transistor T10 may be a shape of a strip extending in the first direction X. The top gate 213 of the thirteenth transistor T13 and the top gate 215 of the fifteenth transistor T15 may be substantially L-shaped. A shape of the top gate 218 of the eighteenth transistor T18 may be substantially a shape of a strip extending in the first direction X. Shapes of the top gate 223 of the twenty-third transistor T23 and the top gate 224 of the twenty-fourth transistor T24 may be substantially shapes of strips extending in the second direction Y. A shape of the top gate 226 of the twenty-sixth transistor T26 may be substantially a shape of a polyline extending in the first direction X. A shape of the top gate 228 of the twenty-eighth transistor T28 may be substantially a shape of a strip extending in the second direction Y. A shape of the top gate 220 of the twentieth transistor T20 may be substantially comb-toothed.

In some examples, an orthographic projection of an overlapping region of a top gate and an active layer of an N-type transistors on the base substrate may be located within a range of an orthographic projection of an overlapping region of a bottom gate and the active layer of the N-type transistor on the base substrate. In this example, characteristics of the N-type transistors may be adjusted by disposing bottom gates of the N-type transistors, so as to achieve better transistor performance.

(7) A fifth insulation layer is formed. In some examples, a fifth insulation thin film is deposited on the base substrate on which the aforementioned patterns are formed, and the fifth insulation thin film is patterned through a patterning process to form a fifth insulation layer. In some examples, the fifth insulation thin film may be patterned through two patterning processes, wherein a first set of vias may be formed in the fifth insulation layer through a first patterning process, and a second set of vias may be formed in the fifth insulation layer through a second patterning process. For example, the first set of vias may expose parts of surfaces of the first semiconductor layer, the first conductive layer, and the second conductive layer, and the second set of vias may expose parts of surfaces of the second semiconductor layer and the third conductive layer.

Figure 10A:
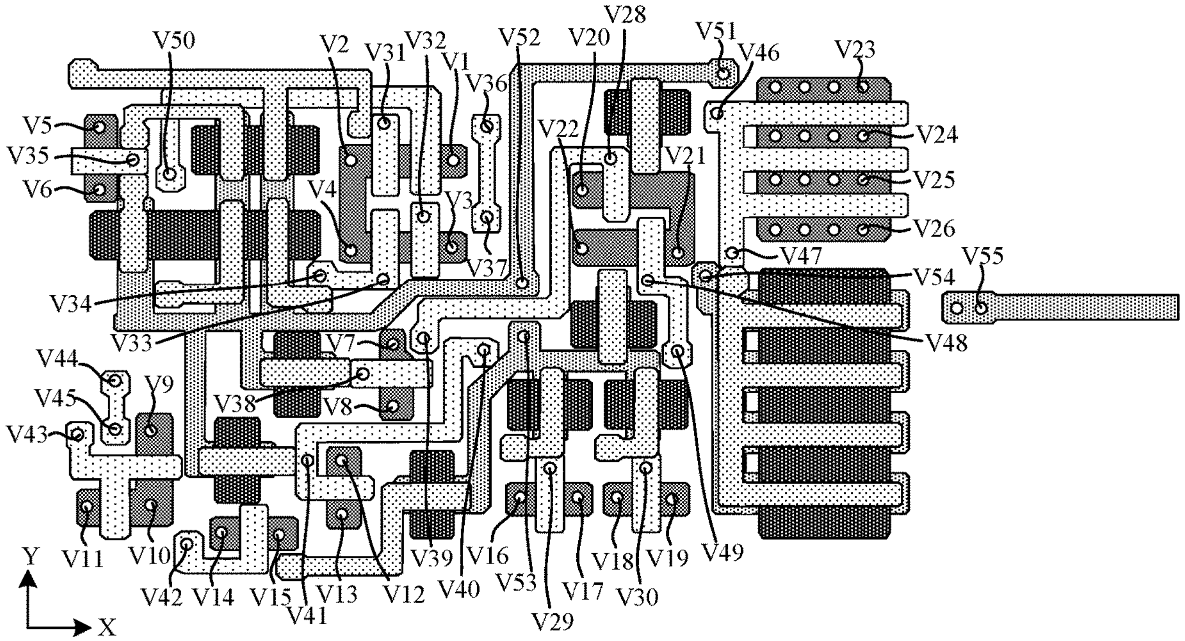
FIGS. 10A and 10B are schematic diagrams of the display substrate after a fifth insulation layer is formed in FIG. 4.
Figure 10B:
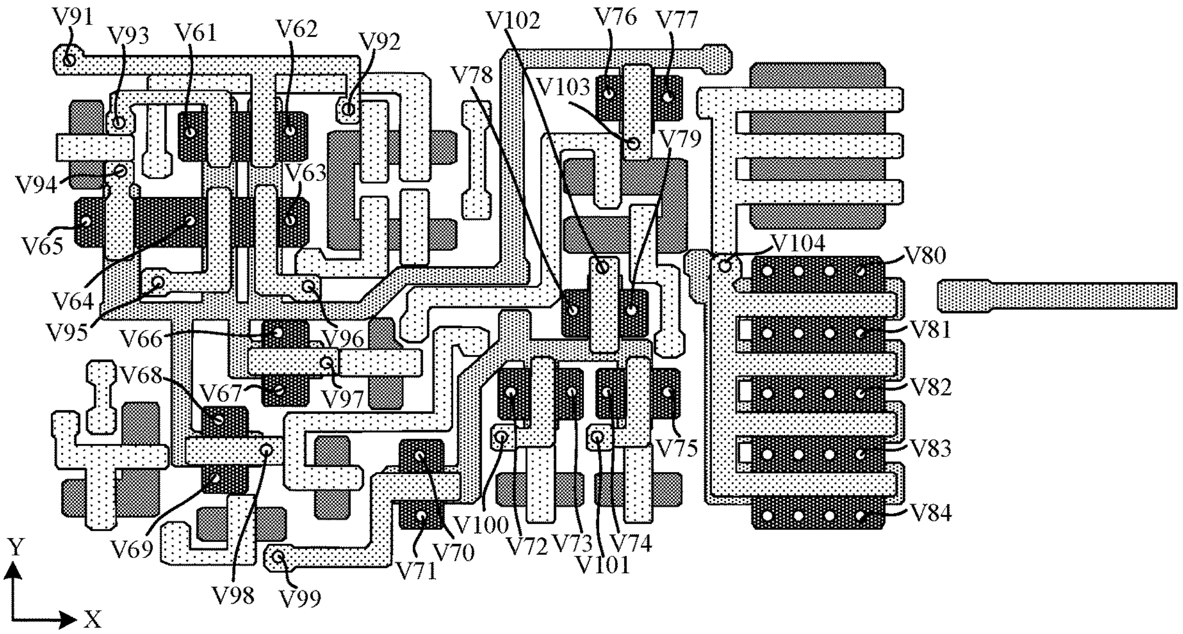

FIGS. 10A and 10B are schematic diagrams of a display substrate after a fifth insulation layer is formed in FIG. 4. A first set of vias of the fifth insulation layer are schematically shown in FIG. 10A, and a second set of vias of the fifth insulation layer are schematically shown in FIG. 10B.

In some examples, as shown in FIG. 10A, the first set of vias of the fifth insulation layer of the display substrate may include: a first via V1 to a twenty-sixth via V26, a twenty-eighth via V28 to a fiftieth via V50, and a fifty-first via V51 to a fifty-fifth via V55. The fifth insulation layer, the fourth insulation layer, the third insulation layer, the second insulation layer, and the first insulation layer within the first via V1 to the twenty-sixth via V26 may be removed, exposing part of a surface of the first semiconductor layer; the fifth insulation layer, the fourth insulation layer, the third insulation layer, and the second insulation layer within the twenty-eighth via V28 to the fiftieth via V50 may be removed, exposing part of a surface of the first conductive layer; the fifth insulation layer, the fourth insulation layer, and the third insulation layer within the fifty-first via V51 to the fifty-fifth via V55 may be removed, exposing part of a surface of the second conductive layer.

In some examples, as shown in FIG. 10B, the second set of vias of the fifth insulation layer of the display substrate may include a sixty-first via V61 to an eighty-fourth via V84, and a ninety-first via V91 to a one-hundred-and-fourth via V104. The fifth insulation layer and the fourth insulation layer within the sixty-first via V61 to the eighty-fourth via V84 may be removed, exposing part of a surface of the second semiconductor layer; the fifth insulation layer within the ninety-first via V91 to the one-hundred-and-fourth via V104 may be removed, exposing part of a surface of the third conductive layer.

(8) A fourth conductive layer is formed. In some examples, a fourth conductive thin film is deposited on the base substrate on which the aforementioned patterns are formed, and the fourth conductive thin film is patterned through a patterning process to form a fourth conductive layer on the fifth insulation layer.

Figure 11:
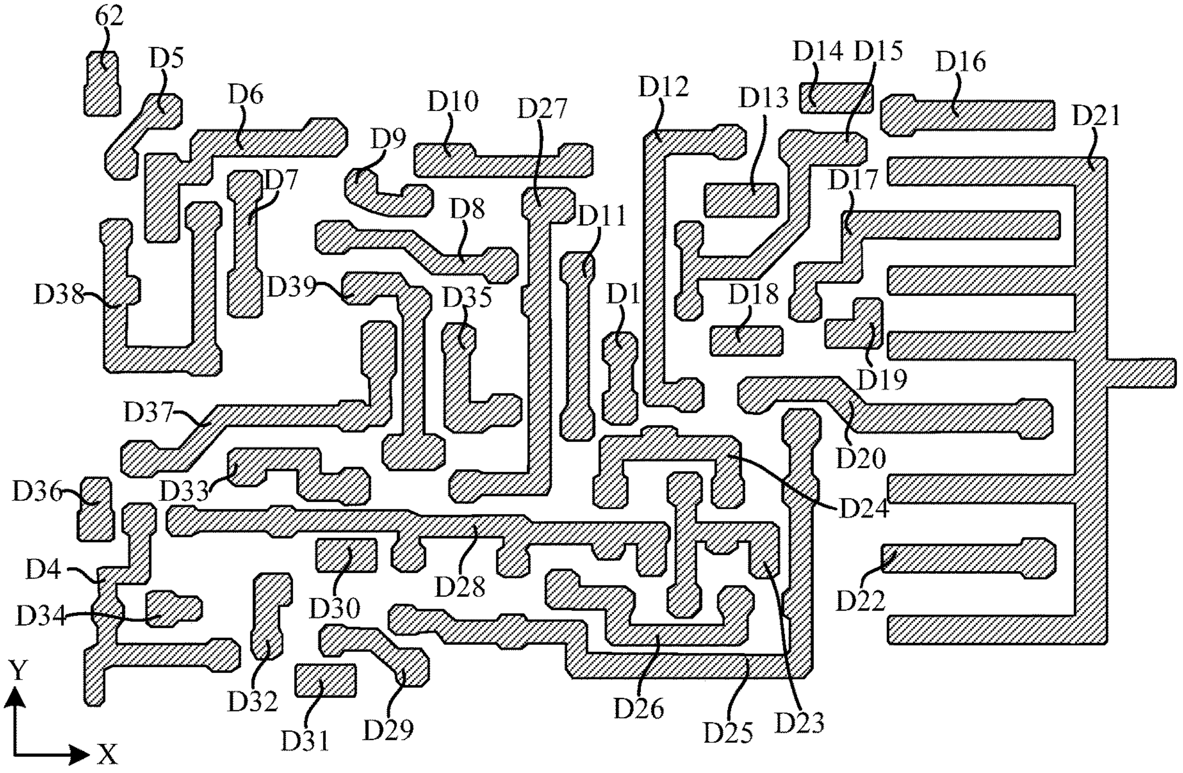
FIG. 11 is a schematic diagram of a fourth conductive layer in FIG. 4.

FIG. 11 is a schematic diagram of the fourth conductive layer in FIG. 4. In some examples, as shown in FIGS. 4 and 11, the fourth conductive layer of the display substrate may include at least an input electrode 62, and a plurality of conductive connection parts (including, for example, a first conductive connection part D1, and a fourth conductive connection part D4 to a thirty-ninth conductive connection part D39).

In some examples, a shape of the input electrode 62 may be substantially a rectangular shape. The input electrode 62 may be located on a side of the twenty-seventh transistor T27 in the second direction Y. The input electrode 62 may be connected with one end of the top gate 23 of the third transistor T3 through the ninety-first via V91. The input electrode 62 may serve as a cascaded input terminal of a present stage shift register circuit and be connected with a cascaded output terminal of a previous stage shift register circuit.

In some examples, a shape of the first conductive connection part D1 may be substantially a shape of a dumbbell extending in the second direction Y. The first conductive connection part D1 may be located between the cascaded signal generation circuit 101 and the output control circuit

103. One end of the first conductive connection part D1 may be connected with the first bottom gate connection part 601 through the fifty-second via V52 (e.g., connected with a connection position of the third line segment and the fourth line segment of the first bottom gate connection part 601), and the other end may be connected with the second bottom gate connection part 602 through the fifty-third via V53 (e.g., connected with a connection position of the seventh line segment and the eighth line segment of the second bottom gate connection part 602).

In some examples, a shape of the fourth conductive connection part D4 may be approximately a shape of a combination of a T-shaped shape and an L-shaped shape. The fourth conductive connection part D4 may be adjacent to the eleventh transistor T11 and the sixteenth transistor T16 in the first direction X. The fourth conductive connection part D4 of the present stage shift register circuit may serve as a cascaded output terminal of the present stage shift register circuit and is connected with an input electrode 62 of a next stage shift register circuit. For example, the fourth conductive connection part D4 of the present stage shift register circuit and the input electrode 62 of the next stage shift register circuit may be connected with each other to be an integral structure. The fourth conductive connection part D4 may be connected with the second connection electrode 402 through the forty-fifth via V45, may also be connected with the active layer 311 of the eleventh transistor T11 through the eleventh via V11, and may also be connected with the gate electrode 217 of the seventeenth transistor T17 through the forty-second via V42.

In some examples, a shape of the fifth conductive connection part D5 may be substantially a shape of a dumbbell extending in the third direction. One end of the fifth conductive connection part D5 may be connected with a first region of the active layer 327 of the twenty-seventh transistor T27 through the fifth via V5. The other end of the fifth conductive connection part D5 may be connected with a first transmission line 711 formed subsequently in the fifth conductive layer.

In some examples, a shape of the sixth conductive connection part D6 may be substantially an L-shaped shape. The sixth conductive connection part D6 may be located on a side of the fifth conductive connection part D5 in the first direction X. One end of the sixth conductive connection part D6 may be connected with the top gate 24 of the fourth transistor T4 through the ninety-third via V93, also connected with the top gate 228 of the twenty-eighth transistor T28 through the ninety-fourth via V94, and also connected with the gate electrode 227 of the twenty-seventh transistor T27 through the thirty-fifth via V35. The other end of the sixth conductive connection part D6 may be connected with a second clock signal line CBL formed subsequently in the fifth conductive layer.

In some examples, a shape of the seventh conductive connection part D7 may be substantially a shape of a dumbbell extending in the second direction Y. The seventh conductive connection part D7 may be located on a side of the sixth conductive connection part D6 in the opposite direction of the second direction Y. One end of the seventh conductive connection part D7 may be connected with a first region of the active layer 34 of the fourth transistor T4 through the sixty-first via V61, and the other end may be connected with a first region of the active layer 38 of the eighth transistor T8 through the sixty-fourth via V64. The seventh conductive connection part D7 may be connected with a fifth transmission line 715 formed subsequently in the fifth conductive layer.

In some examples, a shape of an eighth conductive connection part D8 may be substantially a shape of a polyline extending in the first direction X. The eighth conductive connection part D8 may be located on a side of the seventh conductive connection part D7 in the first direction X. One end of the eighth conductive connection part D8 may be connected with the gate electrode 25 of the fifth transistor T5 through the thirty-second via V32. The other end of the eighth conductive connection part D8 may be connected with the second clock signal line CBL formed subsequently in the fifth conductive layer.

In some examples, a shape of the ninth conductive connection part D9 may be substantially a shape of a dumbbell extending in the first direction X. The ninth conductive connection part D9 may be located on a side of the eighth conductive connection part D8 in the second direction Y. The ninth conductive connection part D9 may be connected with a second region of the active layer 32 of the second transistor T2 through the second via V2, and may also be connected with a second region of the active layer 33 of the third transistor T3 through the sixty-second via V62.

In some examples, a shape of the tenth conductive connection part D10 may be substantially a shape of a strip extending in the first direction X. The tenth conductive connection part D10 may be located on a side of the ninth conductive connection part D9 in the second direction Y. One end of the tenth conductive connection part D10 may be connected with the gate electrode 22 of the second transistor T2 through the thirty-first via V31, and also connected with the top gate 23 of the third transistor T3 through the ninety-second via V92. The other end of the tenth conductive connection part D10 may be connected with one end of the first connection electrode 401 through a thirty-sixth via V36. The other end of the first connection electrode 401 may be connected with one end of the eleventh conductive connection part D11 through the thirty-seventh via V37.

In some examples, a shape of the eleventh conductive connection part D11 may be a shape of a dumbbell extending in the second direction Y. The eleventh conductive connection part D11 may be located on a side of the first conductive connection part D1 in the opposite direction of the first direction X. The other end of the eleventh conductive connection part D11 may be connected with the gate electrode 225 of the twenty-fifth transistor T25 through the fortieth via V40.

In some examples, a shape of the twelfth conductive connection part D12 may be substantially an L-shaped shape. The twelfth conductive connection part D12 may be located on a side of the first conductive connection part D1 in the first direction X. One end of the twelfth conductive connection part D12 may be connected with a first region of the active layer 323 of the twenty-third transistor T23 through the seventy-sixth via V76, and the other end may be connected with a second region of the active layer 324 of the twenty-fourth transistor T24 through the seventy-eighth via V78.

In some examples, a shape of the thirteenth conductive connection part D13 may be substantially a shape of a strip extending in the first direction X. The thirteenth conductive connection part D13 may be located on a side of the twelfth conductive connection part D12 in the first direction X. One end of the thirteenth conductive connection part D13 may be connected with the gate electrode 221 of the twenty-first transistor T21 through the twenty-eighth via V28, and the other end may be connected with the top gate 223 of the twenty-third transistor T23 through the one-hundred-third via V103.

In some examples, a shape of a fourteenth conductive connection part D14 may be substantially a shape of a strip extending in the first direction X. The fourteenth conductive connection part D14 may be located on a side of the twelfth conductive connection part D12 in the first direction X. The fourteenth conductive connection part D14 may be connected with the first bottom gate connection part 601 (e.g., the fifth line segment of the first bottom gate connection part 601) through the fifty-first via V51. The fourteenth conductive connection part D14 may be connected with a seventh transmission line 717 formed subsequently in the fifth conductive layer.

In some examples, a shape of the fifteenth conductive connection part D15 may be a special-shaped structure, for example, may be a connection structure of a T-shaped shape and an L-shaped shape. The fifteenth conductive connection part D15 may be located on a side of the fourteenth conductive connection part D14 in the opposite direction of the second direction Y. One end of the fifteenth conductive connection part D15 may be connected with a second region of the active layer 321 of the twenty-first transistor T21 through the twentieth via V20, and may also be connected with a second region of the active layer 322 of the twenty-second transistor T22 through the twenty-second via V22. The other end may be connected with a second region of the active layer 323 of the twenty-third transistor T23 through the seventy-seventh via V77, and may also be connected with the gate electrode 219 of the nineteenth transistor T19 through the forty-sixth via V46.

In some examples, a shape of the sixteenth conductive connection part D16 may be substantially a shape of a strip extending in the first direction X. The sixteenth conductive connection part D16 may be located on a side of the fourteenth conductive connection part D14 in the first direction X. The sixteenth conductive connection part D16 may be connected with a first region of the active layer 319 of the nineteenth transistor T19 through a plurality of (e.g., four) twenty-third vias V23 arranged laterally.

In some examples, a shape of the seventeenth conductive connection part D17 may be substantially a stepped shape. The seventeenth conductive connection part D17 may be located on a side of the fifteenth conductive connection part D15 in the first direction X. One end of the seventeenth conductive connection part D17 may be connected with a first region of the active layer 322 of the twenty-second transistor T22 through the twenty-first via V21, and the other end may be connected with another first region of the active layer 319 of the nineteenth transistor T19 through a plurality of (e.g., four) twenty-fifth vias V25 arranged laterally.

In some examples, a shape of the eighteenth conductive connection part D18 may be substantially a shape of a strip extending in the first direction X. The eighteenth conductive connection part D18 may be located on a side of the fifteenth conductive connection part D15 in the opposite direction of the second direction Y. One end of the eighteenth conductive connection part D18 may be connected with the gate electrode 222 of the twenty-second transistor T22 through the forty-eighth via V48, and the other end may be connected with the top gate 224 of the twenty-fourth transistor T24 through the one-hundred-second via V102.

In some examples, a shape of the nineteenth conductive connection part D19 may be substantially an L-shaped shape. The nineteenth conductive connection part D19 may be located on a side of the eighteenth conductive connection part D18 in the first direction X. The nineteenth conductive connection part D19 may be connected with the bottom gate 520 of the twentieth transistor T20 through the fifty-fourth via V54, may also be connected with the top gate 220 of the twentieth transistor T20 through the one-hundred-fourth via V104, and may also be connected with the gate electrode 219 of the nineteenth transistor T19 through the forty-seventh via V47. The top gate 220 of the twentieth transistor T20 and the gate electrode 219 of the nineteenth transistor T19 may be electrically connected through the nineteenth conductive connection part D19, and the gate electrode 219 of the nineteenth transistor T19, a second electrode of the twenty-first transistor T21, a second electrode of the twenty-second transistor T22, and a second electrode of the twenty-third transistor T23 may be electrically connected through the fifteenth conductive connection part D15. Therefore, the fifteenth conductive connection part D15, the gate electrode 219 of the nineteenth transistor T19, and the nineteenth conductive connection part D19 may be connected as a sixth node N6.

In some examples, a shape of the twentieth conductive connection part D20 may be substantially a shape of a polyline extending in the first direction X. The twentieth conductive connection part D20 may be located on a side of the nineteenth conductive connection part D19 in the opposite direction of the second direction Y. One end of the twentieth conductive connection part D20 may be connected with a first region of the active layer 324 of the twenty-fourth transistor T24 through the seventy-ninth via V79, and the other end may be connected with a first first region of the active layer 320 of the twentieth transistor T20 through a plurality of (e.g., four) eighty-first vias V81 arranged laterally. The twentieth conductive connection part D20 may be connected with an eighth transmission line 718 formed subsequently in the fifth conductive layer.

In some examples, a shape of the twenty-first conductive connection part D21 may be substantially a comb-toothed shape. The twenty-first conductive connection part D21 may be located on a side of the twentieth conductive connection part D20 in the first direction X. The twenty-first conductive connection part D21 may be connected with a second region of the active layer 319 of the nineteenth transistor T19 through a plurality of (e.g., four) twenty-fourth vias V24 arranged laterally, may also be connected with another second region of the active layer 319 of the nineteenth transistor T19 through a plurality of (e.g., four) twenty-sixth vias V26 arranged laterally, may also be connected with a first second region of the active layer 320 of the twentieth transistor T20 through a plurality of (e.g., four) eightieth vias V80 arranged laterally, may also be connected with a second second region of the active layer 320 of the twentieth transistor T20 through a plurality of (e.g., four) eighty-second vias V82 arranged laterally, may also be connected with a third second region of the active layer 320 of the twentieth transistor T20 through a plurality of (e.g., four) eighty-fourth vias V84 arranged laterally, and may also be connected with the output electrode 61 through two fifty-fifth vias V55 arranged laterally.

In some examples, a shape of the twenty-second conductive connection part D22 may be substantially a shape of a strip extending in the first direction X. The twenty-second conductive connection part D22 may be located on a side of the twenty-first conductive connection part D21 in the opposite direction of the first direction X. The twenty-second conductive connection part D22 may be connected with a second first region of the active layer 320 of the twentieth transistor T20 through four eighty-third vias V83 arranged laterally. The twenty-second conductive connection part D22 may be connected with an eighth transmission line 718 formed subsequently in the fifth conductive layer.

In some examples, a shape of the twenty-third conductive connection part D23 may be substantially a T-shaped shape. The twenty-third conductive connection part D23 may be located on a side of the twenty-second conductive connection part D22 in the opposite direction of the first direction X. The twenty-third conductive connection part D23 may be connected with a second region of the active layer 313 of the thirteenth transistor T13 through the seventy-third via V73, may also be connected with a second region of the active layer 312 of the twelfth transistor T12 through the seventeenth via V17, may also be connected with the gate electrode 214 of the fourteenth transistor T14 through the thirtieth via V30, and may also be connected with the top gate 215 of the fifteenth transistor T15 through the one-hundred-first via V101. A second electrode of the twelfth transistor T12, a second electrode of the thirteenth transistor T13, the gate electrode of the fourteenth transistor T14, and the gate electrode of the fifteenth transistor T15 may be electrically connected through the twenty-third conductive connection part D23, and the twenty-third conductive connection part D23 may serve as a fourth node N4.

In some examples, a shape of the twenty-fourth conductive connection part D24 may be substantially an n-shaped shape. The twenty-fourth conductive connection part D24 may be located on a side of the first conductive connection part D1 in the opposite direction of the second direction Y. The twenty-fourth conductive connection part D24 may be connected with a first region of the active layer 313 of the thirteenth transistor T13 through the seventy-second via V72, and may also be connected with a first region of the active layer 315 of the fifteenth transistor T15 through the seventy-fourth via V74. The twenty-fourth conductive connection part D24 may be connected with a sixth transmission line 716 formed subsequently in the fifth conductive layer.

In some examples, a shape of the twenty-fifth conductive connection part D25 may be substantially an L-shaped shape. The twenty-fifth conductive connection part D25 may be located on a side of the twenty-first conductive connection part D21 in the opposite direction of the first direction X. The twenty-fifth conductive connection part D25 may be connected with the gate electrode 222 of the twenty-second transistor T22 through the forty-ninth via V49, may also be connected with a second region of the active layer 314 of the fourteenth transistor T14 through the nineteenth via V19, may also be connected with a second region of the active layer 325 of the twenty-fifth transistor T25 through the thirteenth via V13, may also be connected with a second region of the active layer 315 of the fifteenth transistor T15 through the seventy-fifth via V75, and may also be connected with a second region of the active layer 326 of the twenty-sixth transistor T26 through the seventy-first via V71. The gate electrode of the twenty-second transistor T22, the second electrode of the fourteenth transistor T14, the second electrode of the fifteenth transistor T15, the second electrode of the twenty-fifth transistor T25, and the second electrode of the twenty-sixth transistor T26 may be connected through the twenty-fifth conductive connection part D25, and the gate electrode of the twenty-fourth transistor T24 and the gate electrode of the twenty-second transistor T22 may be connected through the eighteenth conductive connection part D18. Therefore, the eighteenth conductive connection part D18, the gate electrode of the twenty-second transistor T22, and the twenty-fifth conductive connection part D25 may be connected sequentially as a fifth node N5.

In some examples, a shape of the twenty-sixth conductive connection part D26 may be substantially a stepped shape. The twenty-sixth conductive connection part D26 may be located between the twenty-fifth conductive connection part D25 and the twenty-third conductive connection part D23 in the second direction Y. The twenty-sixth conductive connection part D26 may be connected with a first region of the active layer 312 of the twelfth transistor T12 through the sixteenth via V16, and may also be connected with a first region of the active layer 314 of the fourteenth transistor T14 through the eighteenth via V18. The twenty-sixth conductive connection part D26 may be connected with a second transmission line 712 formed subsequently in the fifth conductive layer.

In some examples, a shape of the twenty-seventh conductive connection part D27 may be substantially an L-shaped shape. The twenty-seventh conductive connection part D27 may be located between the eighth conductive connection part D8 and the eleventh conductive connection part D11 in the first direction X. The twenty-seventh conductive connection part D27 may be connected with a first region of the active layer 31 of the first transistor T1 through the first via V1, may also be connected with a first region of the active layer 35 of the fifth transistor T5 through the third via V3, and may also be connected with a first region of the active layer 39 of the ninth transistor T9 through the eighth via V8. The twenty-seventh conductive connection part D27 may be connected with a second transmission line 712 formed subsequently in the fifth conductive layer.

In some examples, a shape of the twenty-eighth conductive connection part D28 may be substantially a shape of a polyline extending in the first direction X. The twenty-eighth conductive connection part D28 may be located on a side of the twenty-third conductive connection part D23 in the opposite direction of the first direction X. The twenty-eighth conductive connection part D28 may be connected with the gate electrode 212 of the twelfth transistor T12 through the twenty-ninth via V29, may also be connected with the top gate 213 of the thirteenth transistor T13 through the one-hundredth via V100, may also be connected with a first region of the active layer 326 of the twenty-sixth transistor T26 through the seventieth via V70, may also be connected with a first region of the active layer 325 of the twenty-fifth transistor T25 through the twelfth via V12, may also be connected with a second region of the active layer 316 of the sixteenth transistor T16 through the ninth via V9, and may also be connected with a second region of the active layer 318 of the eighteenth transistor T18 through the sixty-eighth via V68. The gate electrode of the twelfth transistor T12, the gate electrode of the thirteenth transistor T13, the first electrode of the twenty-fifth transistor T25, the first electrode of the twenty-sixth transistor T26, the second electrode of the sixteenth transistor T16, and the second electrode of the eighteenth transistor T18 may be electrically connected through the twenty-eighth conductive connection part D28, and the twenty-eighth conductive connection part D28 may serve as a third node N3.

In some examples, a shape of the twenty-ninth conductive connection part D29 may be substantially a shape of a dumbbell. The twenty-ninth conductive connection part D29 may be located on a side of the twenty-fifth conductive connection part D25 in the opposite direction of the first direction X. The twenty-ninth conductive connection part D29 may be connected with a first region of the seventeenth transistor T17 through the fifteenth via V15. The twenty-ninth conductive connection part D29 may serve as a gate input terminal of the present stage shift register circuit. The twenty-ninth conductive connection part D29 may be connected with a gate input signal line VT formed subsequently in the fifth conductive layer.

In some examples, a shape of the thirtieth conductive connection part D30 may be substantially a rectangular shape. The thirtieth conductive connection part D30 may be located on a side of the twenty-eighth conductive connection part D28 in the opposite direction of the second direction Y. The thirtieth conductive connection part D30 may be connected with the top gate 218 of the eighteenth transistor T18 through the ninety-eighth via V98, and may also be connected with the gate electrode 225 of the twenty-fifth transistor T25 through the forty-first via V41.

In some examples, a shape of the thirty-first conductive connection part D31 may be substantially a rectangular shape. The thirty-first conductive connection part D31 may be located on a side of the twenty-ninth conductive connection part D29 in the opposite direction of the second direction Y. The thirty-first conductive connection part D31 may be connected with the gate electrode 226 of the twenty-sixth transistor T26 through the ninety-ninth via V99. The thirty-first conductive connection part D31 may be connected with the second clock signal line CBL formed subsequently in the fifth conductive layer.

In some examples, a shape of the thirty-second conductive connection part D32 may be substantially a shape of a dumbbell extending in the second direction Y. The thirty-second conductive connection part D32 may be located on a side of the twenty-ninth conductive connection part D29 in the opposite direction of the first direction X. The thirty-second conductive connection part D32 may be connected with a first region of the active layer 318 of the eighteenth transistor T18 through the sixty-ninth via V69, and may also be connected with a second region of the active layer 317 of the seventeenth transistor T17 through the fourteenth via V14.

In some examples, a shape of the thirty-third conductive connection part D33 may be substantially a shape of a polyline extending in the first direction X. The thirty-third conductive connection part D33 may be located on a side of the twenty-eighth conductive connection part D28 in the second direction Y. The thirty-third conductive connection part D33 may be connected with a first region of the active layer 310 of the tenth transistor T10 through the sixty-seventh via V67. The thirty-third conductive connection part D33 may be connected with a fifth transmission line 715 formed subsequently in the fifth conductive layer.

In some examples, a shape of the thirty-fourth conductive connection part D34 may be substantially a rectangular shape. The thirty-fourth conductive connection part D34 may be located between the fourth conductive connection part D4 and the thirty-second conductive connection part D32 in the first direction X. The thirty-fourth conductive connection part D34 may be connected with a first region of the active layer 316 of the sixteenth transistor T16 through the tenth via V10. The thirty-fourth conductive connection part D34 may be connected with a first transmission line 711 formed subsequently in the fifth conductive layer.

In some examples, a shape of the thirty-fifth conductive connection part D35 may be substantially an L-shaped shape. The thirty-fifth conductive connection part D35 may be located on a side of the twenty-seventh conductive connection part D27 in the opposite direction of the first direction X. The thirty-fifth conductive connection part D35 may be connected with the gate electrode 26 of the sixth transistor T6 through the thirty-third via V33, may also be connected with a second region of the active layer 39 of the ninth transistor T9 through the seventh via V7, and may also be connected with the gate electrode 221 of the twenty-first transistor T21 through the thirty-ninth via V39.

In some examples, a shape of the thirty-sixth conductive connection part D36 may be substantially a rectangular shape. The thirty-sixth conductive connection part D36 may be located on a side of the fourth conductive connection part D4 in the opposite direction of the first direction X. The thirty-sixth conductive connection part D36 may be connected with the gate electrode 216 of the sixteenth transistor T16 through the forty-third via V43. The thirty-sixth conductive connection part D36 may serve as an initial control terminal of the present stage shift register circuit, and is connected with an initial control signal line NX formed subsequently in the fifth conductive layer.

In some examples, a shape of the thirty-seventh conductive connection part D37 may be substantially an L-shaped shape. The thirty-seventh conductive connection part D37 may be located on a side of the thirty-third conductive connection part D33 in the second direction Y. The thirty-seventh conductive connection part D37 may be connected with the second connection electrode 402 through the forty-fourth via V44, may also be connected with a second region of the active layer 310 of the tenth transistor T10 through the sixty-sixth via V66, may also be connected with the gate electrode 27 of the seventh transistor T7 through the ninety-sixth via V96, and may also be connected with the gate electrode 26 of the sixth transistor T6 through the thirty-fourth via V34. The gate electrode of the sixth transistor T6, the gate electrode of the seventh transistor T7, and the second electrode of the tenth transistor T10 are connected through the thirty-seventh conductive connection part D37, the gate electrode of the sixth transistor T6, the second electrode of the ninth transistor T9, and the gate electrode of the twenty-first transistor T21 may be connected through the thirty-fifth conductive connection part D35, the gate electrode of the twenty-first transistor T21 and the gate electrode of the twenty-third transistor T23 may be connected through the thirteenth conductive connection part D13, the thirty-seventh conductive connection part D37 may be connected with the fourth conductive connection part D4 through the second connection electrode 402, and the fourth conductive connection part D4 may be connected with the second electrode of the eleventh transistor T11, so that the sixth transistor T6, the seventh transistor T7, the ninth transistor T9, the tenth transistor T10, the eleventh transistor T11, the twenty-first transistor T21, and the twenty-third transistor T23 are all connected with the cascaded output terminal.

In some examples, a shape of the thirty-eighth conductive connection part D38 may be substantially a U-shaped shape. The thirty-eighth conductive connection part D38 may be located on a side of the seventh conductive connection part D7 in the opposite direction of the first direction X. The thirty-eighth conductive connection part D38 may be connected with the gate electrode 21 of the first transistor T1 through the fiftieth via V50, may also be connected with a second region of the active layer 27 of the twenty-seventh transistor T27 through the sixth via V6, may also be connected with the gate electrode 28 of the eighth transistor T8 through the ninety-fifth via V95, and may also be connected with a second region of the active layer 328 of the twenty-eighth transistor T28 through the sixty-fifth via V65. The gate electrode of the first transistor T1, the gate electrode of the eighth transistor T8, the second electrode of the twenty-seventh transistor T27, and the second electrode of the twenty-eighth transistor T28 may be connected through the thirty-eighth conductive connection part D38, an the thirty-eighth conductive connection part D38 may serve as a first node N1.

In some examples, a shape of the thirty-ninth conductive connection part D39 may be substantially a 1-shaped shape. The thirty-ninth conductive connection part D39 may be located between the thirty-seventh conductive connection part D37 and the thirty-fifth conductive connection part D35. The thirty-ninth conductive connection part D39 may be connected with the top gate 210 of the tenth transistor T10 through the ninety-seventh via V97, may also be connected with the gate electrode 29 of the ninth transistor T9 through the thirty-eighth via V38, may also be connected with a second region of the active layer 36 of the sixth transistor T6 through the fourth via V4, and may also be connected with a second region of the active layer 37 of the seventh transistor T7 through the sixty-third via V63. The second electrode of the sixth transistor T6, the second electrode of the seventh transistor T7, the gate electrode of the ninth transistor T9, and the gate electrode of the tenth transistor T10 may be connected through the thirty-ninth conductive connection part D39, the second electrode of the second transistor T2 and the second electrode of the third transistor T3 may be connected through the ninth conductive connection part D9, the second electrode of the second transistor T2 and the second electrode of the sixth transistor T6 may be connected through the active layer 22 of the second transistor T2 and the active layer 26 of the sixth transistor T6 to be connected as an integral structure. The integral structure of the active layer 22 of the second transistor T2 and the active layer 26 of the sixth transistor T6, the ninth conductive connection part D9, and the thirty-ninth conductive connection part D39 may be connected as a second node N2.

(9) A sixth insulation layer and a seventh insulation layer are formed. In some examples, a sixth insulation thin film is deposited on the base substrate on which the aforementioned patterns are formed, and the sixth insulation thin film is patterned through a patterning process to form a sixth insulation layer. Subsequently, a seventh insulation thin film is coated and the seventh insulation thin film is patterned through a patterning process to form a seventh insulation layer.

Figure 12:
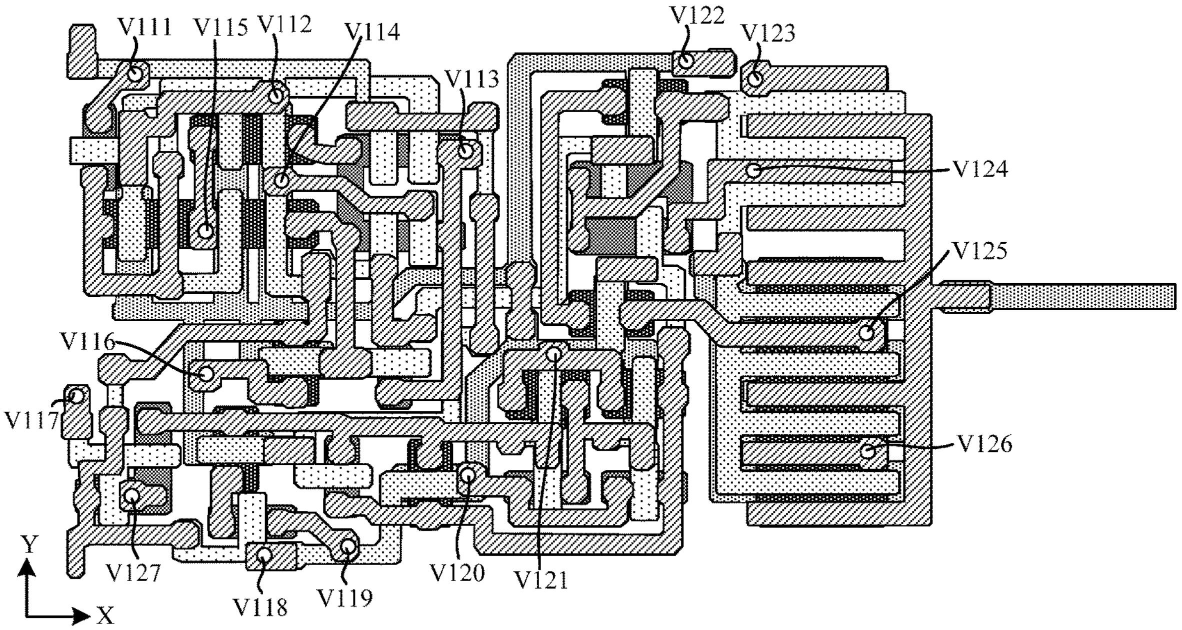
FIG. 12 is a schematic diagram of a display substrate after a seventh insulation layer is formed according to at least one embodiment of the present disclosure.

FIG. 12 is a schematic diagram of a display substrate after the seventh insulation layer is formed according to at least one embodiment of the present disclosure. In some examples, as shown in FIG. 12, the seventh insulation layer of the display substrate may be provided with multiple vias, which may include, for example, a one-hundred-and-eleventh via V111 to a one-hundred-and-twenty-seventh via V127. The seventh insulation layer and the sixth insulation layer within the one-hundred-and-eleventh via V111 to the one-hundred-and-twenty-seventh via V127 may be removed, exposing part of a surface of the fourth conductive layer.

(10) A fifth conductive layer is formed. In some examples, a fifth conductive thin film is deposited on the base substrate on which the aforementioned patterns are formed, and the fifth conductive thin film is patterned through a patterning process to form a fifth conductive layer on the seventh insulation layer.

Figure 13A:
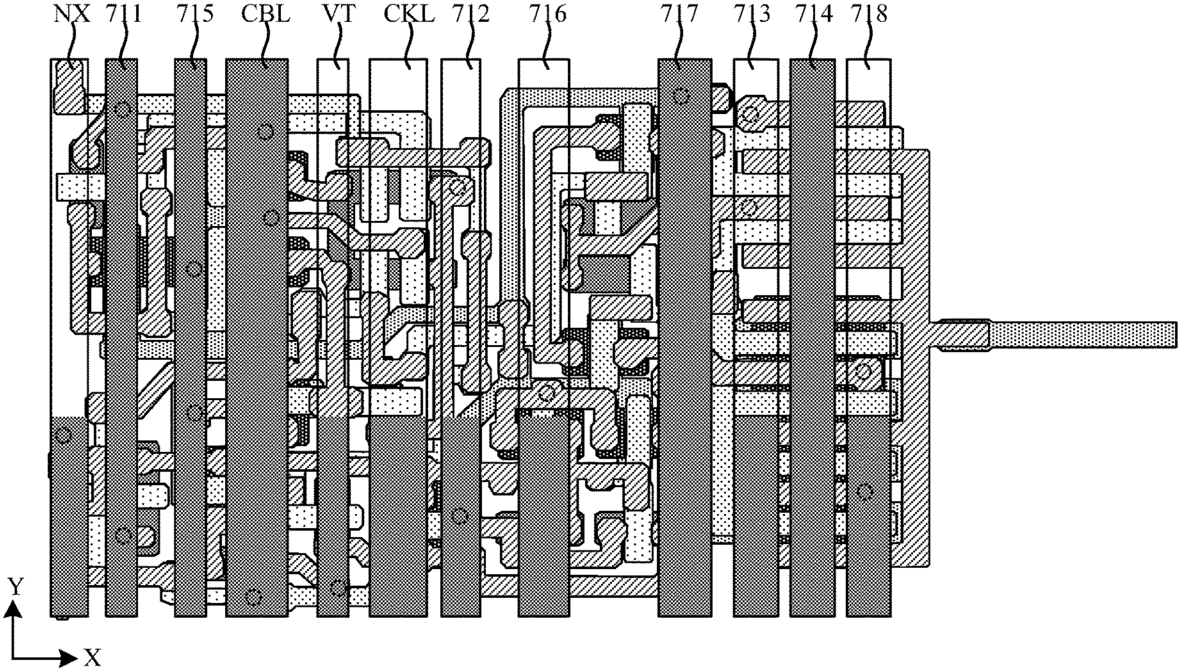
FIG. 13A is a schematic diagram of a display substrate after a fifth conductive layer is formed according to an embodiment of the present disclosure.
Figure 13B:
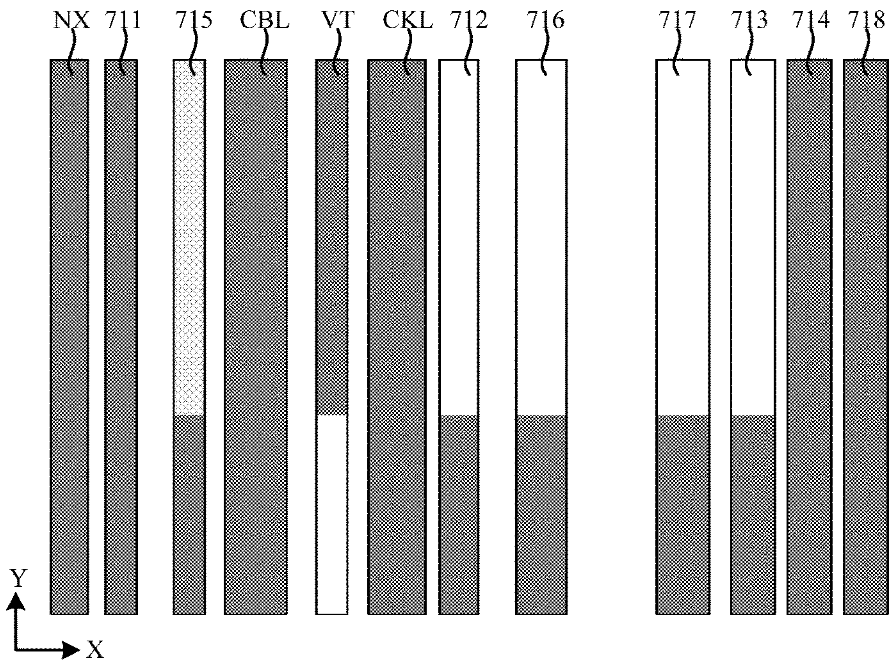
FIG. 13B is a schematic diagram of the fifth conductive layer in FIG. 13A.

FIG. 13A is a schematic diagram of a display substrate after the fifth conductive layer is formed according to at least one embodiment of the present disclosure. FIG. 13B is a schematic diagram of the fifth conductive layer in FIG. 13A.

In some examples, as shown in FIGS. 13A and 13B, the fifth conductive layer of the display substrate may include at least a plurality of signal lines, including, for example, a first clock signal line CKL, a second clock signal line CBL, a gate input signal line VT, an initial control signal line NX, and a plurality of transmission lines (including, for example, a first transmission line 711, a second transmission line 712, a third transmission line 713, a fourth transmission line 714, a fifth transmission line 715, a sixth transmission line 716, a seventh transmission line 717, and an eighth transmission line 718).

In some examples, shapes of the first clock signal line CKL, the second clock signal line CBL, the gate input signal line VT, the initial control signal line NX, and the plurality of transmission lines may all be shapes of strips extending in the second direction Y. In the first direction X, the initial signal control line NX, the first transmission line 711, the fifth transmission line 715, the second clock signal line CBL, the gate input signal line VT, the first clock signal line CKL, the second transmission line 712, the sixth transmission line 716, the seventh transmission line 717, the third transmission line 713, the fourth transmission line 714, and the eighth transmission line 718 may be arranged sequentially.

In some examples, the initial control signal line NX may be connected with the thirty-sixth conductive connection part D36 through the one-hundred-and-seventeenth via V117 to provide an initial control signal to an initial control terminal of a shift register circuit.

In some examples, the gate input signal line VT may be located between the second clock signal line CBL and the second clock signal line CKL in the first direction X. The gate input signal line VT may be connected with the twenty-ninth conductive connection part D29 through the one-hundred-and-nineteenth via V119 to provide a gate input signal to a gate input terminal of the shift register circuit.

In some examples, line widths of the second clock signal line CBL and the first clock signal line CKL may be substantially the same, and the line widths may be greater than line widths of other traces, and a transmission resistance of a clock signal may be reduced. A clock signal terminal of an n-th stage (e.g., n may be equal to 2i) shift register circuit of the present example may be connected with the second clock signal line CBL. Among them, the second clock signal line CBL may be connected with the sixth conductive connection part D6 through the one-hundred-and-twelfth via V112 to provide a clock signal to the fourth transistor T4, the twenty-seventh transistor T27, and the twenty-eighth transistor T28; may also be connected with the eighth conductive connection part D8 through the one-hundred-and-fourteenth via V114 to provide a clock signal to the fifth transistor T5; and may also be connected with the thirty-first conductive connection part D31 through the one-hundred-and-eighteenth via V118 to provide a clock signal to the twenty-sixth transistor T26. The first clock signal line CKL may be connected with a clock signal terminal of an (n−1)-th stage shift register circuit.

In some examples, voltage signals transmitted by the first transmission line 711, the second transmission line 712, the third transmission line 713, and the fourth transmission line 714 may be greater than voltage signals transmitted by the fifth transmission line 715, the sixth transmission line 716, the seventh transmission line 717, and the eighth transmission line 718. For example, the first transmission line 711, the second transmission line 712, the third transmission line 713, and the fourth transmission line 714 may all serve as first voltage lines for transmitting a first voltage signal; the fifth transmission line 715, the sixth transmission line 716, the seventh transmission line 717, and the eighth transmission line 718 may all serve as second voltage lines for transmitting a second voltage signal. However, the present embodiment is not limited thereto. In other examples, the fifth transmission line 715, the sixth transmission line 716, and the eighth transmission line 718 may transmit a same voltage signal, and the seventh transmission line 717 may transmit a different voltage signal from the fifth transmission line 715.

In some examples, the first transmission line 711 may be connected with the fifth conductive connection part D5 through the one-hundred-and-eleventh via V111 to achieve an electrical connection with the twenty-seventh transistor T27; may also be connected with the thirty-fourth via V34 through the one-hundred-and-twenty-seventh via V127 to achieve connections with the eleventh transistor T11 and the sixteenth transistor T16.

In some examples, the second transmission line 712 may be connected with the twenty-seventh conductive connection part D27 through the one-hundred-and-thirteenth via V113 to achieve connections with the first transistor T1 and the fifth transistor T5; may also connected with the twenty-sixth conductive connection part D26 through the one-hundred-and-twentieth via V120 to achieve connections with the twelfth transistor T12 and the fourteenth transistor T14.

In some examples, the third transmission line 713 may be connected with the sixteenth conductive connection part D16 through the one-hundred-and-twenty-third via V123, and may also be connected with the seventeenth conductive connection part D17 through the one-hundred-and-twenty-fourth via V124 to achieve connections with the nineteenth transistor T19, the twenty-first transistor T21, and the twenty-second transistor T22.

In some examples, the fourth transmission line 714 may be adjacent to the third transmission line 713 in the first direction X, for example, located on a side of the third transmission line 713 in the first direction X. The fourth transmission line 714 may not be connected with the n-th (n may be equal to 2i) stage shift register circuit, and may be connected with the (n−1)-th stage shift register circuit.

In some examples, the fifth transmission line 715 may be adjacent to the first transmission line 711 in the first direction X, for example, located on a side of the first transmission line 711 in the first direction X. The fifth transmission line 715 may be connected with the seventh conductive connection part D7 through the one-hundred-and-fifteenth via V115 to achieve connections with the fourth transistor T4, the eighth transistor T8, and the twenty-eighth transistor T28; may also be connected with the thirty-third conductive connection part D33 through the one-hundred-and-sixteenth via V116 to achieve a connection with the tenth transistor T10.

In some examples, the sixth transmission line 716 may be adjacent to the second transmission line 712 in the first direction X, for example, located on a side of the second transmission line 712 in the first direction X. The sixth transmission line 716 may be connected with the twenty-fourth conductive connection part D24 through the one-hundred-and-twenty-first via V121 to achieve connections with the thirteenth transistor T13 and the fifteenth transistor T15.

In some examples, the seventh transmission line 717 may be adjacent to the third transmission line 713 and the sixth transmission line 716 in the first direction X, for example, may be located on a side of the third transmission line 713 in the opposite direction of the first direction X and on a side of the sixth transmission line 716 in the first direction X. A spacing between the seventh transmission line 717 and the sixth transmission line 716 may be greater than a spacing between the seventh transmission line 717 and the third transmission line 713. The seventh transmission line 717 may be connected with the fourteenth conductive connection part D14 through the one-hundred-and-twenty-second via V122 to achieve a connection with the first bottom gate connection part 601.

In some examples, the eighth transmission line 718 may be located on a side of the fourth transmission line 714 in the first direction X. The eighth transmission line 718 may be connected with the twentieth conductive connection part D20 through the one-hundred-and-twenty-fifth via V125 to achieve connections with the twentieth transistor T20 and the twenty-fourth transistor T24; may also be connected with the twenty-second conductive connection part D22 through the one-hundred-and-twenty-sixth via V126 to achieve a connection with the twentieth transistor T20.

In some examples, a pixel circuit may be formed in the display region while the shift register circuit is formed in the display substrate. For example, the first semiconductor layer of the display region may include an active layer of a first type transistor (e.g., a P-type transistor) of the pixel circuit. The first conductive layer of the display region may include a gate electrode of the first type transistor of the pixel circuit and a first electrode plate of a storage capacitance. The second conductive layer of the display region may include a second electrode plate of the storage capacitance of the pixel circuit and a bottom gate of a second type transistor. The second semiconductor layer of the display region may include an active layer of the second type transistor (e.g., an N-type transistor) of the pixel circuit. The third conductive layer of the display region may include a top gate of the second type transistor of the pixel circuit. The fourth conductive layer of the display region may include at least connection electrodes of a plurality of transistors of the pixel circuit. The fifth conductive layer of the display region may include at least a data line and a power line connected with the pixel circuit. The present embodiment is not limited thereto.

In some examples, the first conductive layer, the second conductive layer, the third conductive layer, the fourth conductive layer, and the fifth conductive layer may be made of a metal material, such as, any one or more of Argentum (Ag), Copper (Cu), Aluminum (Al), and Molybdenum (Mo), or an alloy material of the above metals, such as, an Aluminum-Neodymium alloy (AlNd), or a Molybdenum-Niobium alloy (MoNb), which may be of a single layer structure, or a multi-layer composite structure, such as Mo/Cu/Mo. The first insulation layer, the second insulation layer, the third insulation layer, the fourth insulation layer, and the fifth insulation layer may be made of any one or more of Silicon Oxide (SiOx, x>0), Silicon Nitride (SiNy, y>0), and Silicon OxyNitride (SiON), and may be a single layer, a multi-layer, or a composite layer. The sixth insulation layer and the seventh insulation layer may be made of an organic material, such as polyimide, acrylic, or polyethylene terephthalate. However, the present embodiment is not limited thereto.

A structure and a preparation process thereof shown in the embodiment are merely illustrative. In some exemplary implementation modes, corresponding structures may be changed and processes may be added or reduced depending on actual requirements. The preparation process of the exemplary embodiment may be implemented using an existing mature preparation device, and may be compatible well with an existing preparation process, simple in process implementation, easy to implement, high in a production efficiency, low in a production cost, and high in a yield.

In this example, the gate electrode of the second transistor T2 and the gate electrode of the third transistor T3 of the first NOT gate circuit are connected to receive a same signal. The second electrode of the second transistor T2 and the second electrode of the third transistor T3 are connected through the ninth conductive connection part D9 located in the fourth conductive layer. The first electrode of the second transistor T2 may be connected with the first transistor T1 through an integral structure of active layers located in the first semiconductor layer. The first electrode of the third transistor T3 may be connected with the fourth transistor T4 through an integral structure of active layers located in the second semiconductor layer. By designing active layers of the second transistor T2 and the first transistor T1 to be interconnected into an integral structure, and active layers of the third transistor T3 and the fourth transistor T4 to be interconnected into an integral structure, circuit occupancy space may be saved.

In this example, the gate electrode of the sixth transistor T6 and the gate electrode of the seventh transistor T7 of the second NOT gate circuit are connected to receive a same signal. The second electrode of the sixth transistor T6 and the second electrode of the seventh transistor T7 are connected through the thirty-ninth conductive connection part D39 located in the fourth conductive layer. The first electrode of the sixth transistor T6 may be connected with the fifth transistor T5 through an integral structure of active layers located in the first semiconductor layer. The first electrode of the seventh transistor T7 may be connected with the eighth transistor T8 through an integral structure of active layers located in the second semiconductor layer. By designing active layers of the sixth transistor T6 and the fifth transistor T5 to be interconnected into an integral structure, and active layers of the seventh transistor T7 and the eighth transistor T8 to be interconnected into an integral structure, circuit occupancy space may be saved. The thirty-ninth conductive connection part D39 and the ninth conductive connection part D9 may be connected through an integral structure of active layers of the second transistor T2 and the sixth transistor T6 located in the first semiconductor layer, which may facilitate a reasonable arrangement of conductive connection parts of the fourth conductive layer.

In this example, the gate electrode of the ninth transistor T9 and the gate electrode of the tenth transistor T10 of the third NOT gate circuit may both be connected with the thirty-ninth conductive connection part D39 to achieve connections with output terminals of the first NOT gate circuit and the second NOT gate circuit. The third NOT gate circuit may be connected in series with the first NOT gate circuit and the second NOT gate circuit. The second electrode of the ninth transistor T9 may be connected with the thirty-fifth conductive connection part D35 located in the fourth conductive layer. The second electrode of the tenth transistor T10 may be connected with the thirty-seventh conductive connection part D37 located in the fourth conductive layer. The thirty-seventh conductive connection part D37 and the thirty-fifth conductive connection part D35 may be connected through the gate electrode 26 of the sixth transistor T6 located in the first conductive layer. The thirty-seventh conductive connection part D37 may be connected with the second connection electrode 402 located in the first conductive layer. The second electrode of the ninth transistor T9 and the second electrode of the tenth transistor T10 may be connected with other transistors after jumper connections in sequence through the thirty-fifth conductive connection part D35 located in the fourth conductive layer, the gate electrode 26 of the sixth transistor T6 located in the first conductive layer, the thirty-seventh conductive connection part D37 located in the fourth conductive layer, and the second electrode 402 located in the first conductive layer. The first electrode of the ninth transistor T9 may be connected with the second transmission line 712 located in the fifth conductive layer through the twenty-seventh conductive connection part D27 located in the fourth conductive layer to receive a first voltage signal. The first electrode of the tenth transistor T10 may be connected with the fifth transmission line 715 located in the fifth conductive layer through the thirty-third conductive connection part D33 located in the fourth conductive layer to receive a second voltage signal. An arrangement and a connection mode of transistors of NOT gate circuits of this example may advantageously save occupied space.

In this example, the second electrode of the twelfth transistor T12 and the second electrode of the thirteenth transistor T13 of the fifth NOT gate circuit, the gate electrode of the fourteenth transistor T14 and the gate electrode of the fifteenth transistor T15 of the sixth NOT gate circuit may be connected through the twenty-third conductive connection part D23 located in the fourth conductive layer. The fifth NOT gate circuit may be connected in series with the sixth NOT gate circuit.

In this example, the active layer 32 of the second transistor T2 and the active layer 33 of the third transistor T3 of the first NOT gate circuit extend in a same direction, for example, both extend in the first direction X; the active layer 32 of the second transistor T2 and the active layer 33 of the third transistor T3 are arranged sequentially in the first direction X, and may be substantially arranged in a straight line shape. The second transistor T2 and the third transistor T3 of the first NOT gate circuit may be arranged in a same direction as an extension direction of active layers, that is, sequentially arranged in the first direction X.

In this example, the active layer 36 of the sixth transistor T6 and the active layer 37 of the seventh transistor T7 of the second NOT gate circuit extend in a same direction, for example, both extend in the first direction X; the active layer 36 of the sixth transistor T6 and the active layer 37 of the seventh transistor T7 are arranged sequentially in the first direction X, and may be substantially arranged in a straight line shape. The sixth transistor T6 and the seventh transistor T7 of the second NOT gate circuit may be arranged in a same direction as an extension direction of active layers, that is, sequentially arranged in the first direction X.

In this example, the active layer 39 of the ninth transistor T9 and the active layer 310 of the tenth transistor T10 of the third NOT gate circuit may extend in a same direction, for example, both extend in the first direction X; the active layer 39 of the ninth transistor T9 and the active layer 310 of the tenth transistor T10 are arranged sequentially in the first direction X, and may be arranged substantially in a straight line shape. The ninth transistor T9 and the tenth transistor T10 of the third NOT gate circuit may be arranged in a same direction as an extension direction of active layers, that is, sequentially arranged in the first direction X.

In this example, the active layer 327 of the twenty-seventh transistor T27 of the fourth NOT gate circuit extends in the second direction Y, and the active layer 328 of the twenty-eighth transistor T28 extends in the first direction X, and extension directions of the two intersect; the active layer 327 of the twenty-seventh transistor T27 and the active layer 328 of the twenty-eighth transistor T28 may be arranged substantially in an L shape. The twenty-seventh transistor T27 and the twenty-eighth transistor T28 of the fourth NOT gate circuit may be arranged in the second direction Y, which may be substantially the same as an extension direction of the active layer 327 of the twenty-seventh transistor T27.

In this example, the active layer 312 of the twelfth transistor T12 and the active layer 313 of the thirteenth transistor T13 of the fifth NOT gate circuit extend in a same direction, for example, both extend in the first direction X; the active layer 312 of the twelfth transistor T12 and the active layer 313 of the thirteenth transistor T13 are sequentially arranged in the second direction Y. The active layer 312 of the twelfth transistor T12 and the active layer 313 of the thirteenth transistor T13 may be arranged in parallel. The twelfth transistor T12 and the thirteenth transistor T13 of the fifth NOT gate circuit may be arranged in a direction intersecting with an extension direction of active layers, for example, sequentially arranged in the second direction Y.

In this example, the active layer 314 of the fourteenth transistor T14 and the active layer 315 of the fifteenth transistor T15 of the sixth NOT gate circuit extend in a same direction, for example, both extend in the first direction X; the active layer 314 of the fourteenth transistor T14 and the active layer 315 of the fifteenth transistor T15 are sequentially arranged in the second direction Y. The active layer 314 of the fourteenth transistor T14 and the active layer 315 of the fifteenth transistor T15 may be arranged in parallel. The fourteenth transistors T14 and the fifteenth transistors T15 of the sixth NOT gate circuit may be arranged in a direction intersecting with an extension direction of active layers, for example, sequentially arranged in the second direction Y.

This example provides a plurality of arrangement modes of transistors of a NOT gate circuit. A combination of the plurality of arrangement modes may help save space and be beneficial to achieving narrowing of a bezel.

In this example, the twenty-first transistor T21 and the twenty-second transistor T22 of the NAND gate circuit may be located at an intermediate position between the twenty-third transistor T23 and the twenty-fourth transistor T24. The top gate 223 of the twenty-third transistor T23, the gate electrode 221 of the twenty-first transistor T21, the gate electrode 222 of the twenty-second transistor T22, and the top gate 224 of the twenty-fourth transistor T24 may be arranged in the second direction Y and misaligned to save space. An arrangement mode of the NAND gate circuit of this example may save disposing space of the NAND gate circuit.

The display substrate provided by the present exemplary embodiment may save space occupied by the shift register circuit through a layout design of the shift register circuit, on a basis of implementing local refresh, which is beneficial to achieving the display substrate with a narrow bezel.

Figure 14:
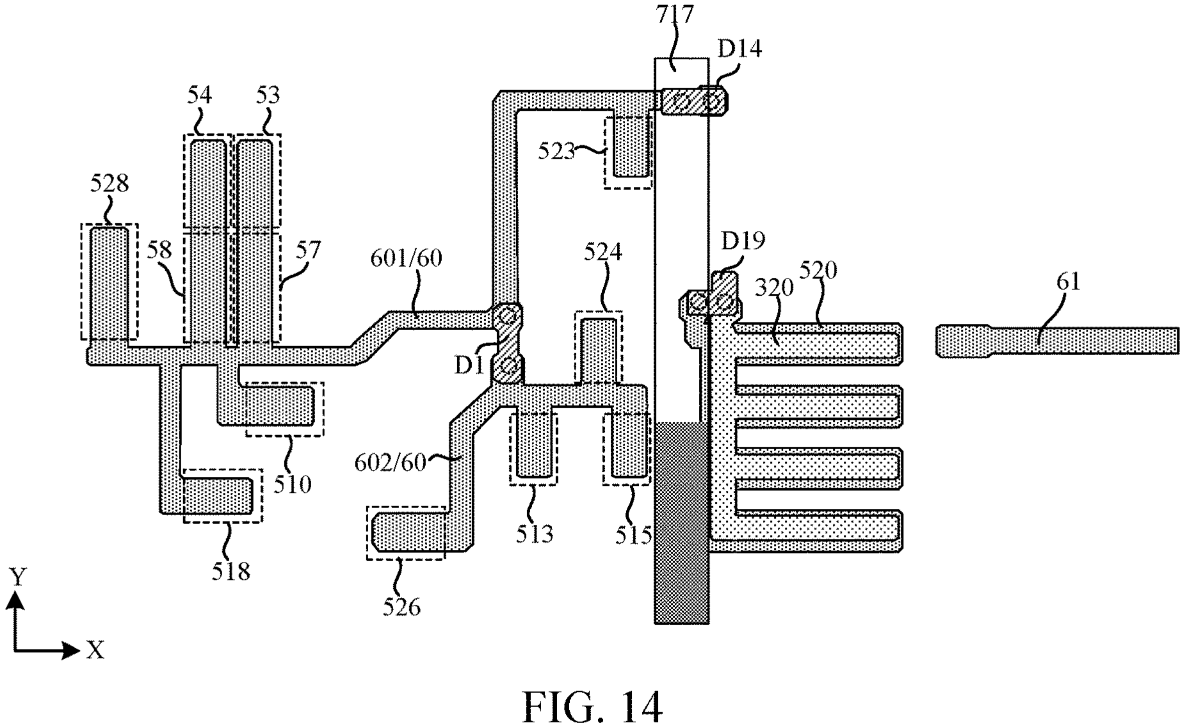
FIG. 14 is a schematic diagram of a connection of a bottom gate connection part according to at least one embodiment of the present disclosure.

FIG. 14 is a schematic diagram of a connection of a bottom gate connection part according to at least one embodiment of the present disclosure. FIG. 14 illustrates a second conductive layer and a partial structure in which there is a connection relationship with the bottom gate connection parts. In some examples, as shown in FIG. 14, the first bottom gate connection part 601 may be connected with the second bottom gate connection part 602 through the first conductive connection part D1 located in the fourth conductive layer. The first bottom gate connection part 601 may also be connected with the seventh transmission line 717 through the fourteenth conductive connection part D14 located in the fourth conductive layer, and, for example, may receive the second voltage signal. The top gate 320 of the twentieth transistor T20 may be connected with the bottom gate 320 through the nineteenth conductive connection part D19 located in the fourth conductive layer.

In this example, the bottom gate 520 and the top gate 320 of the twentieth transistor T20 are disposed to be connected, so that a same control signal may be written into the top gate 320 and the bottom gate 520 of the twentieth transistor T20, and turned on or off of the twentieth transistor T20 may be controlled at the same time. Moreover, bottom gates of remaining N-type transistors are independently controlled from the bottom gate of the twentieth transistor T20 as an output transistor, so that the remaining N-type transistors and the twentieth transistor T20 as an output transistor do not interfere with each other, thereby improving stability of a drive signal output by the shift register circuit.

Figure 15:
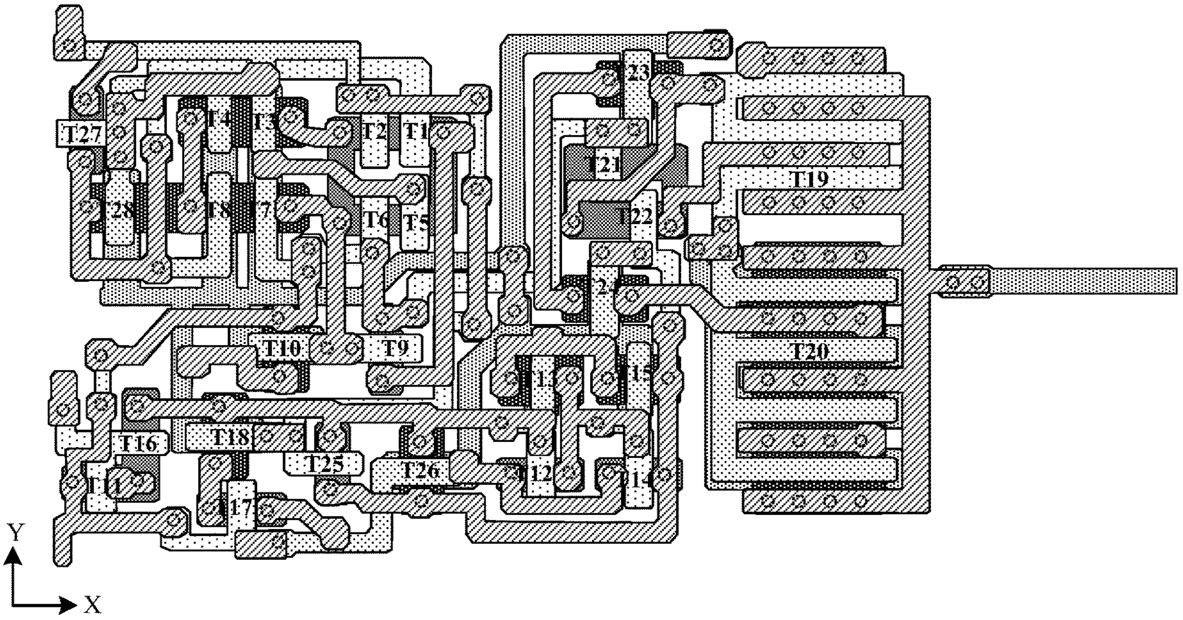
FIG. 15 is another partial top schematic view of a display substrate according to at least one embodiment of the present disclosure.
Figure 16A:
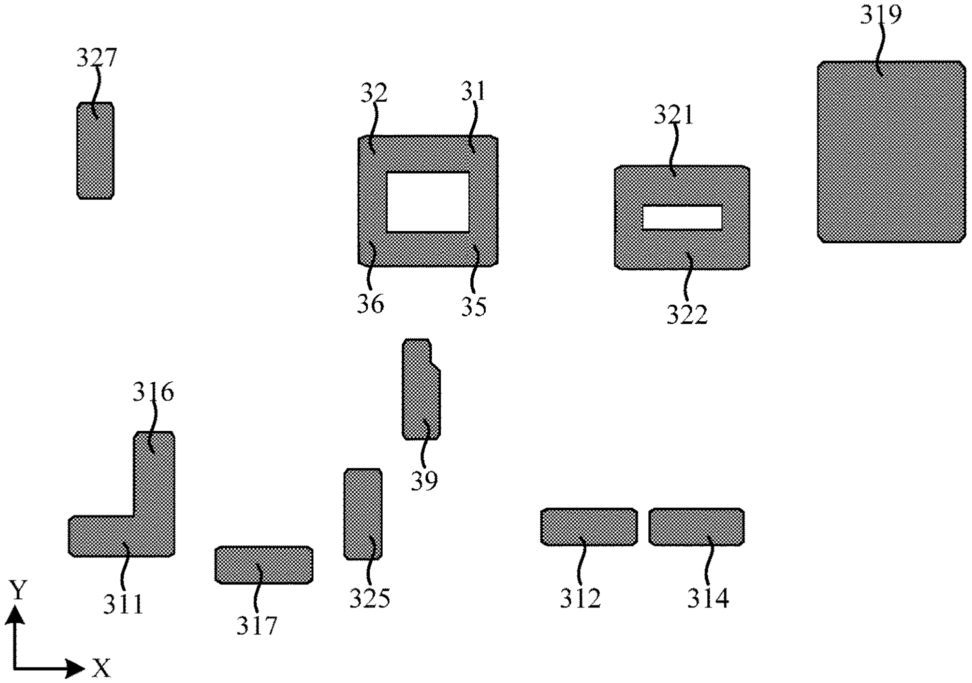
FIG. 16A is a schematic diagram of the display substrate after a first semiconductor layer is formed in FIG. 15.
Figure 16B:
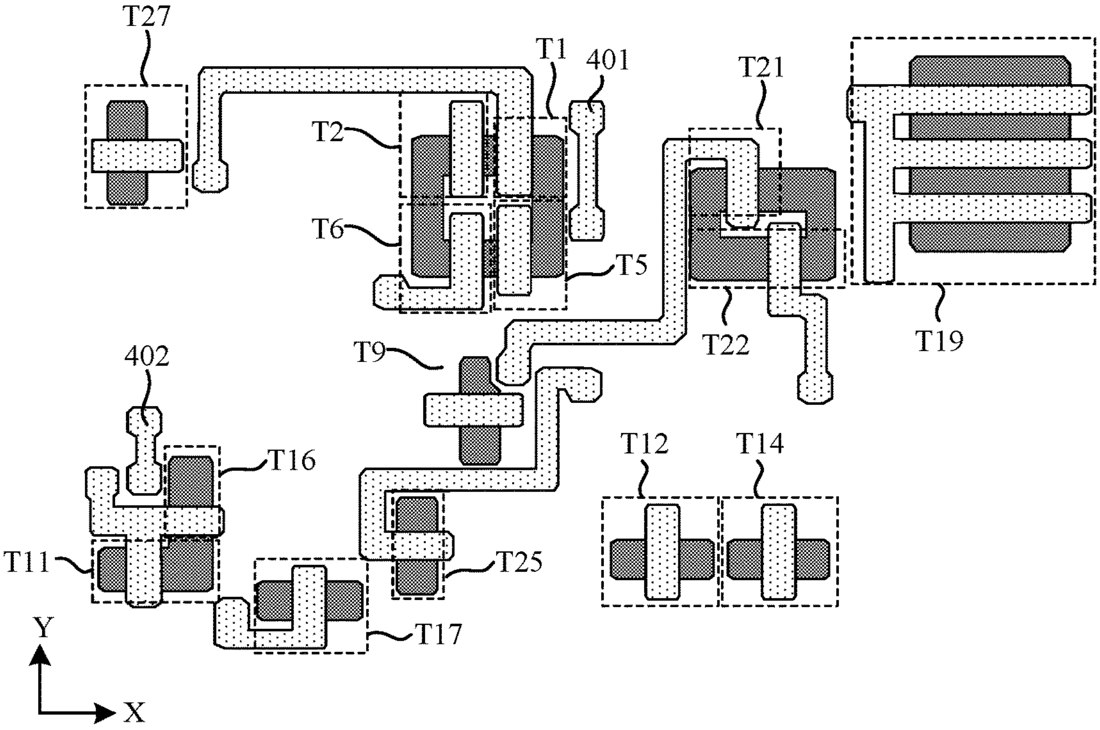
FIG. 16B is a schematic diagram of the display substrate after a first conductive layer is formed in FIG. 15.
Figure 16C:
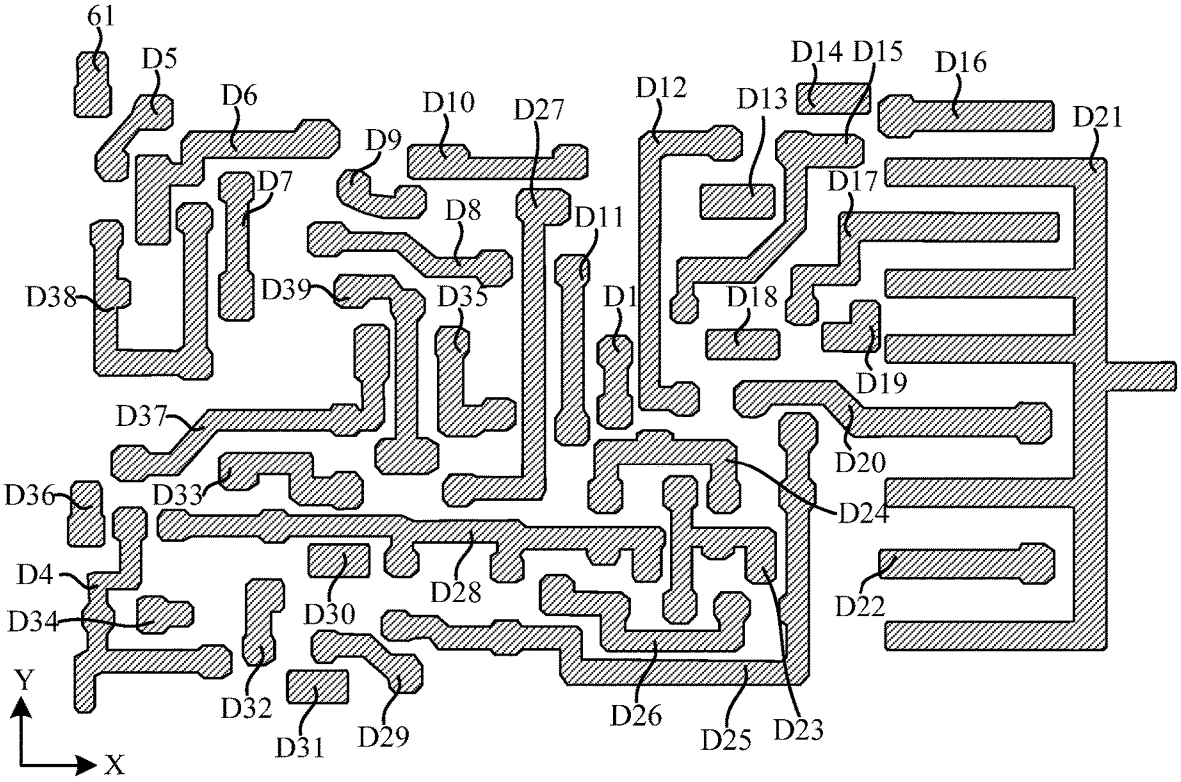
FIG. 16C is a schematic diagram of a fourth conductive layer in FIG. 15.

FIG. 15 is another partial top schematic view of a display substrate according to at least one embodiment of the present disclosure. FIG. 16A is a schematic diagram of the display substrate after a first semiconductor layer is formed in FIG. 15. FIG. 16B is a schematic diagram of the display substrate after a first conductive layer is formed in FIG. 15. FIG. 16C is a schematic diagram of the fourth conductive layer in FIG. 15.

In some examples, as shown in FIGS. 15 to 16C, the active layer 31 of the first transistor T1, the active layer 32 of the second transistor T2, the active layer 36 of the sixth transistor T6, and the active layer 35 of the fifth transistor T5 may be connected with each other to be an integral structure, and a shape of the integral structure may be a ring, such as a rectangular ring. Among them, the second region of the active layer 31 of the first transistor T1 may simultaneously serve as the first region of the active layer 32 of the second transistor T2. The second region of the active layer 32 of the second transistor T2 may simultaneously serve as the second region of the active layer 36 of the sixth transistor T6. The first region of the active layer 36 of the sixth transistor T6 may simultaneously serve as the second region of the active layer 35 of the fifth transistor T5. The first region of the active layer 31 of the first transistor T1 may simultaneously serve as the first region of the active layer 35 of the fifth transistor T5.

In some examples, the active layer 321 of the twenty-first transistor T21 and the active layer 322 of the twenty-second transistor T22 may be connected with each other into an integral structure, a shape of the integral structure may be substantially a ring, such as a rectangular ring. Among them, the second region of the active layer 321 of the twenty-first transistor T21 may simultaneously serve as the second region of the active layer 322 of the twenty-second transistor T22, and the first region of the active layer 321 of the twenty-first transistor T21 may simultaneously serve as the first region of the active layer of the twenty-second transistor T22.

In some examples, the twenty-seventh conductive connection part D27 located in the fourth conductive layer may be simultaneously connected with the first region of the active layer 31 of the first transistor T1 and the first region of the active layer 35 of the fifth transistor T5 through a single via, to achieve accessing a same signal. The fifteenth conductive connection part D15 located in the fourth conductive layer may be simultaneously connected with the first region of the active layer 321 of the twenty-first transistor T21 and the first region of the active layer 322 of the twenty-second transistor T22 through a single via, to achieve accessing a same signal.

In this example, for a plurality of transistors in which first electrodes are connected with each other and second electrodes are also connected with each other, a design of an annular channel structure may be adopted, and a quantity of punched holes may be reduced.

Figure 17:
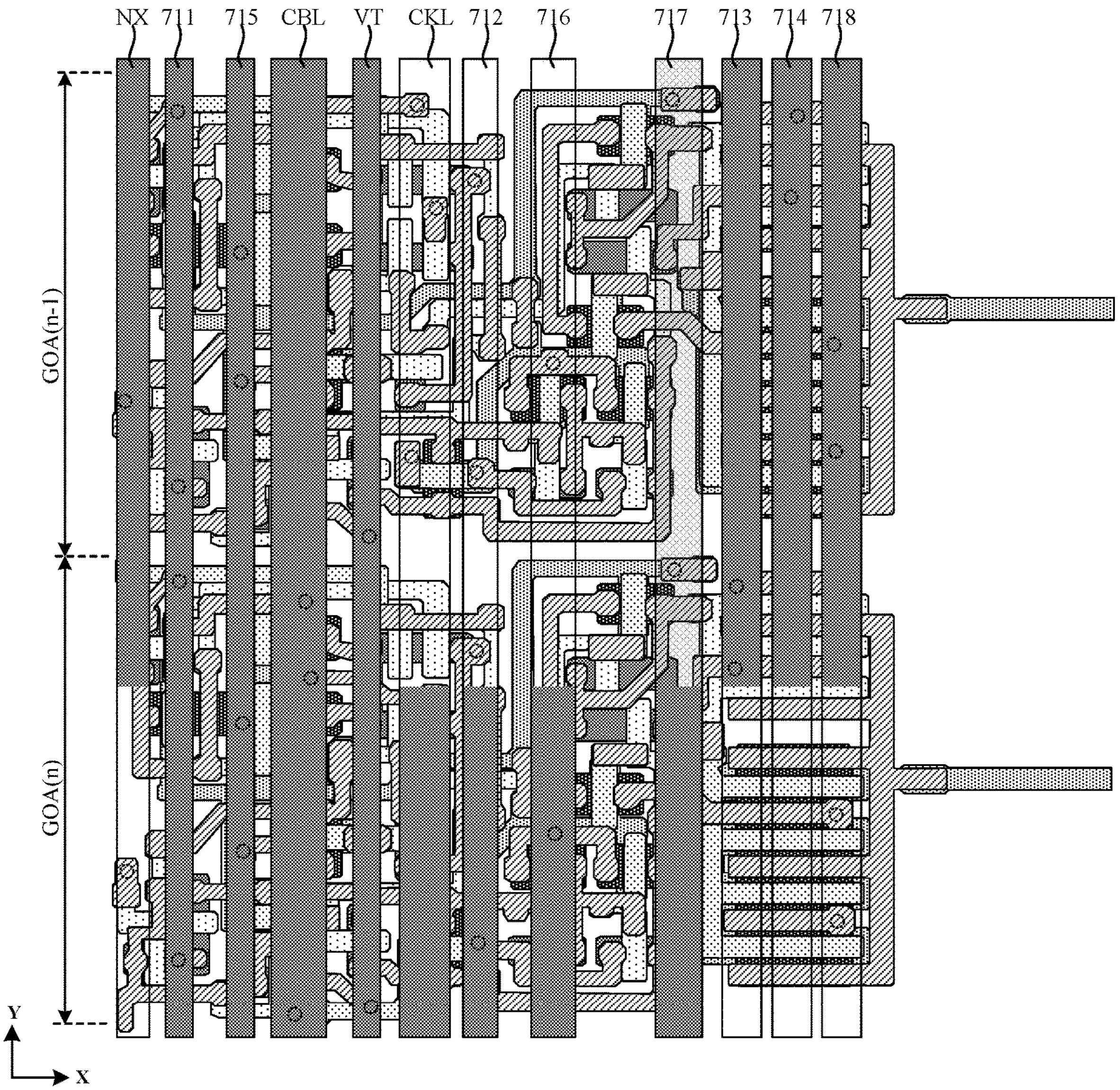
FIG. 17 is another partial top schematic view of a display substrate according to at least one embodiment of the present disclosure.
Figure 18A:
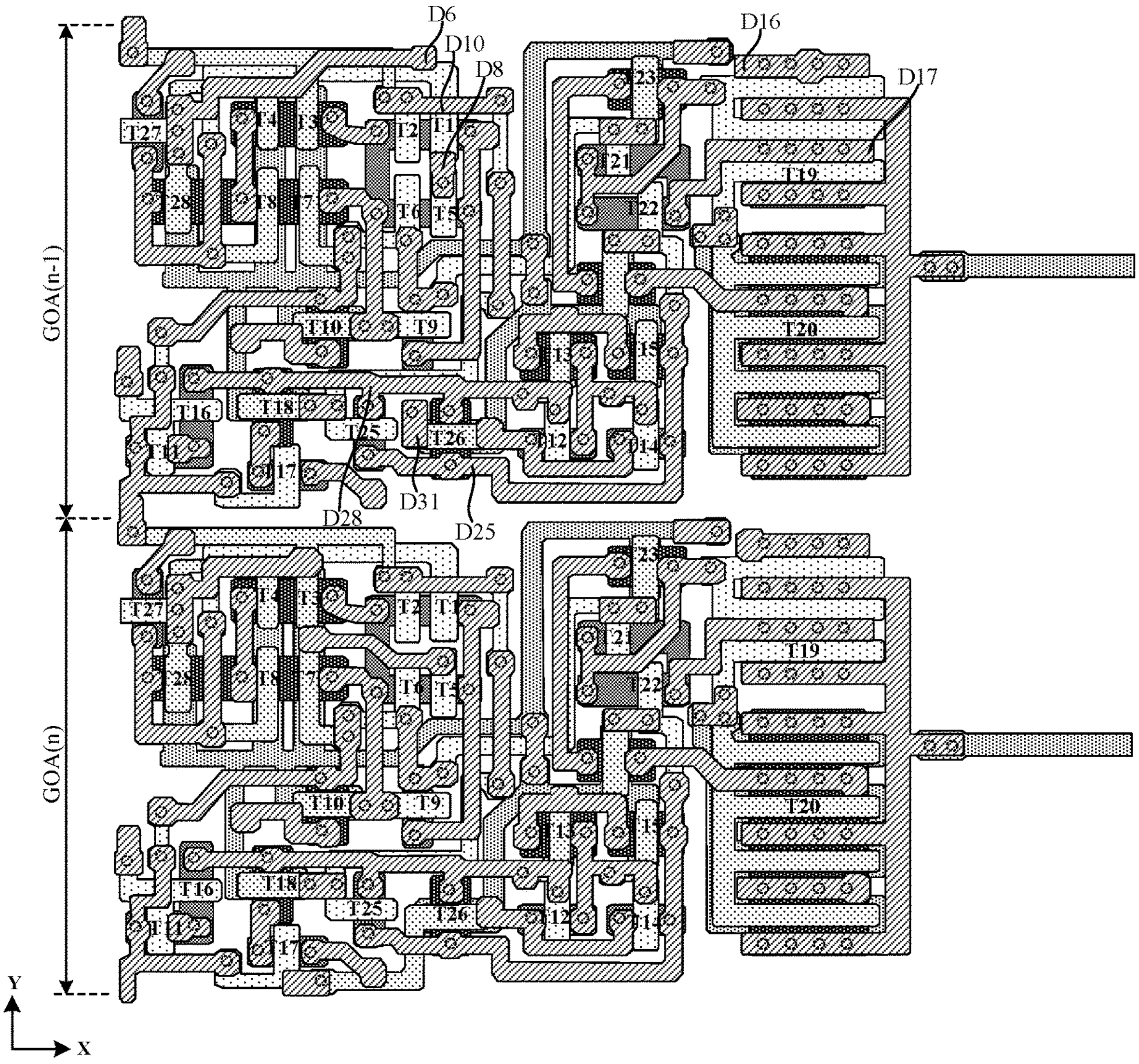
FIG. 18A is a schematic diagram of the display substrate after a fourth conductive layer is formed in FIG. 17.
Figure 18B:
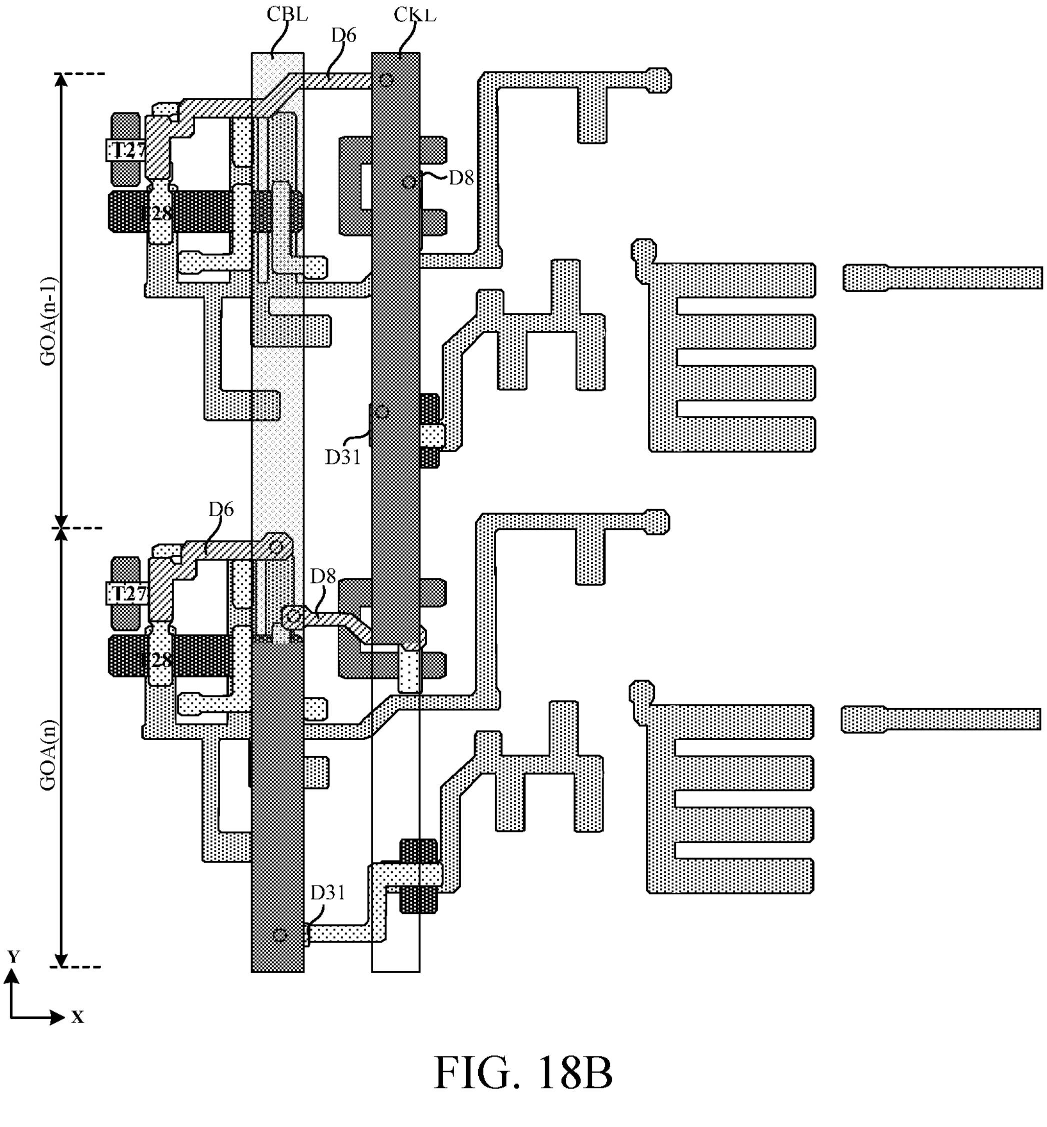
FIG. 18B is a schematic diagram of a connection of a shift register circuit in FIG. 17 with a first clock signal line and a second clock signal line.

FIG. 17 is another partial top schematic view of a display substrate according to at least one embodiment of the present disclosure. FIG. 18A is a schematic diagram of the display substrate after a fourth conductive layer is formed in FIG. 17. FIG. 18B is a schematic diagram of a connection of the shift register circuit in FIG. 17 with a first clock signal line and a second clock signal line. FIG. 17 illustrates two cascaded shift register circuits GOA(n−1) and GOA(n), wherein n may be 2i and i may be an integer greater than 0.

In some examples, as shown in FIGS. 17, 18A, and 18B, the shift register circuit GOA(n−1) may be connected with the first clock signal line CKL, and the shift register circuit GOA(n) may be connected with the second clock signal line CBL. The eighth conductive connection part D8 of the shift register circuit GOA(n−1) located in the fourth conductive layer may be substantially rectangular in shape. The eighth conductive connection part D8 may be connected with the first clock signal line CKL. The eighth conductive connection part D8 may be connected with the gate electrode of the fifth transistor T5. The sixth conductive connection part D6 of the shift register circuit GOA(n−1) located in the fourth conductive layer may extend to a side of the tenth conductive connection part D10 in the second direction Y and be connected with the first clock signal line CKL. The sixth conductive connection part D6 may be connected with the gate electrode of the twenty-seventh transistor T27, the gate electrode of the twenty-eighth transistor T28, and the gate electrode of the first transistor T1. A shape of the top gate 226 of the twenty-sixth transistor T26 of the shift register circuit GOA(n−1) may be a shape of a strip extending in the first direction X. The top gate 226 of the twenty-sixth transistor T26 may be connected with the thirty-first conductive connection part D31 located in the fourth conductive layer. A shape of the thirty-first conductive connection part D31 may be a shape of a strip extending in the second direction Y, and the thirty-first conductive connection part D31 may be located between the twenty-eighth conductive connection part D28 and a portion of the twenty-fifth conductive connection part D25 in the second direction Y. The thirty-first conductive connection part D31 of the shift register circuit GOA(n−1) may be connected with the first clock signal line CKL. Description of a connection mode between the shift register circuit GOA(n) and the second clock signal line CBL may be referred to description of the foregoing embodiments, and will not be repeated here.

In this example, the first clock signal line CKL is disposed to provide a clock signal to odd-stage shift register circuits, and the second clock signal line CBL is disposed to provide a clock signal to even-stage shift register circuits, and in a single shift register circuit, a received clock signal is inverted through a fourth NOT gate circuit (including the twenty-seventh transistor T27 and the twenty-eighth transistor T28) to obtain a clock inversion signal. An arrangement mode of the present example may reduce coupling between clock signals provided by the first clock signal line CKL and the second clock signal line CBL, and is beneficial to ensuring stability of a drive signal output by the shift register circuit.

In some examples, the shift register circuit GOA(n−1) may be connected with the fourth transmission line 714, and the shift register circuit GOA(n) may be connected with the third transmission line 713. The third transmission line 713 and the fourth transmission line 714 may be configured to transmit a same first voltage signal. The sixteenth conductive connection part D16 and the seventeenth conductive connection part D17 of the shift register circuit GOA(n−1) located in the fourth conductive layer may be connected with the fourth transmission line 714 located in the fifth conductive layer.

An arrangement design of the shift register circuit in this example is beneficial to saving occupied space and facilitating an arrangement of traces. A structure of the shift register circuit GOA(n) and remaining structures of the shift register circuit GOA(n−1) of the present example may be referred to the description of the foregoing embodiments, and will not be repeated here.

Figure 19:
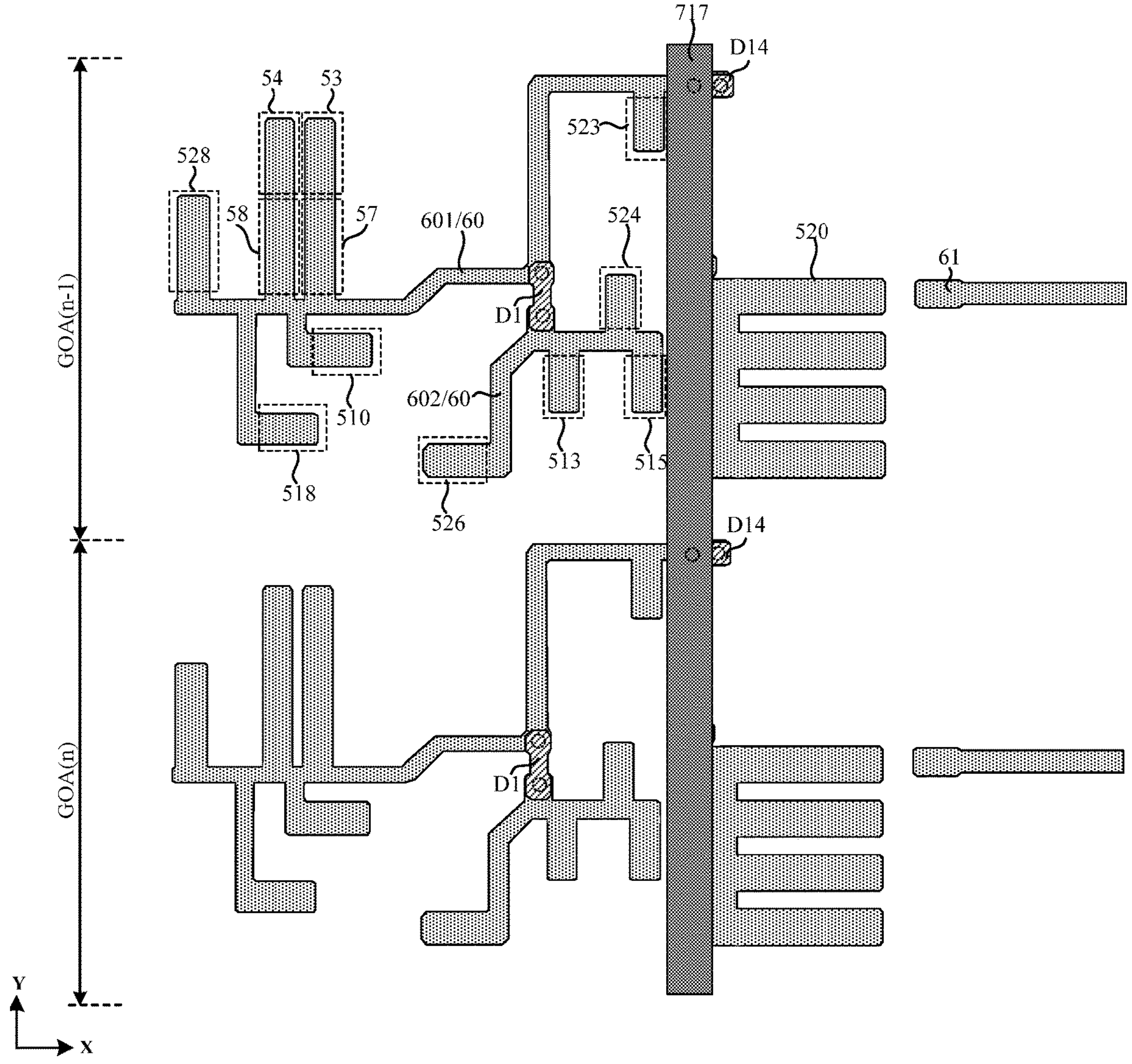
FIG. 19 is a schematic diagram of a connection of bottom gate connection parts of adjacent shift register circuits according to at least one embodiment of the present disclosure.

FIG. 19 is a schematic diagram of a connection of bottom gate connection parts of adjacent shift register circuits according to at least one embodiment of the present disclosure. In some examples, as shown in FIG. 19, the first bottom gate connection part 601 of the shift register circuit GOA(n−1) may be connected with the second bottom gate connection part 602 through the first conductive connection part D1 located in the fourth conductive layer, and may also be connected with the seventh transmission line 717 located in the fifth conductive layer through the fourteenth conductive connection part D14. The seventh transmission line 717 may be connected with the first bottom gate connection part of the shift register circuit GOA(n). The bottom gate connection parts of the adjacent shift register circuits may be connected through the seventh transmission line 717 located in the fifth conductive layer. In this example, adjacent shift register circuits may be connected with a same signal line (i.e., the seventh transmission line 717) to access a same signal. Remaining structures of the present example may be referred to the description of the above embodiments and will not be repeated here.

Figure 20:
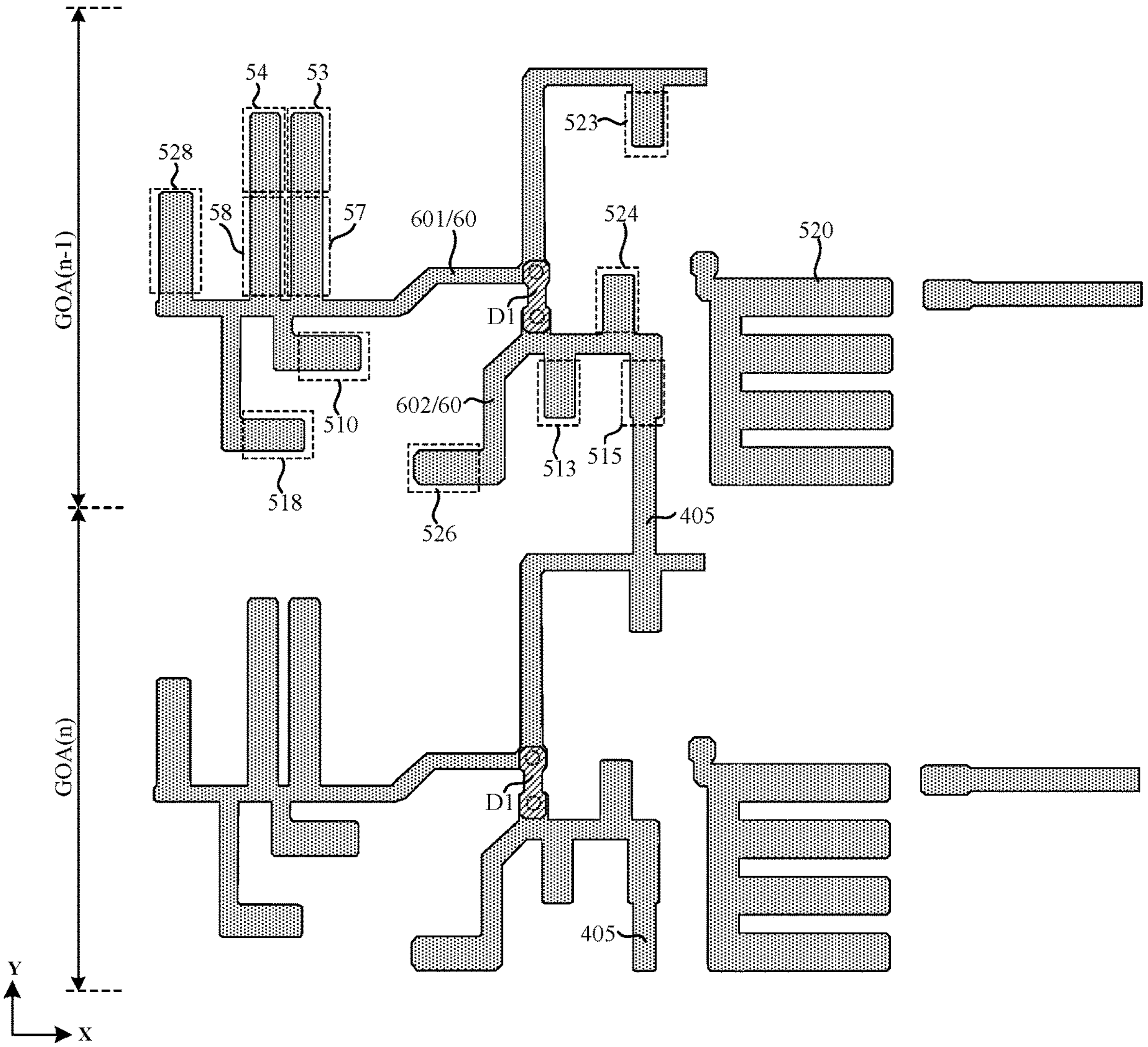
FIG. 20 is a schematic diagram of another connection of bottom gate connection parts of adjacent shift register circuits according to at least one embodiment of the present disclosure.

FIG. 20 is a schematic diagram of another connection of bottom gate connection parts of adjacent shift register circuits according to at least one embodiment of the present disclosure. In some examples, as shown in FIG. 20, a first bottom gate connection part 601 of each stage shift register circuit may be connected with a second bottom gate connection part 602 through a first conductive connection part D1 located in the fourth conductive layer. The bottom gate 515 of the fifteenth transistor T15 of the shift register circuit GOA(n−1) may be connected with the first bottom gate connection part 601 of the shift register circuit GOA(n) through a fifth connection electrode 405. The bottom gate 515 of the fifteenth transistor T15, the bottom gate of the thirteenth transistor T13, the bottom gate 524 of the twenty-fourth transistor T24, the bottom gate 526 of the twenty-sixth transistor T26, the second bottom gate connection part 602, the fifth connection electrode 405, and the first bottom gate connection part 601 of the shift register circuit GOA(n) may be connected with each other into an integral structure. An arrangement mode of bottom gates and bottom gate connection parts of the adjacent shift register circuits in the present example may simplify a process flow without additional punching. Remaining structures of the present example may be referred to the description of the above embodiments and will not be repeated here.

Figure 21:
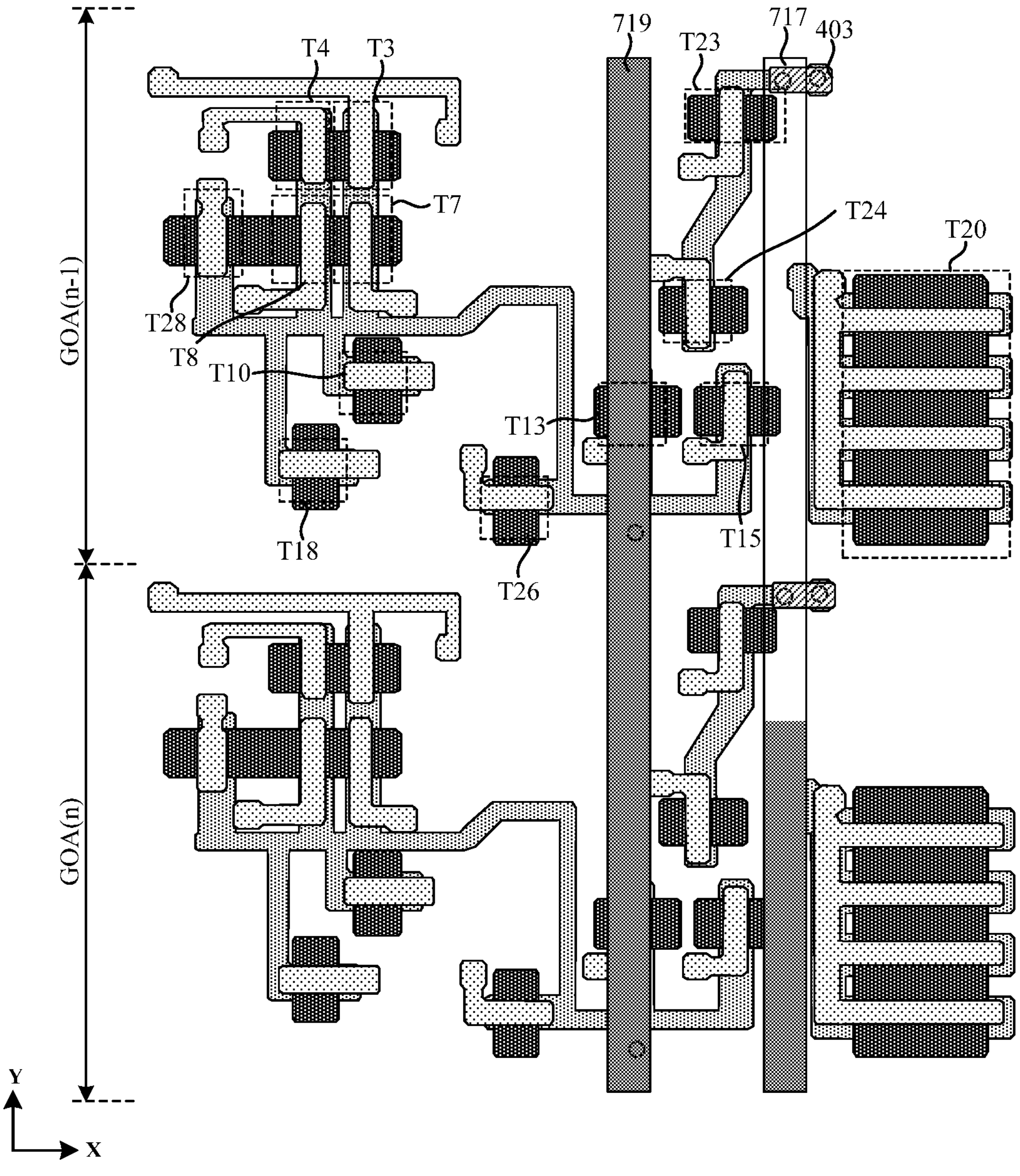
FIG. 21 is a schematic diagram of another connection of a bottom gate connection part of a shift register circuit according to at least one embodiment of the present disclosure.
Figure 22A:
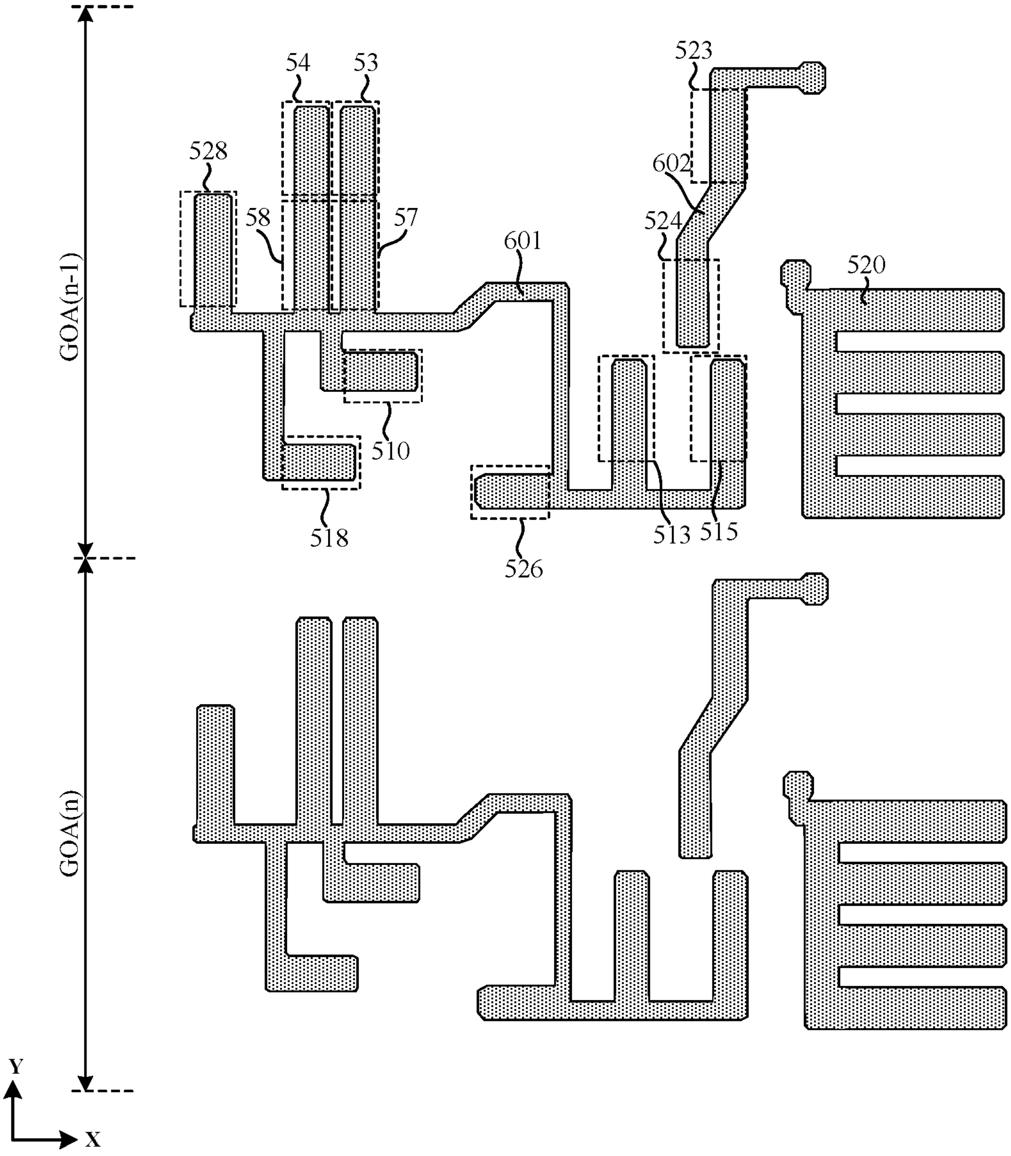
FIG. 22A is a schematic diagram of a structure of a bottom gate of FIG. 21.
Figure 22B:
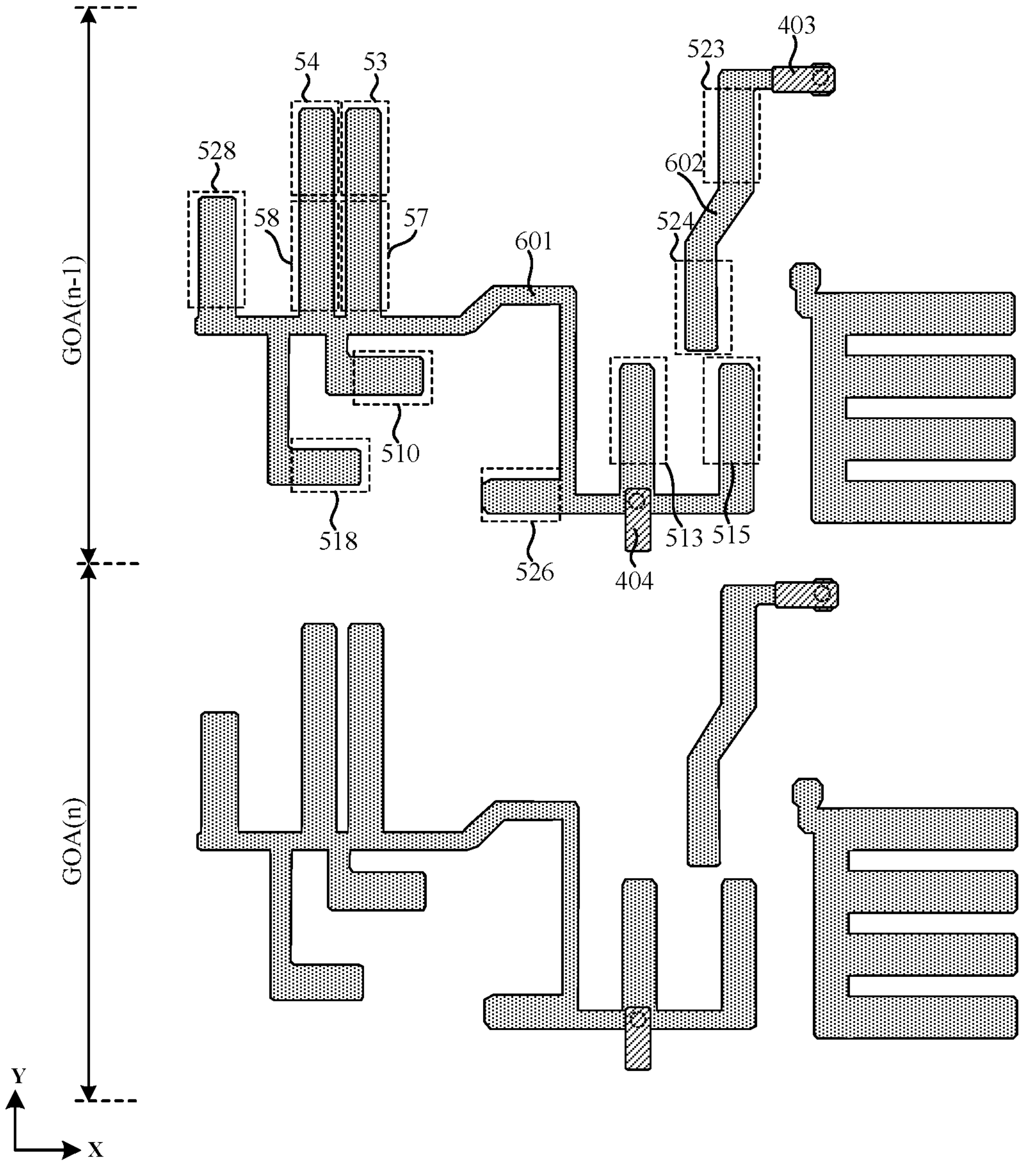
FIGS. 22B and 22C are schematic diagrams of a connection relationship of bottom gate connection parts in FIG. 21.
Figure 22C:
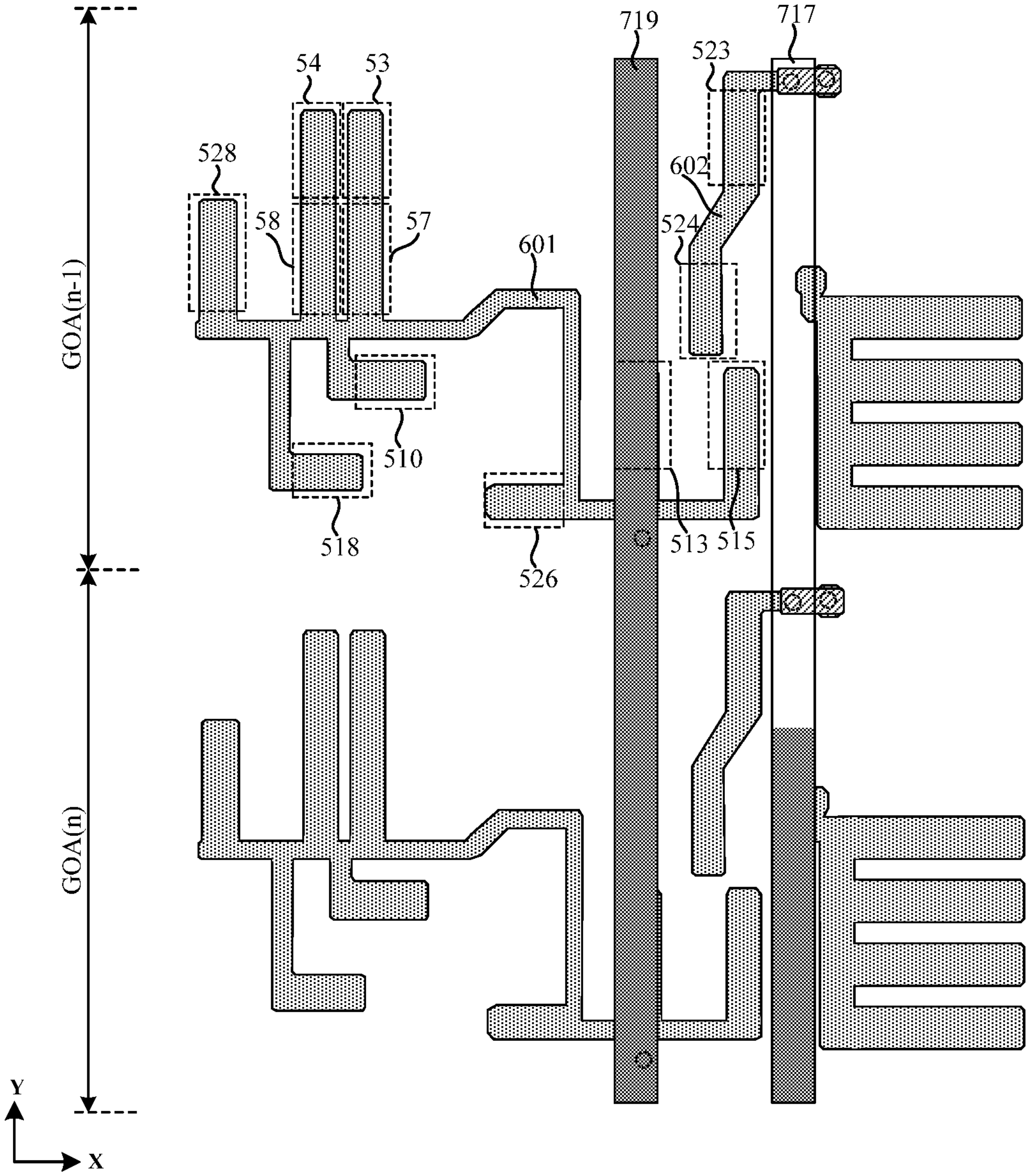

FIG. 21 is a schematic diagram of another connection of a bottom gate connection part of a shift register circuit according to at least one embodiment of the present disclosure. A portion of a structure of two adjacent shift register circuits is shown in FIG. 21. FIG. 22A is a schematic diagram of a structure of a bottom gate shown in FIG. 21. FIGS. 22B and 22C are schematic diagrams of a connection relationship of bottom gate connection parts in FIG. 21.

In some examples, as shown in FIGS. 21 to 22C, the second conductive layer of the display substrate may include at least a bottom gate 53 of a third transistor T3, a bottom gate 54 of a fourth transistor T4, a bottom gate 57 of a seventh transistor T7, a bottom gate 58 of an eighth transistor T8, a bottom gate 510 of a tenth transistor T10, a bottom gate 513 of a thirteenth transistor T13, a bottom gate 515 of a fifteenth transistor T15, a bottom gate 518 of an eighteenth transistor T18, a bottom gate 520 of a twentieth transistor T20, a bottom gate 523 of a twenty-third transistor T23, a bottom gate 524 of a twenty-fourth transistor T24, a bottom gate 525 of a twenty-fifth transistor T25, a bottom gate 526 of a twenty-sixth transistor T26, and a bottom gate 528 of a twenty-eighth transistor T28 of a shift register circuit.

In some examples, the bottom gate 53 of the third transistor T3, the bottom gate 54 of the fourth transistor T4, the bottom gate 57 of the seventh transistor T7, the bottom gate 58 of the eighth transistor T8, the bottom gate 510 of the tenth transistor T10, the bottom gate 513 of the thirteenth transistor T13, the bottom gate 515 of the fifteenth transistor T15, the bottom gate 518 of the eighteenth transistor T18, the bottom gate 525 of the twenty-fifth transistor T25, the bottom gate 526 of the twenty-sixth transistor T26, and the bottom gate 528 of the twenty-eighth transistor T28 may be connected through the first bottom gate connection part 601.

In some examples, the first bottom gate connection part 601 may include a first line segment extending in the first direction X, a second line segment extending in the third direction, a third line segment extending in the first direction X, a fourth line segment extending in the second direction Y, and a fifth line segment extending in the first direction X, and a first extension segment and a second extension segment extending in the second direction Y. The first line segment, the second line segment, the third line segment, the fourth line segment, and the fifth line segment may be connected sequentially, and the fourth line segment and the fifth line segment may be located on a side of the third line segment in the opposite direction of the second direction Y. The first line segment may be connected with the first extension segment and the second extension segment extending in the second direction Y, the second extension segment may be located on one side of the first extension segment.

In some examples, the bottom gate 528 of the twenty-eighth transistor T28, the bottom gate 58 of the eighth transistor T8, and the bottom gate 57 of the seventh transistor T7 may be located on a side of the first line segment in the second direction Y and directly connected with the first line segment; the bottom gate 54 of the fourth transistor T4 may be connected with the first line segment through the bottom gate 58 of the eighth transistor T8, and the bottom gate 53 of the third transistor T3 may be connected with the first line segment through the bottom gate 57 of the seventh transistor T7. The bottom gate 518 of the eighteenth transistor T18 and the bottom gate 510 of the tenth transistor T10 may be located on a side of the first line segment in the opposite direction of the second direction Y, and the bottom gate 518 of the eighteenth transistor T18 may be connected with the first line segment through the first extension segment, and the bottom gate 510 of the tenth transistor T10 may be connected with the first line segment through the second extension segment. The bottom gate 526 of the twenty-sixth transistor T26 may be located on a side of the fourth line segment in the opposite direction of the first direction X and directly connected with the fourth line segment. The bottom gate 513 of the thirteenth transistor T13 and the bottom gate 515 of the fifteenth transistor T15 may be located on a side of the fifth line segment in the second direction Y and directly connected with the fifth line segment.

In some examples, the bottom gate 53 of the third transistor T3, the bottom gate 54 of the fourth transistor T4, the bottom gate 528 of the twenty-eighth transistor T28, the bottom gate 58 of the eighth transistor T8, the bottom gate 57 of the seventh transistor T7, the bottom gate 518 of the eighteenth transistor T18, the bottom gate 510 of the tenth transistor T10, the bottom gate 526 of the twenty-sixth transistor T26, the bottom gate 513 of the thirteenth transistor T13, the bottom gate 515 of the fifteenth transistor T15, and the first bottom gate connection part 601 may be connected with each other into an integral structure.

In some examples, the bottom gate 523 of the twenty-third transistor T23 and the bottom gate 524 of the twenty-fourth transistor T24 may be connected through the second bottom gate connection part 602. A shape of the second bottom gate connection part 602 may be substantially a shape of a strip extending in the third direction. For example, the bottom gate 523 of the twenty-third transistor T23, the bottom gate 524 of the twenty-fourth transistor T24, and the second bottom gate connection part 602 may be connected with each other into an integral structure.

In some examples, as shown in FIG. 22B, the fourth conductive layer of the display substrate may include at least a third connection electrode 403 and a fourth connection electrode 404. A shape of the third connection electrode 403 may be substantially a shape of a strip extending in the first direction X. The third connection electrode 403 may be connected with an extension portion of the bottom gate 523 of the twenty-third transistor T23. The fourth connection electrode 404 may be located on a side of the bottom gate 513 of the thirteenth transistor T13 in the opposite direction of the second direction, and aligned with the bottom gate 513 in the second direction Y. A shape of the fourth connection electrode 404 may be substantially a shape of a strip extending in the second direction Y. The fourth connection electrode 404 may be connected with the first bottom gate connection part 601.

In some examples, as shown in FIG. 22C, the fifth conductive layer of the display substrate may include at least a seventh transmission line 717 and a ninth transmission line 719. The seventh transmission line 717 may be located on a side of the ninth transmission line 719 in the first direction X. For example, the ninth transmission line 719 may be located between the aforementioned sixth transmission line and the seventh transmission line 717, or the ninth transmission line 719 and the aforementioned sixth transmission line may be of an integral structure. The seventh transmission line 717 may be connected with the third connection electrode 403 to provide a voltage signal to the bottom gate 523 of the twenty-third transistor T23, the bottom gate 524 of the twenty-fourth transistor T24, and the second bottom gate connection part 602. The ninth transmission line 719 may be connected with the fourth connection electrode 404 to provide a voltage signal to the first bottom gate connection part 601 and a bottom gate connected thereto.

In some examples, the seventh transmission line 717 and the ninth transmission line 719 may be configured to transmit a same voltage signal, such as a second voltage signal. However, the present embodiment is not limited thereto. In other examples, the seventh transmission line 717 and the ninth transmission line 719 may transmit different voltage signals.

In this example, N-type transistors other than the second transistor T20 as an output transistor are divided into two groups, and bottom gates of the two groups of N-type transistors are independently disposed, and a risk of Electro-Static Discharge (ESD) that may occur when N-type transistors of a plurality of shift register circuits are full-face connected may be reduced.

Figure 23:
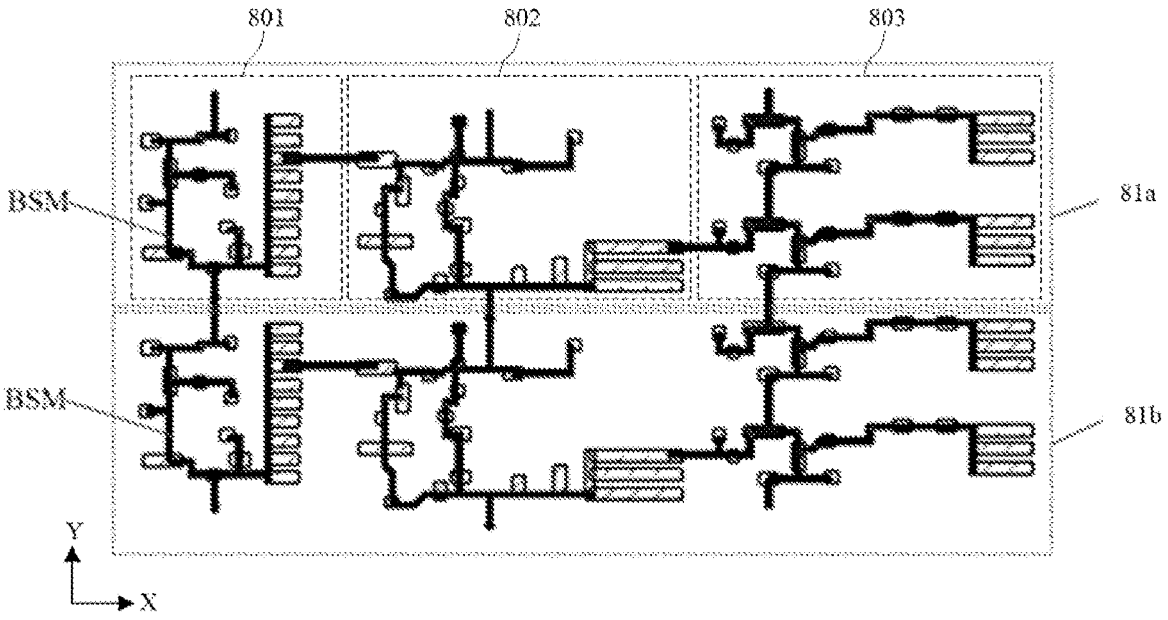
FIG. 23 is a schematic diagram of a light shielding layer according to at least one embodiment of the present disclosure.

FIG. 23 is a schematic diagram of a light shielding layer according to at least one embodiment of the present disclosure. In some examples, the display substrate may further include a light shielding layer BSM located on a side of the first semiconductor layer close to the base substrate. An orthographic projection of the light shielding layer BSM on the base substrate may be at least partially overlapped with an orthographic projection of the first semiconductor layer on the base substrate. The orthographic projection of the light shielding layer BSM may be at least partially overlapped with an orthographic projection of an active layer of a low temperature poly silicon transistor of the shift register circuit on the base substrate, for example, the light shielding layer BSM may cover orthographic projections of active layers of a plurality of low temperature poly silicon transistors of the shift register circuit on the base substrate.

In some examples, the display substrate may include a plurality of gate drive circuits, including, for example, a gate drive circuit for providing a light emitting control signal, a gate drive circuit for providing a control signal to an N-type transistor of a pixel circuit, and a gate drive circuit for providing a control signal to a P-type transistor of the pixel circuit. Each gate drive circuit may include a plurality of shift register circuits cascaded.

In some examples, the plurality of gate drive circuits may be divided into a plurality of circuit regions, which may be sequentially arranged in the second direction Y. Two circuit regions 81*a* and 81*b* are illustrated in FIG. 23. Each circuit region (e.g., a circuit region 81*a*) may include a first region 801, a second region 802, and a third region 803 arranged sequentially in the first direction X. A shift register circuit disposed in the first region 801 may be one shift register circuit included in the gate drive circuit for providing the light emitting control signal. A shift register circuit disposed in the second region 802 may be one shift register circuit included in the gate drive circuit for providing the control signal to the N-type transistor of the pixel circuit. A shift register circuit disposed in the third region 803 may be the gate drive circuit for providing the control signal to the P-type transistor of the pixel circuit. The shift register circuits provided by the foregoing embodiments may be disposed within the second region 802.

In some examples, as shown in FIG. 23, light shielding layers BSM corresponding to the first region 801, the second region 802, and the third region 803 may be connected with each other into an integral structure, and light shielding layers BSM in adjacent circuit regions may be connected with each other into an integral structure, thereby forming a mesh-like integral structure of light shielding layers BSM in the entire display substrate.

Figure 24:
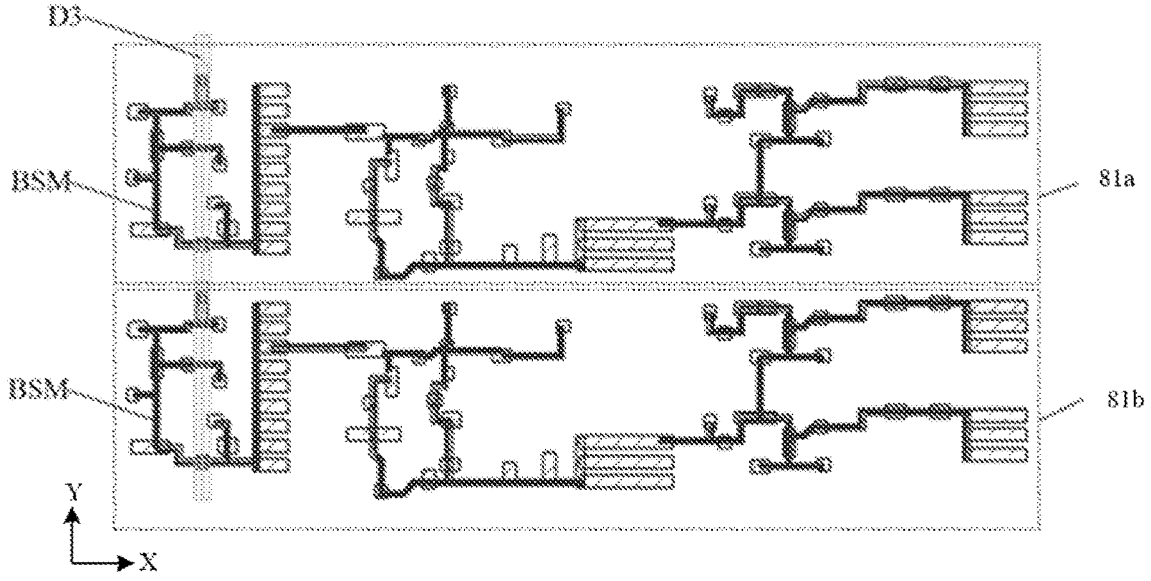
FIG. 24 is another schematic diagram of a light shielding layer according to at least one embodiment of the present disclosure.

FIG. 24 is another schematic diagram of a light shielding layer according to at least one embodiment of the present disclosure. In some examples, as shown in FIG. 24, light shielding layers within adjacent circuit regions 81*a* and 81*b* may be connected through the third conductive connection part D3. The third conductive connection part D3 may be a trace extending substantially in the second direction Y. The third conductive connection part D3 may be connected with a light shielding layer BSM in a first region of a circuit region to achieve signal transmission of the light shielding layer BSM in the second direction Y. Light shielding layers in a first region, a second region, and a third region of each circuit region may be connected with each other to be an integral structure. For example, the third conductive connection part D3 may be located in the fifth conductive layer. An arrangement mode of light shielding layers of this example may reduce a risk of ESD that may occur when light shielding layers BSM of a plurality of shift register circuits are full-face connected. Relevant description of the display substrate of the present embodiment may be referred to the description of the above embodiments and will not be repeated here.

The present embodiment provides a display substrate, including a base substrate and a gate drive circuit disposed on the base substrate. The gate drive circuit includes multiple stages of shift register circuits, a shift register circuit includes an oxide output transistor (e.g., a twentieth transistor T20 in FIG. 1) and a plurality of oxide switching transistors (e.g., including a third transistor T3, a fourth transistor T4, a seventh transistor T7, an eighth transistor T8, a tenth transistor T10, a thirteenth transistor T13, a fifteenth transistor T15, an eighteenth transistor T18, a twenty-third transistor T23, a twenty-fourth transistor T24, a twenty-sixth transistor T26, and a twenty-eighth transistor T28 in FIG. 1). Among them, an oxide output transistor includes a first bottom gate layer (e.g., a bottom gate 520 of the twentieth transistor T20), a first top gate layer (e.g., a top gate 220 of the twentieth transistor T20), and an active layer (e.g., an active layer 320 of the twentieth transistor T20) at least partially located between the first bottom gate layer and the first top gate layer. An oxide switching transistor includes a second bottom gate layer, a second top gate layer, and an active layer at least partially located between the second bottom gate layer and the second top gate layer. The first bottom gate layer and the second bottom gate layer are independent of each other; the first bottom gate layer is coupled to the first top gate layer; second bottom gate layers of at least some of the plurality of oxide switching transistors are coupled with each other.

In some examples, the first bottom gate layer and the second bottom gate layer are independent of each other, and the first bottom gate layer and the second bottom gate layer may access same or different signals. The first bottom gate layer is coupled with the first top gate layer, and the first bottom gate layer and the first top gate layer access a same signal. Second bottom gate layers of at least some of the plurality of oxide switching transistors are coupled with each other, and the second bottom gate layers coupled together access a same signal.

In some examples, the first bottom gate layer in the oxide output transistor and second bottom gate layers in the oxide switching transistors are disposed in a same layer and made of a same material as a second gate metal layer (i.e., the aforementioned second conductive layer). The first top gate layer in the oxide output transistor and second top gate layers in the oxide switching transistors are disposed in a same layer and made of a same material as a third gate metal layer (i.e., the aforementioned third conductive layer). The active layer in the oxide output transistor and active layers in the oxide switching transistors are disposed in a same layer and made of a same material as an oxide active layer (i.e., the aforementioned second semiconductor layer).

In the display substrate provided by the present embodiment, a shift register circuit is configured to include an oxide output transistor and a plurality of oxide switching transistors. The oxide transistor has a property of low power consumption, and the shift register circuit may achieve local refresh, that is, a part of a region on a screen (for example, an animation region) displays high-frequency refresh, and another part of the region (for example, a text region) displays low-frequency refresh, so that power consumption of the display substrate is effectively reduced.

In the display substrate provided by the present embodiment, the first bottom gate layer of the oxide output transistor is coupled with the first top gate layer, so that a same control signal (for example, a signal conducted by another transistor) may be written into the first bottom gate layer and the first top gate layer of the oxide output transistor, and turned on or off of the oxide output transistor is simultaneously controlled; moreover, the first bottom gate layer of the oxide output transistor and a second bottom gate layer of an oxide switching transistor are disposed to be independent of each other, so that the oxide switching transistor and the oxide output transistor may be independently controlled separately, and it may be ensured that the oxide switching transistor and the oxide output transistor do not to interfere with each other, thereby improving stability of a drive signal output by the shift register circuit in the display substrate.

In the display substrate provided by the present embodiment, second bottom gate layers of at least some oxide switching transistors are disposed to be coupled and access a same signal, so that characteristics of the at least some oxide switching transistors may be adjusted at the same time, and better transistor performance may be achieved. Moreover, only one signal line may be disposed in the above disposing mode, that is, signals may be provided to all the second bottom gate layers included in the at least some oxide switching transistors, which is beneficial to reducing complexity of the shift register circuit, and further reducing a layout difficulty of the display substrate. Moreover, second top gate layers of the plurality of oxide switching transistors are disposed independently of each other, and turned on or off of the oxide switching transistors may be controlled through the second top gate layers of the oxide switching transistors, and normal working performance of the shift register circuit may be guaranteed.

In some exemplary implementation modes, all of the second bottom gate layers included in the plurality of oxide switching transistors may be coupled. The disposing mode of the present example may adjust characteristics of all oxide switching transistors at the same time, to achieve better transistor performance. Moreover, only one signal line may be disposed in the disposing mode of the present example, that is, signals may be provided to all the second bottom gate layers included in all the oxide switching transistors, which is beneficial to reducing the complexity of the shift register circuit, and further reducing the layout difficulty of the display substrate. Moreover, the second top gate layers of the plurality of oxide switching transistors are disposed independently of each other, and turned on or off of the oxide switching transistors may be controlled through the second top gate layers of the oxide switching transistors, and normal working performance of the shift register circuit may be guaranteed.

In some exemplary implementation modes, the plurality of oxide switching transistors may be divided into at least two transistor groups. Each transistor group may include at least one oxide switching transistor. Second bottom gate layers of a plurality of oxide switching transistors belonging to a same transistor group may be coupled with each other. Second bottom gate layers of oxide switching transistors belonging to different transistor groups may be independent of each other.

In some examples, the shift register circuit may include a plurality of functional modules, and oxide switching transistors belonging to a same functional module may be divided into a same transistor group. The functional module may include a NOT gate series structure, a parallel structure, or a series-parallel structure. The present embodiment is not limited thereto.

In some examples, second bottom gate layers in a same transistor group access a same signal, and second bottom gate layers in different transistor groups access different signals. For example, as shown in FIG. 1, output terminals of the first NOT gate circuit and the second NOT gate circuit are connected, and the second transistor T2, the third transistor T3, the sixth transistor T6, and the seventh transistor T7 may be divided into a transistor group. The third NOT gate circuit and the first NOT gate circuit form a series structure of NOT gates, and the third NOT gate circuit and the second NOT gate circuit form a series structure of NOT gates. The second transistor T2, the third transistor T3, the sixth transistor T6, the seventh transistor T7, the ninth transistor T9, and the tenth transistor T10 may be divided into a transistor group. The fifth NOT gate circuit and the sixth NOT gate circuit form a series structure of NOT gates, and the twelfth transistors T12 and the thirteenth transistors T13, and the fourteenth transistors T14 and the fifteenth transistors T15 may be divided into a transistor group. The twenty-seventh transistor T27 and the twenty-eighth transistor T28 of the fourth NOT gate circuit may be divided into a transistor group. The seventeenth transistor T17 and the eighteenth transistor T18 may form a gate circuit, and may be divided into a transistor group. The twenty-fifth transistor T25 and the twenty-sixth transistor T26 may form a transmission gate structure, and may be divided into a transistor group. The twenty-first transistor T21, the twenty-second transistor T22, the twenty-third transistor T23, and the twenty-fourth transistor T24 constitute a NAND gate circuit, and may be divided into a transistor group. The first transistor T1, the fourth transistor T4, the fifth transistor T5, the eighth transistor T8, the eleventh transistor T11, and the sixteenth transistor T16 are all independent transistors that play a role of switches. In this example, by coupling second bottom gate layers of oxide switching transistors belonging to a same functional module and accessing a same signal, characteristic adjustment may be achieved at the same time, and better transistor performance may be achieved; moreover, the above disposing mode may make characteristics of oxide switching transistors belonging to different functional modules independently adjustable.

In some examples, second bottom gate layers included in at least some oxide switching transistors may extend in a first direction or a second direction, the first direction intersects with the second direction, e.g., the first direction is perpendicular to the second direction. The display substrate may further include at least one bottom gate connection part coupled with a second bottom gate layer included in a corresponding oxide switching transistor. For example, the display substrate may include a first bottom gate connection part 601 and a second bottom gate connection part 602. A disposing method of the present example may ensure that the bottom gate connection part is coupled with all second bottom gate layers included in corresponding plurality of oxide switching transistors, which is also beneficial to reducing a layout difficulty of the shift register circuit.

In some exemplary implementation modes, at least some oxide switching transistors may be divided into a first transistor group and a second transistor group. The display substrate includes a first bottom gate connection part 601 and a second bottom gate connection part 602. The first bottom gate connection part 601 may be coupled with second bottom gate layers included in a plurality of oxide switching transistors in the first transistor group (e.g., the bottom gate 53 of the third transistor T3, the bottom gate 54 of the fourth transistor T4, the bottom gate 57 of the seventh transistor T7, the bottom gate 58 of the eighth transistor T8, the bottom gate 510 of the tenth transistor T10, the bottom gate 518 of the eighteenth transistor T18, the bottom gate 523 of the twenty-third transistor T23, and the bottom gate 528 of the twenty-eighth transistor T28 shown in FIG. 14). The second bottom gate connection part 602 may be coupled with second bottom gate layers included in a plurality of oxide switching transistors in the second transistor group (e.g., the bottom gate 513 of the thirteenth transistor T13, the bottom gate 515 of the fifteenth transistor T15, the bottom gate 524 of the twenty-fourth transistor T24, and the bottom gate 526 of the twenty-sixth transistor T26 shown in FIG. 14). The first bottom gate connection part 601 and the second bottom gate connection part 602 may be coupled through the first conductive connection part D1 (as shown in FIG. 14).

In some examples, the first bottom gate connection part 601 and the second bottom gate layers coupled thereto may be connected with each other into an integral structure, and the second bottom gate connection part 602 and the second bottom gate layers coupled thereto may be connected with each other into an integral structure. The first bottom gate connection part 601 and the second bottom gate connection part 602 may be disposed in a same layer and made of a same material, and the first bottom gate connection part 601 and the first conductive connection part D1 may be disposed in different layers. For example, the first bottom gate connection part 601 may be located in the second gate metal layer (i.e., the second conductive layer described above), and the first conductive connection part D1 may be located in the first source-drain metal layer (i.e., the fourth conductive layer described above). In some examples, orthographic projections of second bottom gate layers on the base substrate may be not overlapped with an orthographic projection of the first gate metal layer (i.e., the first conductive layer described above) on the base substrate, and an orthographic projection of the first conductive connection part D1 on the base substrate may be overlapped with the orthographic projection of the first gate metal layer on the base substrate.

In some exemplary implementation modes, at least some oxide switching transistors may be divided into a first transistor group and a second transistor group. The display substrate may include a first bottom gate connection part 601 and a second bottom gate connection part 602. The first bottom gate connection part 601 is coupled with second bottom gate layers included in oxide switching transistors in the first transistor group (e.g., the bottom gate 53 of the third transistor T3, the bottom gate 54 of the fourth transistor T4, the bottom gate 57 of the seventh transistor T7, the bottom gate 58 of the eighth transistor T8, the bottom gate 510 of the tenth transistor T10, the bottom gate 513 of the thirteenth transistor T13, the bottom gate 515 of the fifteenth transistor T15, the bottom gate 518 of the eighteenth transistor T18, the bottom gate 526 of the twenty-sixth transistor T26, and the bottom gate 528 of the twenty-eighth transistor T28 shown in FIG. 22A). The second bottom gate connection part 602 is coupled with second bottom gate layers included in oxide switching transistors in the second transistor group (e.g., the bottom gate 523 of the twenty-third transistor T23 and bottom gate 524 of the twenty-fourth transistor T24 shown in FIG. 22A). The first bottom gate connection part 601 and the second bottom gate connection part 602 may be independent of each other.

In some examples, the display substrate may further include a first signal line (i.e., the ninth transmission line 719 shown in FIGS. 21 and 22C) and a second signal line (i.e., the seventh transmission line 717 shown in FIGS. 21 and 22C) in a case that the first bottom gate connection part 601 and the second bottom gate connection part 602 are independent of each other. The first signal line is coupled with the first bottom gate connection part 601 and configured to provide a first signal to the first bottom gate connection part 601; the second signal line is coupled with the second bottom gate connection part 602 and configured to provide a second signal to the second bottom gate connection part 602. The method of the present example may achieve independent adjustment of characteristics of oxide switching transistors in different transistor groups.

In some exemplary implementation modes, in adjacent two stages of shift register circuits, a second bottom gate layer of an oxide switching transistor in a previous stage shift register circuit and a second bottom gate layer of an oxide switching transistor in a subsequent stage shift register circuit may be independent of each other. A disposing mode of the present example may achieve independent control of second bottom gate layers in the adjacent two stages of shift register circuits.

In some exemplary embodiments, in adjacent two stages of shift register circuits, second bottom gate layers of at least some oxide switching transistors in a previous stage shift register circuit may be coupled with second bottom gate layers of at least some oxide switching transistors in a subsequent stage shift register circuit. In a disposing mode of the present example, a voltage signal of a second bottom gate layer may be accessed in a lower bezel region of the display substrate. For example, as shown in FIG. 20, the second bottom gate layers of at least some oxide switching transistors in the previous stage shift register circuit and the second bottom gate layers of at least some oxide switching transistors in the subsequent stage shift register circuit may be formed into an integral structure. For example, as shown in FIG. 20, the second bottom gate layers of at least some oxide switching transistors in the previous stage shift register circuit and the second bottom gate layers of at least some oxide switching transistors in the subsequent stage shift register circuit are all disposed in a same layer and made of a same material as the second gate metal layer in the display substrate. A disposing mode of the present example does not require additional punching, which may simplify a manufacturing process flow.

In some exemplary implementation modes, the second bottom gate layers of at least some oxide switching transistors in the previous stage shift register circuit and the second bottom gate layers of the at least some oxide switching transistors in the subsequent stage shift register circuit may be coupled through a second conductive connection part (i.e., the seventh transmission line 717 shown in FIG. 19), and the second conductive connection part is disposed in a different layer from the second bottom gate layers. In some examples, in the previous stage shift register circuit, an orthographic projection of the second conductive connection part on the base substrate and an orthographic projection of a first transition pattern (i.e., the fourteenth conductive connection part D14 shown in FIG. 19) on the base substrate have an overlapping region in which the second conductive connection part is coupled with the first transition pattern through a via; the orthographic projection of the first transition pattern on the base substrate and an orthographic projection of a bottom gate connection part in the previous stage shift register circuit on the base substrate have an overlapping region in which the first transition pattern is coupled with the bottom gate connection part in the previous stage shift register circuit through a via. In some examples, the second conductive connection part may be located in the second source-drain metal layer (i.e., the aforementioned fifth conductive layer). In this example, by disposing the second bottom gate layers of at least some oxide switching transistors in the previous stage shift register circuit to be coupled with the second bottom gate layers of at least some oxide switching transistors in the subsequent stage shift register circuit through the second conductive connection part, a risk of Electro-Static Discharge (ESD) that may occur when second bottom gate layers in a plurality of shift register circuits are full-face connected may be reduced.

In some exemplary implementation modes, the shift register circuit may further include a light shielding layer BSM (as shown in FIGS. 23 and 24), and a plurality of low temperature poly silicon transistors (including, for example, the first transistor T1, the second transistor T2, the fifth transistor T5, the sixth transistor T6, the ninth transistor T9, the eleventh transistor T11, the twelfth transistor T12, the fourteenth transistor T14, the sixteenth transistor T16, the seventeenth transistor T17, the nineteenth transistor T19, the twenty-first transistor T21, the twenty-second transistor T22, the twenty-fifth transistor T25, and the twenty-seventh transistor T27 shown in FIG. 1). An orthographic projection of the light shielding layer BSM on the base substrate may be at least partially overlapped with an orthographic projection of an active layer of a low temperature poly silicon transistor on the base substrate. Light shielding layers BSM of at least some shift register circuits (e.g., shift register circuits disposed in the circuit regions 81*a* and 81*b* in FIG. 23) are coupled with each other.

In some examples, light shielding layers BSM of at least some shift register circuits may be coupled through the third conductive connection part D3 (as shown in FIG. 24), and the third conductive connection part D3 may be disposed in a different layer from the light shielding layers BSM. For example, the third conductive connection part D3 may be located in the fifth conductive layer. In some examples, the shift register circuit may further include a second transition pattern, wherein in the previous stage shift register circuit, an orthographic projection of the third conductive connection part D3 on the base substrate and an orthographic projection of the second transition pattern on the base substrate have an overlapping region in which the third conductive connection part D3 is coupled with the second transition pattern through a via; the orthographic projection of the second transition pattern on the base substrate and an orthographic projection of a light shielding layer BSM in the previous stage shift register circuit on the base substrate have an overlapping region, in which the second transition pattern is coupled with the light shielding layer BSM in the previous stage shift register circuit through a via. In the present example, by disposing the light shielding layers BSM of at least some shift register circuits to be coupled through the third conductive connection part, and disposing the third conductive connection part D3 to be disposed in a different layer from the light shielding layers BSM, a risk of ESD that may occur when light shielding layers BSM in a plurality of shift register circuits are full-face connected may be reduced.

Relevant description of the display substrate of the present embodiment may be referred to description of the aforementioned embodiments, and thus will not be repeated here.

An embodiment also provides a drive method of a display substrate, which is used for driving the display substrate as described above. The drive method includes: providing a same signal to a first bottom gate layer and a first top gate layer, and controlling an oxide output transistor to be turned on or off; providing signals to a second bottom gate layer and a second top gate layer of an oxide switching transistor independently, wherein second bottom gate layers of at least some oxide switching transistors among a plurality of oxide switching transistors are coupled to access a same signal.

The drive method provided by the present embodiment is adopted to drive the display substrate, so that a same control signal is written into the first bottom gate layer and the first top gate layer of the oxide output transistor, and turned on or off of the oxide output transistor is simultaneously controlled; moreover, the first bottom gate layer and the second bottom gate layer are disposed to be independent of each other, so that the oxide switching transistors and the oxide output transistor are independently controlled separately, thereby ensuring that the oxide switching transistors and the oxide output transistor do not interfere with each other, and improving stability of a drive signal output by a shift register circuit in the display substrate. Moreover, by using the drive method provided by the present embodiment to drive the display substrate, characteristics of at least some oxide switching transistors may be adjusted at the same time, to achieve better transistor performance. Other description of the present embodiment may be referred to description of the above embodiments and will not be repeated here.

Figure 25:
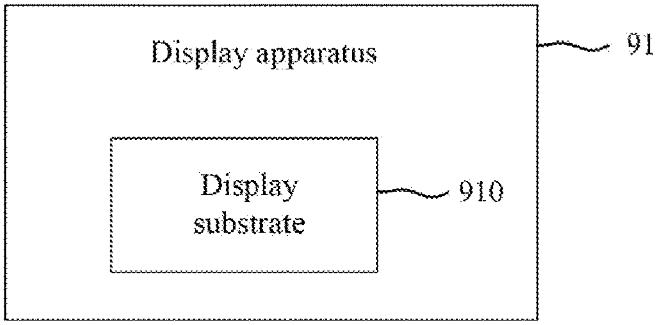
FIG. 25 is a schematic diagram of a display apparatus according to at least one embodiment of the present disclosure.

FIG. 25 is a schematic diagram of a display apparatus according to at least one embodiment of the present disclosure. In some examples, as shown in FIG. 25, the present embodiment provides a display apparatus 91, including a display substrate 910. The display substrate 910 may be an OLED display substrate, a QLED display substrate, a micro-LED display substrate, or a mini-LED display substrate. The display apparatus 91 may be any product or component with a display function, such as an OLED display apparatus, a watch, a mobile phone, a tablet computer, a television, a display, a laptop computer, a digital photo frame, and a navigator. However, the present embodiment is not limited thereto.

The drawings of the present disclosure only involve structures involved in the present disclosure, and other structures may be referred to conventional designs. The embodiments of the present disclosure, i.e., features in the embodiments, may be combined with each other to obtain new embodiments if there is no conflict. It should be noted that the above embodiments or implementation modes are exemplary only and not restrictive. Therefore, the present disclosure is not limited to what is specifically shown and described herein. Various modifications, substitutions, or omissions may be made in forms and details of implementation without departing from the scope of the present disclosure.

The invention claimed is:

1. A display substrate, comprising: a base substrate and a gate drive circuit disposed on the base substrate, wherein the gate drive circuit comprises multiple stages of shift register circuits, a shift register circuit comprises an oxide output transistor and a plurality of oxide switching transistors;

the oxide output transistor comprises a first bottom gate layer, a first top gate layer, and an active layer at least partially located between the first bottom gate layer and the first top gate layer;

an oxide switching transistor comprises a second bottom gate layer, a second top gate layer, and an active layer at least partially located between the second bottom gate layer and the second top gate layer;

the first bottom gate layer and the second bottom gate layer are independent of each other; the first bottom gate layer is coupled with the first top gate layer; second bottom gate layers of at least some oxide switching transistors among the plurality of oxide switching transistors are coupled with each other.

2. The display substrate according to claim 1, wherein all second bottom gate layers comprised in the plurality of oxide switching transistors are coupled with each other.

3. The display substrate according to claim 2, wherein in adjacent two stages of shift register circuits:

second bottom gate layers of at least some oxide switching transistors in a previous stage shift register circuit are coupled with second bottom gate layers of at least some oxide switching transistors in a subsequent stage shift register circuit; or, a second bottom gate layer of an oxide switching transistor in a previous stage shift register circuit is independent from a second bottom gate layer of an oxide switching transistor in a subsequent stage shift register circuit.

4. The display substrate according to claim 2, wherein a second bottom gate layer comprised in an oxide switching transistor in the at least some oxide switching transistors extends in a first direction or a second direction, the first direction intersecting with the second direction;

the display substrate further comprises at least one bottom gate connection part, and the bottom gate connection part is coupled with a second bottom gate layer comprised in a corresponding oxide switching transistor.

5. The display substrate according to claim 4, wherein the at least some oxide switching transistors are divided into a first transistor group and a second transistor group;

the display substrate comprises a first bottom gate connection part and a second bottom gate connection part, the first bottom gate connection part is coupled with a second bottom gate layer comprised in an oxide switching transistor in the first transistor group, and the second bottom gate connection part is coupled with a second bottom gate layer comprised in an oxide switching transistor in the second transistor group;

the first bottom gate connection part and the second bottom gate connection part are coupled through a first conductive connection part; or, the first bottom gate connection part and the second bottom gate connection part are independent of each other.

6. The display substrate according to claim 5, wherein the first bottom gate connection part and the second bottom gate layer coupled thereto are connected with each other into an integral structure, and the second bottom gate connection part and the second bottom gate layer coupled thereto are connected with each other into an integral structure;

the first bottom gate connection part and the second bottom gate connection part are disposed in a same layer and made of a same material, and the first bottom gate connection part and the first conductive connection part are disposed in different layers.

7. The display substrate according to claim 6, wherein the display substrate further comprises a second gate metal layer and a first source-drain metal layer; the first bottom gate connection part is located in the second gate metal layer, and the first conductive connection part is located in the first source-drain metal layer.

8. The display substrate according to claim 5, wherein under a condition that the first bottom gate connection part and the second bottom gate connection part are independent of each other, the display substrate further comprises a first signal line and a second signal line, the first signal line is coupled with the first bottom gate connection part, and the second signal line is coupled with the second bottom gate connection part.

9. The display substrate according to claim 1, wherein the plurality of oxide switching transistors are divided into at least two transistor groups, each transistor group comprises at least one oxide switching transistor; second bottom gate layers of a plurality of oxide switching transistors belonging to a same transistor group are coupled with each other; second bottom gate layers of oxide switching transistors belonging to different transistor groups are independent of each other.

10. The display substrate according to claim 9, wherein the shift register circuit comprises a plurality of functional modules, and oxide switching transistors belonging to a same functional module are divided into a same transistor group.

11. The display substrate according to claim 9, wherein a second bottom gate layer comprised in an oxide switching transistor in the at least some oxide switching transistors extends in a first direction or a second direction, the first direction intersecting with the second direction;

the display substrate further comprises at least one bottom gate connection part, and the bottom gate connection part is coupled with a second bottom gate layer comprised in a corresponding oxide switching transistor.

12. The display substrate according to claim 9, wherein in adjacent two stages of shift register circuits:

second bottom gate layers of at least some oxide switching transistors in a previous stage shift register circuit are coupled with second bottom gate layers of at least some oxide switching transistors in a subsequent stage shift register circuit; or, a second bottom gate layer of an oxide switching transistor in a previous stage shift register circuit is independent from a second bottom gate layer of an oxide switching transistor in a subsequent stage shift register circuit.

13. The display substrate according to claim 1, wherein in adjacent two stages of shift register circuits:

second bottom gate layers of at least some oxide switching transistors in a previous stage shift register circuit are coupled with second bottom gate layers of at least some oxide switching transistors in a subsequent stage shift register circuit; or, a second bottom gate layer of an oxide switching transistor in a previous stage shift register circuit is independent from a second bottom gate layer of an oxide switching transistor in a subsequent stage shift register circuit.

14. The display substrate according to claim 13, wherein the second bottom gate layers of at least some oxide switching transistors in the previous stage shift register circuit and the second bottom gate layers of at least some oxide switching transistors in the subsequent stage shift register circuit are connected with each other into an integral structure.

15. The display substrate according to claim 13, wherein the second bottom gate layers of at least some oxide switching transistors in the previous stage shift register circuit are coupled with the second bottom gate layers of at least some oxide switching transistors in the subsequent stage shift register circuit through a second conductive connection part, and the second conductive connection part is disposed in a different layer from the second bottom gate layers.

16. The display substrate according to claim 1, wherein the shift register circuit further comprises a light shielding layer and a plurality of low temperature poly silicon transistors, wherein an orthographic projection of the light shielding layer on the base substrate is at least partially overlapped with an orthographic projection of an active layer of a low temperature poly silicon transistor on the base substrate; light shielding layers of at least some of the shift register circuits are coupled with each other.

17. The display substrate according to claim 16, wherein the light shielding layers comprised in at least some of the shift register circuits are coupled through a third conductive connection part, and the third conductive connection part is disposed in a different layer from the light shielding layers.

18. The display substrate according to claim 1, further comprising a nineteenth conductive connection part, and the nineteenth conductive connection part is coupled with the first bottom gate layer and the first top gate layer, respectively.

19. A display apparatus, comprising a display substrate according to claim 1.

20. A drive method of a display substrate for driving a display substrate according to claim 1, wherein the drive method comprises: providing a same signal to a first bottom gate layer and a first top gate layer, controlling an oxide output transistor to be turned on or off; and providing signals to a second bottom gate layer and a second top gate layer of an oxide switching transistor independently, wherein second bottom gate layers of at least some oxide switching transistors among a plurality of oxide switching transistors are coupled to access a same signal.

* * * * *